(12) United States Patent
Shimizu et al.

(10) Patent No.: US 7,804,145 B2
(45) Date of Patent: Sep. 28, 2010

(54) SEMICONDUCTOR DEVICE, CAPACITOR, AND FIELD EFFECT TRANSISTOR

(75) Inventors: Tatsuo Shimizu, Tokyo (JP); Masato Koyama, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/388,810

(22) Filed: Feb. 19, 2009

(65) Prior Publication Data

US 2009/0242970 A1    Oct. 1, 2009

(30) Foreign Application Priority Data

Mar. 27, 2008    (JP) .............................. 2008-084190

(51) Int. Cl.
*H01L 29/76*    (2006.01)

(52) U.S. Cl. .......................... 257/410; 257/288; 257/368

(58) Field of Classification Search ................. 257/288, 257/368, 410

See application file for complete search history.

(56) References Cited

FOREIGN PATENT DOCUMENTS

JP    2006-100387    4/2006

OTHER PUBLICATIONS

U.S. Appl. No. 12/370,641, filed Feb. 13, 2009, Tatsuo Shimizu, et al.
U.S. Appl. No. 12/189,400, filed Aug. 11, 2008, Tatsuo Shimizu, et al.
Tomonori Nishimura, et al., "Control of Fermi-Level Pinning at Metal/Germanium Interface by Inserting Ultra-thin Oxides", Interface 2007, pp. 67-68.
U.S. Appl. No. 12/714,841, filed Mar. 1, 2010, Shimizu, et al.

*Primary Examiner*—Long Pham
(74) *Attorney, Agent, or Firm*—Oblon, Spivak, McClelland, Maier & Neustadt, L.L.P.

(57) ABSTRACT

It is made possible to provide a semiconductor device that has the effective work function of the connected metal optimized at the interface between a semiconductor and the metal. A semiconductor device includes: a semiconductor film; an oxide film formed on the semiconductor film, the oxide film including at least one of Hf and Zr, and at least one element selected from the group consisting of V, Cr, Mn, Nb, Mo, Tc, W, and Re being added to the oxide film; and a metal film formed on the oxide film.

12 Claims, 39 Drawing Sheets

Si/METAL

MAINLY CONTACT RESISTANCE
⇒
LOWER BARRIER
HIGHER CONCENTRATION (DOPING)

Si/THIN OXIDE FILM/METAL

PINNING POSITION SHIFTS, BUT BARRIER DOES NOT BECOME ZERO

RESISTANCE BECOMES HIGHER BY AMOUNT OF TUNNEL RESISTANCE OF THIN FILM

SEMICONDUCTOR DEVICE, CAPACITOR, AND FIELD EFFECT TRANSISTOR

CROSS-REFERENCE TO RELATED APPLICATION

This application is based upon and claims the benefit of priority from prior Japanese Patent Application No. 2008-84190 filed on Mar. 27, 2008 in Japan, the entire contents of which are incorporated herein by reference.

BACKGROUND

1. Technical Field

Described herein are a semiconductor device, a capacitor, and a field effect transistor.

2. Related Art

Most part of the power consumption in a MISFET (metal insulator semiconductor field effect transistor) is caused by the contact resistance between the metal and the source and drain. This is because a Schottky barrier is formed at the interface between the semiconductor and the metal, and the barrier forms electric resistance. In recent years, the proportion of the contact resistance in the power consumption of MISFETs is rapidly increasing, and there is a demand for a decrease in the contact resistance.

To counter this problem, a thin insulating film is inserted into the interface between a Si substrate and a metal provided on the Si substrate, so as to reduce the interaction between Si and the metal. In this manner, the Schottky barrier is lowered (see JP-A 2006-100387(KOKAI), for example). In such a case, the resistance due to the Schottky barrier is lowered, but carriers tunnel through the thin insulating film. Therefore, the tunnel barrier forms new resistance.

Although the pinning by MIGS (metal induced gap states) is eliminated by the thin insulating film formed at the interface, the new resistance due to the tunnel barrier is added, and there is a limit to realization of lower contact resistance. Since the work function varies among metals, the work function cannot be freely controlled.

Likewise, a thin insulating film is inserted into the interface between a Ge substrate and a metal formed on the Ge substrate, so as to reduce the interaction between Ge and the metal. In this manner, the Schottky barrier is lowered (see "Ext. Abst. International symposium on control of semiconductor interface" by T. Nishimura et al., p.p. 67-68, 2007, for example). With the thin insulating film, the position of the pinning by MIGS (metal induced gap states) is successfully changed. However, the effective work function is adjusted only to 4.2 eV, while the target value is 4.0 eV. Although the resistance due to the Schottky barrier is lowered, carrier electrons also tunnel through the thin insulating film in this case. As a result, the tunnel barrier forms new resistance. Therefore, by the technique disclosed in "Ext. Abst. International symposium on control of semiconductor interface" by T. Nishimura et al., p.p. 67-68, 2007, the position of the pinning can be changed, but the work function cannot be adjusted freely, and an optimum work function is not obtained. Although the Schottky barrier is lowered, the new resistance due to the tunnel barrier is added, and there is a limit to realization of lower contact resistance.

According to either of the techniques disclosed in JP-A 2006-100387(KOKAI) and "Ext. Abst. International symposium on control of semiconductor interface" by T. Nishimura et al., p.p. 67-68, 2007, a stacked structure formed with a semiconductor, a thin insulating film, and a metal is formed. Although the Schottky barrier can be lowered in this case, a high tunnel barrier is formed at the interface. There are roughly two problems in this case.

The first problem is that the connecting effect between the semiconductor and the metal does not completely disappear, and therefore, the pinning position shifts. In this case, the pinning position does not always shift to the position of an optimum work function. For example, as disclosed in JP-A 2006-100387(KOKAI), in a case where an oxide film is inserted to the interface between n-type Ge and a metal, an effective work function of approximately 4.2 eV is obtained. Originally, an ideal effective work function should be 4.0 eV, or even 3.9 eV or smaller. According to this technique, however, the effective work function is fixed at 4.2 eV. This value does not greatly vary even if the thickness of the oxide film to be inserted is changed, or if the metal is changed. Therefore, there are no solutions to this problem.

The second problem is that electrons tunnel through the inserted thin film, and allows a current to flow. A tunnel barrier is formed as new resistance, resulting in an increase in the power consumption. If the thin film is made as thin as possible or is made too thin, the effect to shift the pinning position becomes smaller.

In a semiconductor device such as a low-power-consumption MOSFET of the next generation or later, a novel technique is necessary to optimize the effective work function and minimize generation of new resistance.

SUMMARY

Possible embodiments of this invention are made in view of these circumstances, and some embodiments of this invention may provide a semiconductor device that has the effective work function of the connected metal optimized at the interface between a semiconductor or a dielectric material and the metal, and also provide a capacitor and a field effect transistor.

A semiconductor device according to a first aspect of the present invention includes: a semiconductor film; an oxide film formed on the semiconductor film, the oxide film including at least one of Hf and Zr, and at least one element selected from the group consisting of V, Cr, Mn, Nb, Mo, Tc, W, and Re being added to the oxide film; and a metal film formed on the oxide film.

A capacitor according to a second aspect of the present invention includes: a first metal film; a first oxide film formed on the first metal film, the first oxide film including at least one of Hf and Zr, and at least one element selected from the group consisting of V, Cr, Mn, Nb, Mo, Tc, W, and Re being added to the first oxide film; a dielectric film formed on the first oxide film; a second oxide film formed on the dielectric film, the second oxide film including at least one of Hf and Zr, and at least one element selected from the group consisting of V, Cr, Mn, Nb, Mo, Tc, W, and Re being added to the second oxide film; and a second metal film formed on the second oxide film.

A field effect transistor according to a third aspect of the present invention includes: a semiconductor substrate; source and drain regions made of a semiconductor, formed at a distance from each other in the semiconductor substrate, and having a different conductivity type from the semiconductor substrate; a gate insulating film formed on a portion of the semiconductor substrate, the portion being located between the source region and the drain region, the portion being a channel region; a gate electrode formed on the gate insulating film; oxide films formed on the source and drain regions, the oxide films including at least one of Hf and Zr, and at least one first element selected from the group consisting of V, Cr, Mn, Nb, Mo, Tc, W, and Re being added to the oxide films; and source and drain electrodes made of a metal, and formed on the oxide films.

A field effect transistor according to a fourth aspect of the present invention includes: a semiconductor substrate; source and drain regions made of a metal, and formed at a distance from each other in the semiconductor substrate; a gate insulating film formed on a portion of the semiconductor substrate, the portion being located between the source region and the drain region, the portion being a channel region; a gate electrode formed on the gate insulating film; and oxide films formed between the channel region and the source and drain regions, the oxide films including at least one of Hf and Zr, and at least one first element selected from the group consisting of V, Cr, Mn, Nb, Mo, Tc, W, and Re being added to the oxide films.

A semiconductor device according to a fifth aspect of the present invention includes: a semiconductor substrate; source and drain regions made of a semiconductor, formed at a distance from each other in the semiconductor substrate, and having a different conductivity type from the semiconductor substrate; a first insulating film formed on a portion of the semiconductor substrate, the portion being located between the source region and the drain region, the portion being a channel region; a charge storage film formed on the first insulating film; a second insulating film formed on the charge storage film; a control electrode formed on the second insulating film; oxide films formed on the source and drain regions, the oxide films including at least one of Hf and Zr, and at least one first element selected from the group consisting of V, Cr, Mn, Nb, Mo, Tc, W, and Re being added to the oxide films; and source and drain electrodes made of a metal, and formed on the oxide films.

A semiconductor device according to a sixth aspect of the present invention includes: a semiconductor substrate; source and drain regions made of a metal, and formed at a distance from each other in the semiconductor substrate; a first insulating film formed on a portion of the semiconductor substrate, the portion being located between the source region and the drain region, the portion being a channel region; a charge storage film formed on the first insulating film; a second insulating film formed on the charge storage film; a control electrode formed on the second insulating film; and oxide films formed between the channel region and the source and drain regions, the oxide films including at least one of Hf and Zr, and at least one first element selected from the group consisting of V, Cr, Mn, Nb, Mo, Tc, W, and Re being added to the oxide films.

DESCRIPTION OF THE DRAWINGS

FIGS. 35(a) to 36(b) are cross-sectional diagrams showing the procedures for manufacturing a semiconductor device according to Modification 1 of Example 5;

DETAILED DESCRIPTION

The following is a description of embodiments, with reference to the accompanying drawings.

First, an embodiment of is described through comparisons with conventional art. Particularly, the following description concerns a technique for lowering the resistance at the junctions between the source and drain regions of a MIS (metal insulator semiconductor) transistor and metal electrodes connected to the source and drain regions (the metal electrode will be hereinafter also referred to as the source and drain metal electrodes).

Figure 1:
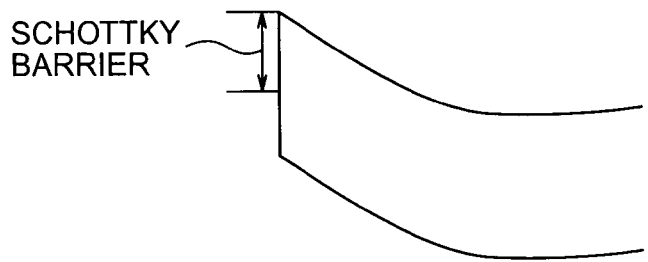
FIG. 1 is a diagram showing general characteristics of the interface between a semiconductor and a metal.
Figure 2:
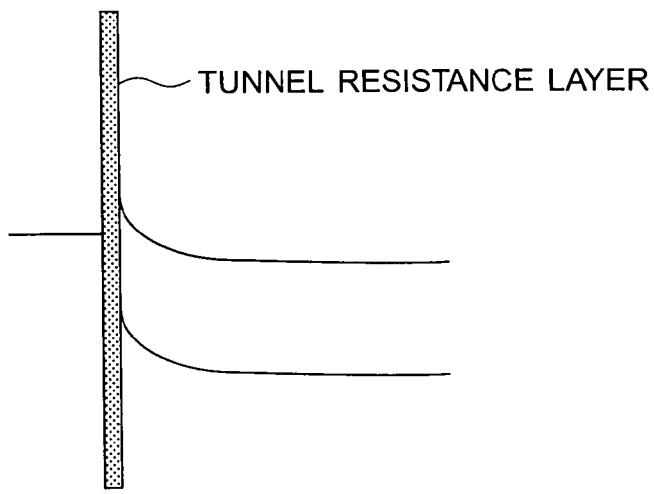
FIG. 2 is a diagram showing a conventional technique related to the interface between a semiconductor and a metal.
Figure 3:
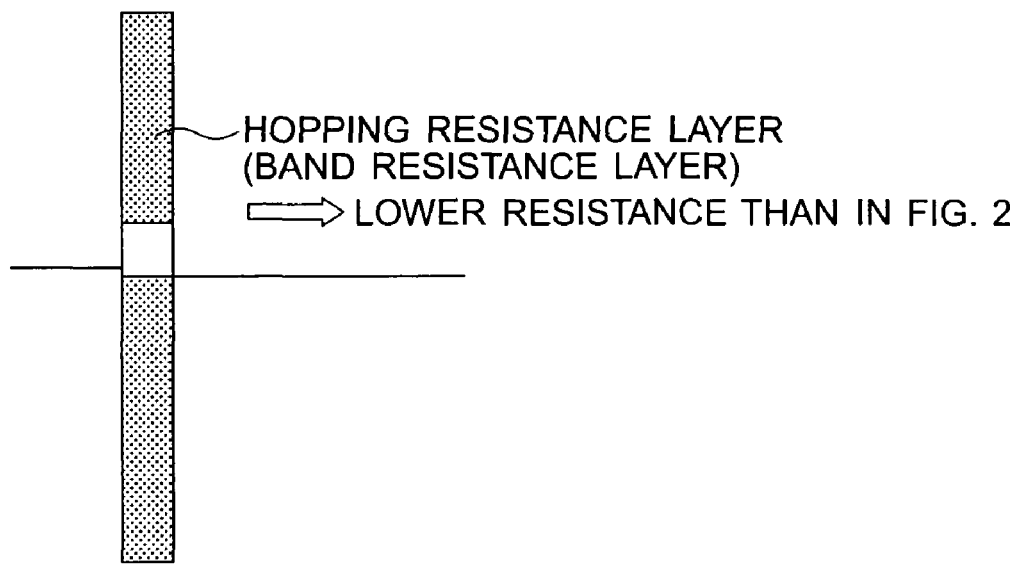
FIG. 3 is a diagram showing a technique according to an embodiment related to the interface between a semiconductor and a metal.

FIG. 1 shows the general characteristics of the interface between a semiconductor and a metal. FIG. 2 illustrates the technique disclosed in JP-A 2006-100387(KOKAI) or by T. Nishimura et al., in "Ext. Abst. International symposium on control of semiconductor interface 2007" (pp. 67-68). FIG. 3 illustrates the technique in accordance with this embodiment of the present invention.

First, as shown in FIG. 1, a Schottky barrier appears at the interface between a semiconductor and a metal. There has been a suggested method for adjusting the height and thickness of such a Schottky barrier by controlling the type of the metal and the type and concentration of the dopant in the semiconductor. Although this method is valid, it is very difficult to reduce the barrier to zero (or to obtain an ohmic junction). Alternatively, it is also difficult to increase the height of the barrier. A typical example of such a junction is a junction between source and drain regions made of semiconductor Si (or Ge) and source and drain connection metals. With such a junction, a high Schottky barrier remains, and desired control cannot be performed. At present, there is a demand for a technique of freely controlling the height of the barrier or the thickness of the barrier or the like.

As shown in FIG. 2, JP-A 2006-100387(KOKAI) or T. Nishimura et al., in "Ext. Abst. International symposium on control of semiconductor interface 2007" (pp. 67-68) discloses a technique of interposing a thin oxide film in the interface. By this technique, the barrier position is fixed (or pinned), regardless of the type of the metal. The pinning is considered to be the bulk effect of the semiconductor. As a thin oxide film is interposed in the interface, the pinning position can be shifted. Since the bulk effect of the semiconductor is prevented from easily reaching the metal side by interposing the thin oxide film in the interface, the pinning position is shifted. However, as disclosed by T. Nishimura et al., in "Ext. Abst. International symposium on control of semiconductor interface 2007" (pp. 67-68), the pinning position cannot be freely moved by this technique. In other words, an optimum barrier cannot be freely formed. Further, the thin oxide film provided in the interface becomes another barrier against electrons and holes. This causes new electric resistance (tunnel resistance), and leads to a further increase in power consumption.

By the technique in accordance with this embodiment of the present invention, on the other hand, a thin film made of an oxide (an oxide film) is inserted between a semiconductor and a metal, and a first added material is introduced into the oxide film so as to form states in the energy gap, as shown in FIG. 3. A second added material is further introduced so as to move the energy position of the states in the gap to a desired location. In this manner, the Fermi energy (the work function) of the metal to be joined is pinned in the states in the gap (see FIG. 4(a) and FIG. 4(b)). This pinning is embodied by an interfacial state (such as the energy position of the states in the gap) that is artificially formed. As seen from the method of forming the interfacial state, the work function can be freely controlled to a desired value. This is the first feature of the technique in accordance with this embodiment. In the following, the oxide film having the added materials added thereto will be also referred to as the interfacial control oxide film.

Electrons and holes pass through the levels in the gap of the interfacial control oxide film. Since the levels in the gap are narrow bands having a certain number of states, the conduction is made through the narrow bands (or hopping conduction to be received in a short range). Accordingly, a hopping current flows with the use of the overlapping of wave functions of the levels in the gap. The new and large tunnel resistance that is caused by the insertion of an oxide film as disclosed by T. Nishimura et al., in "Ext. Abst. International symposium on control of semiconductor interface 2007" (pp. 67-68) or JP-A 2006-100387(KOKAI) does not appear by the technique in accordance with this embodiment of the present invention.

In this embodiment of the present invention, the new barrier against the carriers passing through the interfacial control oxide film is the hopping resistance (or the band resistance). Compared with the tunnel resistance shown in FIG. 2, the carrier barrier is much smaller, and is almost zero. Thus, it may be considered that the new barrier does not appear. This is the second feature of this embodiment.

In addition to the above explanation, the difference between the tunnel resistance and the hopping resistance is now described. The tunnel resistance represents the passing (tunneling) of carriers through the oxide film by virtue of the overlapping of the wave functions of the states located on both sides (the semiconductor side and the metal side) of the oxide film. On the other hand, the hopping resistance represents the passing (hopping) of carriers through the oxide film by virtue of the overlapping of the wave functions of the states inside the oxide film (the states in the gap). When there is large overlapping between the states in the gap, a band is formed, and band conduction is realized. The resistance with which band conduction is caused is referred to as the band resistance. In this specification, band conduction is regarded as a form of hopping conduction.

Figure 4:
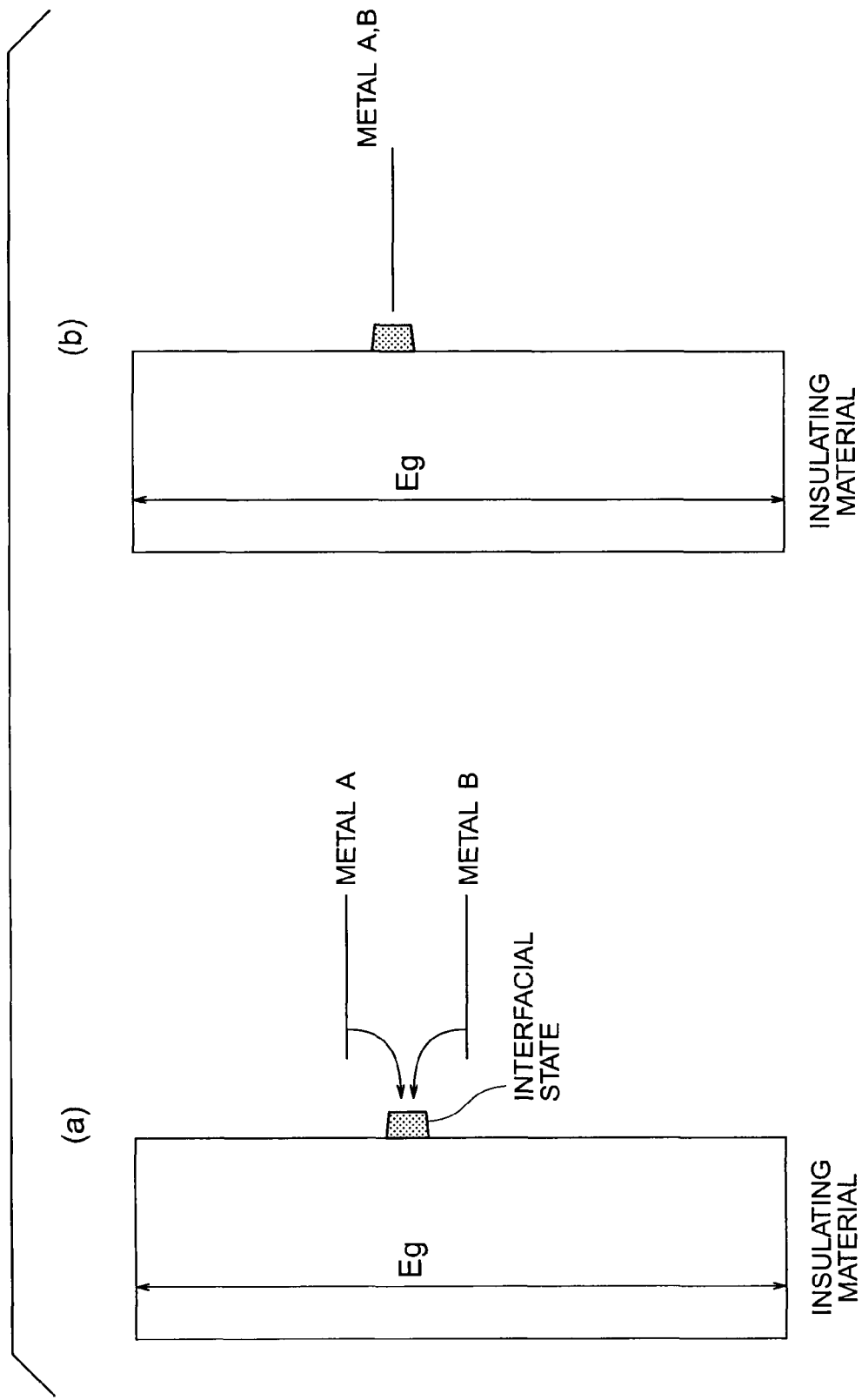
FIGS. 4(a) and 4(b) are diagrams for explaining Fermi level pinning.

Next, work function control to be performed by the interfacial control oxide film is briefly described. FIGS. 4(a) and 4(b) show a situation where Fermi level pinning is performed with an interfacial state. When there is an interfacial state at the interface between an insulating material and a metal, electrons are moved between the interfacial state and the contact metal, so that the work function of the metal is drawn to the position where the interfacial state exists. This phenomenon is called Fermi level pinning (with an interfacial state).

Figure 5:
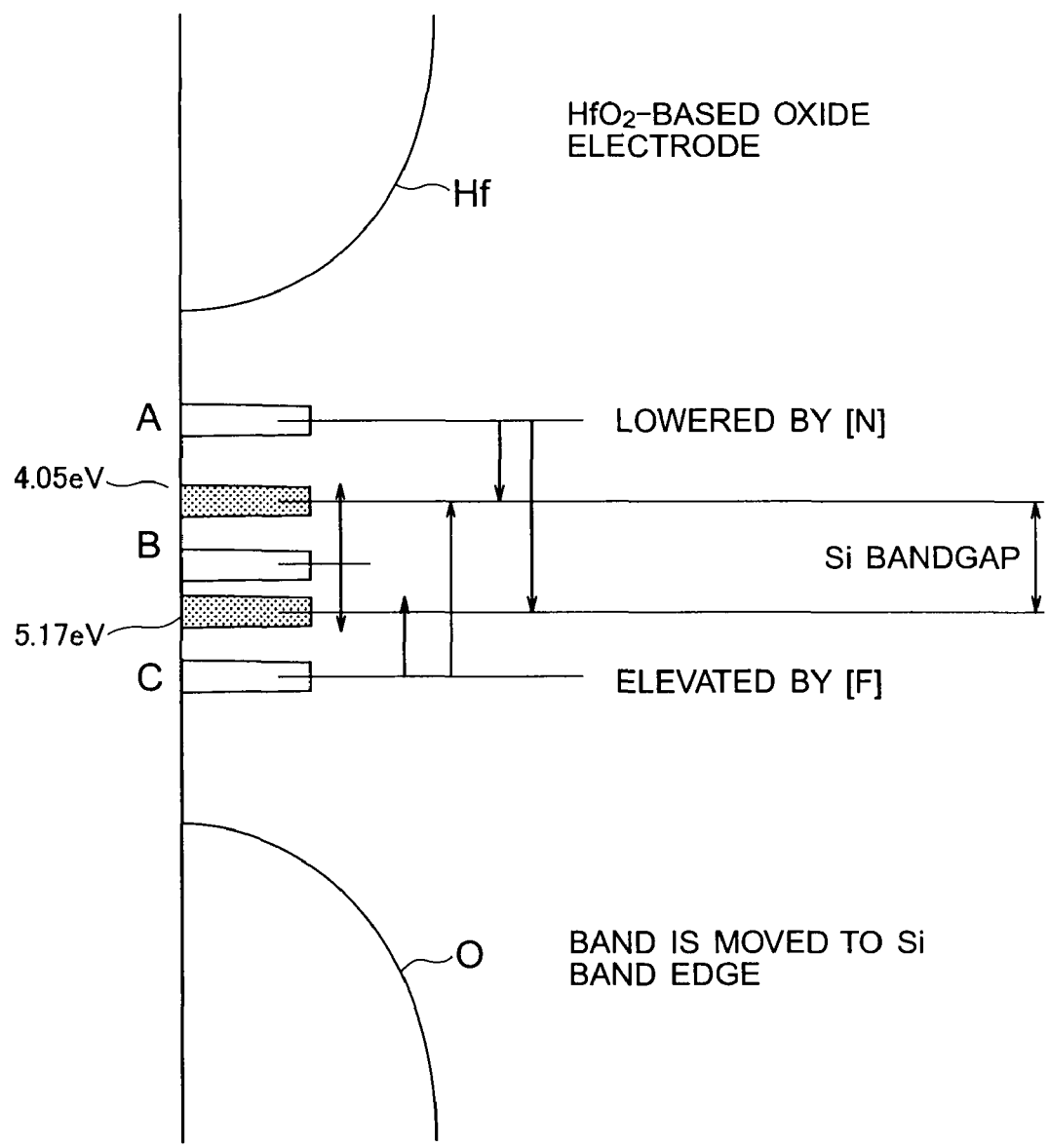
FIG. 5 is a diagram showing the energy band of a $HfO_2$-based oxide electrode.

In the case of the metal A shown in FIGS. 4(a) and 4(b), electrons flow into the interfacial state from the metal side, and the energy level of the metal A becomes lower. As a result, the effective work function of the metal A becomes larger. In the case of the metal B, on the other hand, electrons move from the interfacial state to the metal B side, and the energy level of the metal B becomes higher. As a result, the effective work function of the metal B becomes smaller. Accordingly, the effective work function is determined by the energy position of the interfacial state, independently of the metals, as shown in FIG. 4(b). In this embodiment of the present invention, this interfacial state is artificially created in the interfacial control oxide film, and the energy level of the interfacial state is adjusted so as to optimize the effective work function. This is further explained with reference to FIG. 5. FIG. 5 shows the energy band of a $HfO_2$-based oxide electrode. The abscissa axis in FIG. 5 indicates the state density, and the ordinate axis indicates the energy. As shown in FIG. 5, a high-valency material that is a pentavalent to heptavalent material (a second metal having higher valency than a first metal) is added as the first added material to $HfO_2$ (or $ZrO_2$), which is an oxide of the first metal Hf (or Zr), so that states can be created in the gap. Further, as will be described later, the energy position in the states in the gap can be changed by introducing the second added material. Accordingly, an oxide film having a desired work function can be formed by artificially controlling the high-valency material (the first added material) and the second added material. FIG. 5 shows the gap position of Si.

Figure 6:
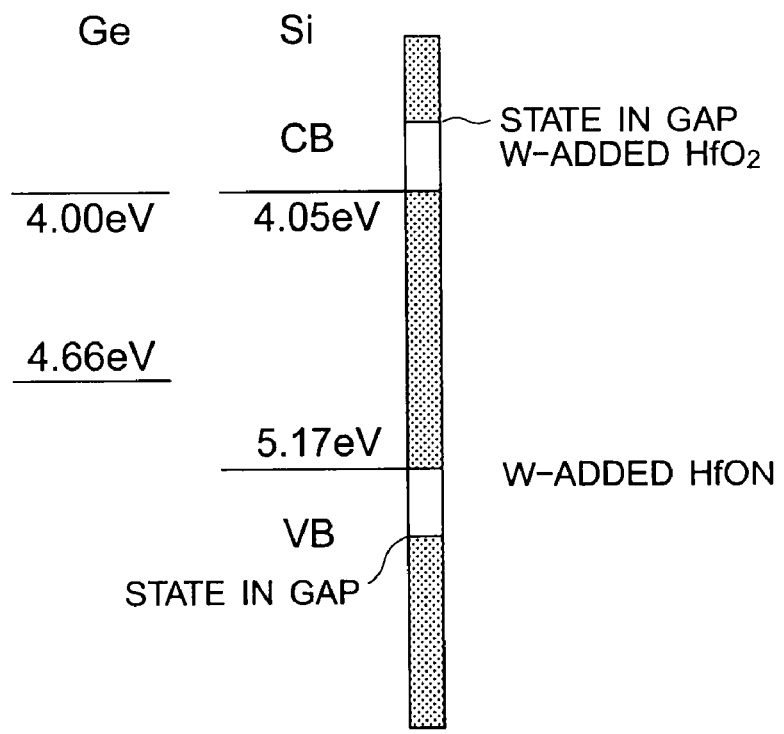
FIG. 6 is a diagram showing the band lineup of a stacked structure formed with a semiconductor substrate and an interfacial control oxide film.

FIG. 6 shows the band lineup of a stacked structure formed with a Si substrate or a Ge substrate and an interfacial control oxide film. For example, $HfO_2$ having W added thereto is used as the interfacial control oxide film, so that a state in the gap can be formed at the energy position of 3.9 eV in work function. As shown in FIG. 6, the lower edge of the conduction band (CB) of the Si is 4.05 eV, and the lower edge of the conduction band of the Ge is 4.00 eV. Alternatively, $HfO_2$ having both W and nitrogen (N) added thereto may be used as the interfacial control oxide film. In the case where the interfacial control oxide film is formed on a Ge substrate, a state in the gap can be formed at a position of 4.66 eV (equivalent to the upper edge of the valence band of p-type Ge) or greater, depending on the nitrogen amount. In the case where the interfacial control oxide film is formed on a Si substrate, a state in the gap can be formed at a position of 5.17 eV (equivalent to the upper edge of the valence band of p-type Si) or greater, depending on the nitrogen amount. In this manner, the work function can be adjusted.

Connections Between Source and Drain Regions of Semiconductor and Source and Drain Metal Electrodes Next, a case where the above described interfacial control oxide film is provided between the source and drain regions of a semiconductor and the source and drain metal electrodes is described.

n-MISFET

If an oxide film having a smaller work function than the bottom (the lower end) of the conduction band (CB) of Si can be formed, the Schottky barrier at the interface can be reduced to zero by inserting the oxide film between n-type Si and metal electrodes. In other words, ohmic connections can be established. In terms of work function, 4.05 eV or less should be achieved. If the oxide film exhibits the electric conduction characteristics of a metal, the thin film may be regarded as (part of) the source and drain metal electrodes. In this manner, an n-MISFET having much lower contact resistance between the source and drain regions of n-type Si and the source and drain metal electrodes, or having ohmic connections, can be formed.

Figure 7:
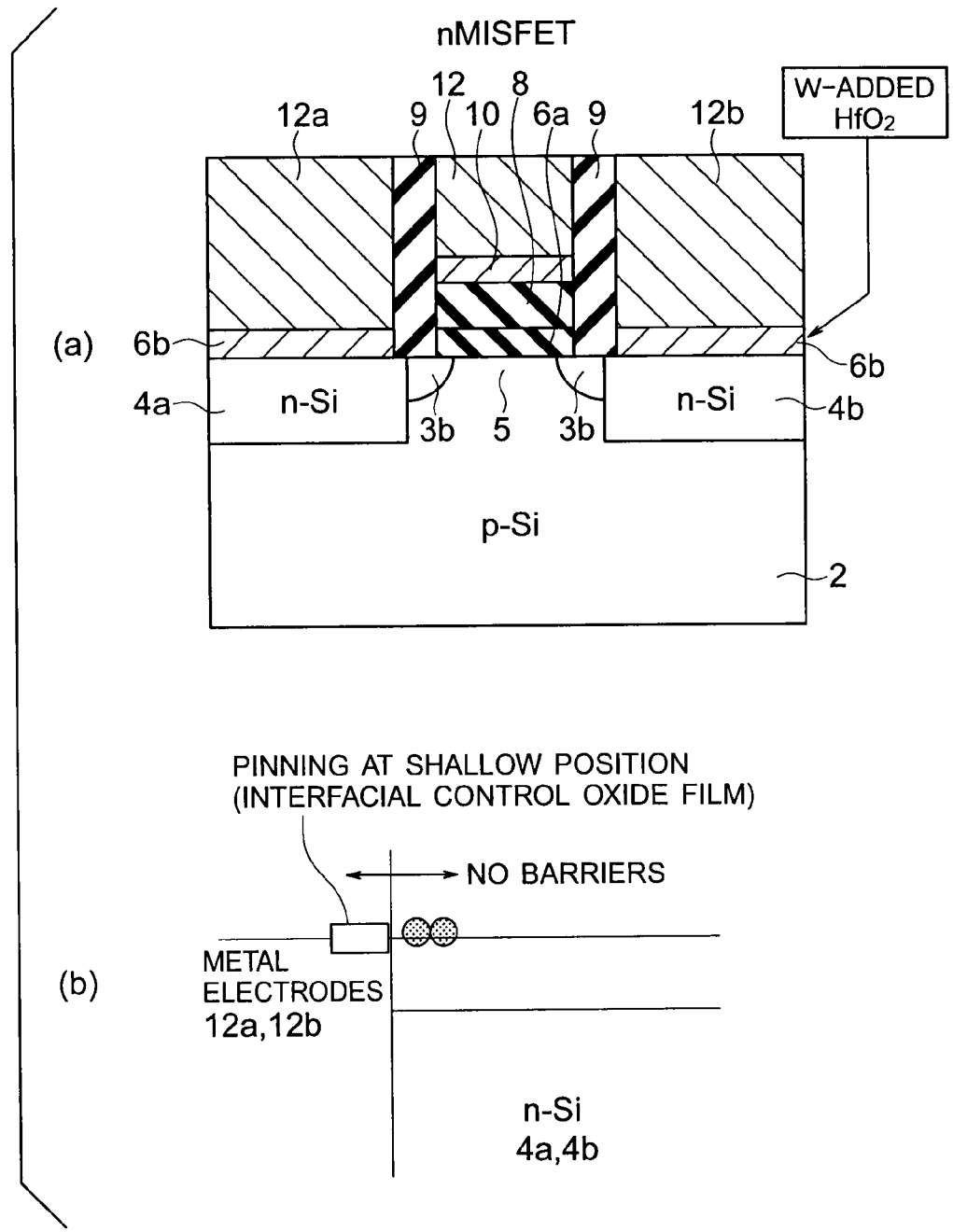
FIGS. 7(a) and 7(b) are diagrams showing a semiconductor device according to an embodiment.

FIGS. 7(a) and 7(b) show the n-MISFET formed as above. This n-MISFET includes n-type extension regions 3a and 3b formed in a p-type silicon substrate 2, with a channel region 5 being interposed between the n-type extension regions 3a and 3b, and n-type impurity regions 4a and 4b having deeper junctions than the extension regions 3a and 3b. The extension region 3a and the impurity region 4a form the source region, and the extension region 3b and the impurity region 4b form the drain region. A $HfO_2$ film 6a having a small thickness is formed on the channel region 5, for example. A gate insulating film 8 made of $HfO_2$ is formed on the $HfO_2$ film 6a, for example. A $HfO_2$ film 10 having W added thereto is formed on the gate insulating film 8, and a gate electrode 12 made of W is formed on the $HfO_2$ film 10 having W added thereto. Also, a $HfO_2$ film (an interfacial control oxide film) 6b having W added thereto is formed on each of the source and drain regions, and source and drain electrodes 12a and 12b made of W are formed on the $HfO_2$ film 6b having W added thereto. The gate electrode 12 is electrically insulated from the source and drain electrodes 12a and 12b by sidewalls 9 formed with an insulating material. The $HfO_2$ film 6a and the $HfO_2$ film 6b having W not added thereto yet are formed at the same time, and have substantially the same film thicknesses. The adding of W to the $HfO_2$ film 6b is realized, as W diffuses into the $HfO_2$ film 6b when the source and drain electrodes 12a and 12b made of W are formed. Also, the $HfO_2$ film 10 having W added thereto is formed, as W diffuses into the surface of the gate insulating film 8 when the gate electrode 12 made of W is formed on the gate insulating film 8 made of $HfO_2$. Since the $HfO_2$ film 6b serving as the interfacial control oxide film is an oxide film having a smaller work function than the lower edge of the conduction band, as illustrated in FIG. 6, the Schottky barrier at the interface between the source and drain regions of n-type Si and the source and drain metal electrodes 12a and 12b can be reduced to zero (see FIG. 7(b)). In a case where nitrided HfON is used as the gate insulating film 8, a HfON film 10 having W added thereto is formed at the interface between the gate insulating film 8 and the gate electrode 12. Here, the work function of the gate electrode 12 can be set to a larger value by controlling the nitrogen amount. Although it is merely an example, adjusting the work function of the gate electrode 12 is effective in optimizing the threshold value of the transistor.

p-MISFET

Likewise, if an oxide film having a greater work function than the top (the upper end) of the valence band (VB) of Si can be formed, the Schottky barrier at the interface can be reduced to zero by inserting the oxide film between p-type Si and metal electrodes. In other words, ohmic connections can be established. In terms of work function, 5.17 eV or more should be achieved. If the oxide film exhibits the electric conduction characteristics of a metal, the thin film may be regarded as (part of) the source and drain metal electrodes. In this manner, a p-MISFET having much lower contact resistance between the source and drain regions of p-type Si and the source and drain metal electrodes, or having ohmic connections, can be formed.

Figure 8:
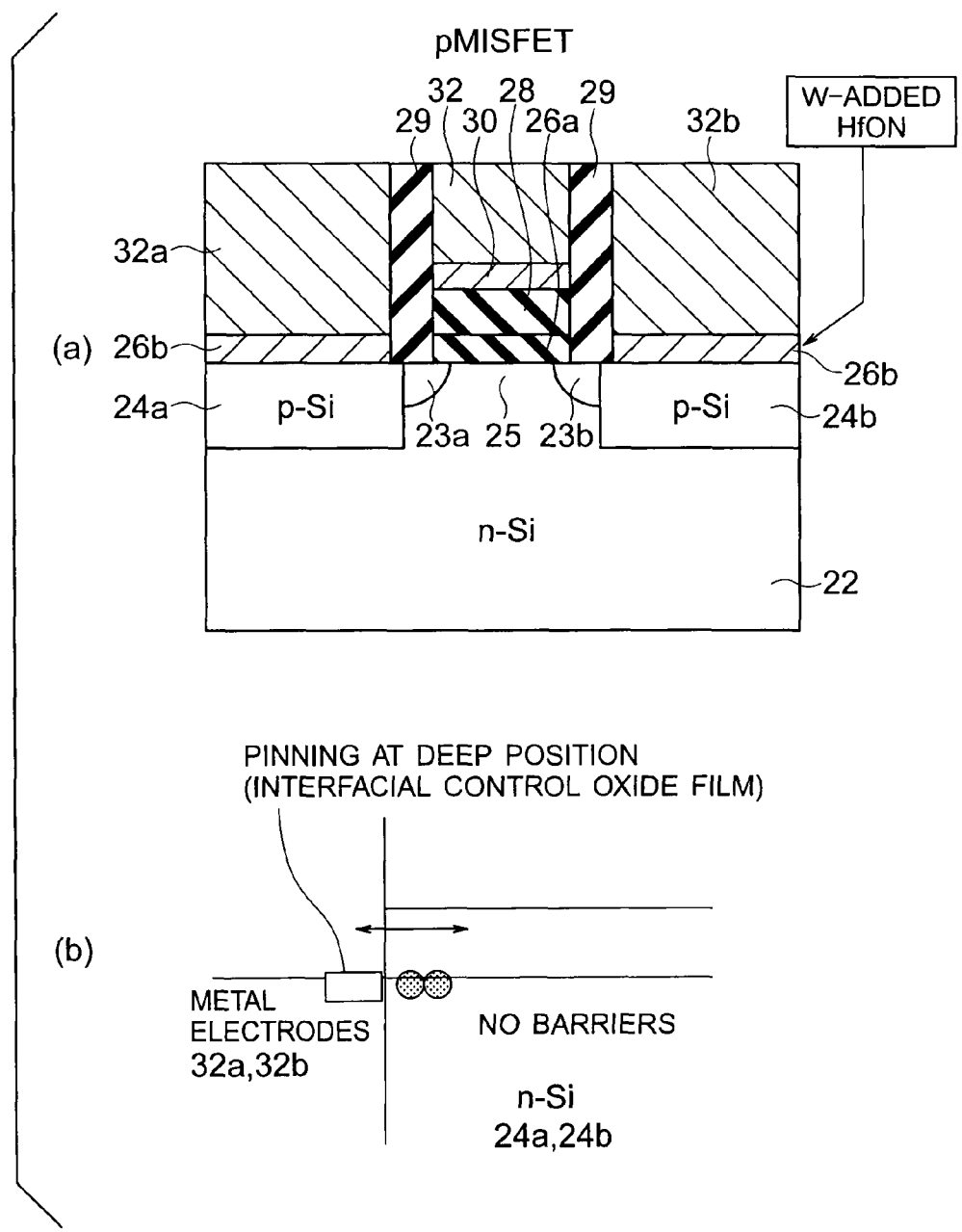
FIGS. 8(a) and 8(b) are diagrams showing a semiconductor device according to an embodiment.

FIGS. 8(a) and 8(b) show the p-MISFET formed as above. This p-MISFET includes p-type extension regions 23a and 23b formed in an n-type silicon substrate 22, with a channel region 25 being interposed between the p-type extension regions 23a and 23b, and p-type impurity regions 24a and 24b having deeper junctions than the extension regions 23a and 23b. The extension region 23a and the impurity region 24a form the source region, and the extension region 23b and the impurity region 24b form the drain region. A HfON film 26a having a small thickness is formed on the channel region 25, for example. A gate insulating film 28 made of HfON containing a smaller amount of nitrogen than the nitrogen amount in the HfON film 26a is formed on the HfON film 26a, for example. A HfON film 30 having W added thereto is formed on the gate insulating film 28, and a gate electrode 32 made of W is formed on the HfON film 30 having W added thereto. Also, a HfON film (an interfacial control oxide film) 26b having W added thereto is formed on each of the source and drain regions, and source and drain electrodes 32a and 32b made of W are formed on the HfON film 26b having W added thereto. The gate electrode 32 is electrically insulated from the source and drain electrodes 32a and 32b by sidewalls 29 formed with an insulating material. The HfON film 26a and the HfON film 26b having W not added thereto yet are formed at the same time, and have substantially the same film thicknesses. Before W is added to the HfON film 26b, nitrogen ions may be implanted only into the HfON film 26b with the use of a resist having openings formed at the portions corresponding to the source and drain portions, or a greater amount of nitrogen may be introduced into the HfON film 26b through diffusion from a nitrogen atmosphere. Alternatively, a stacked structure of WN and W may be used as the source and drain metal electrodes 32a and 32b, so as to contain a greater amount of nitrogen. The nitrogen amount is adjusted so that the connection between the source and the drain of the semiconductor becomes a Schottky junction. The adding of W to the HfON film 26b is realized, as W diffuses into the HfON film 26b when the source and drain electrodes 32a and 32b made of W are formed. Also, the HfON film 30 having W added thereto is formed, as W diffuses into the surface of the gate insulating film 28 made of HfON when the gate electrode 32 made of W is formed on the gate insulating film 28 made of HfON. Since the HfON film 26b serving as the interfacial control oxide film is an oxide film having a greater work function than the upper edge of the valence band, as illustrated in FIG. 6, the Schottky barrier at the interface between the source and drain regions of p-type Si and the source and drain metal electrodes 32a and 32b can be reduced to zero (see FIG. 8(b)). In a case where HfON nitrided in large amounts is used as the gate insulating film 28, a HfON film 30 having W added thereto is formed at the interface between the gate insulating film 28 and the gate electrode 32. Here, the work function of the gate electrode 32 can be set to any desired value by controlling the nitrogen amount. Although it is merely an example, adjusting the work function of the gate electrode 32 is effective in optimizing the threshold value of the transistor.

As described above, the contact resistance between the source and drain regions of a semiconductor and the source and drain metal electrodes can be made much lower in either the n-MISFET or the p-MISFET. This technique may be used in only the n-MISFET or only the p-MISFET, or may be used in a CMIS structure.

Application to Memory Cell Structures

With one of the MISFETs being basic cells, the technique can be applied to a floating gate (FG) memory or a MONOS (Metal-Oxide-Nitride-Oxide-Semiconductor) memory having a NAND string formed therein. Also, it is possible to apply the technique to a FG memory or a MONOS memory having a NOR structure. There is not a particular restriction on each of the films forming the basic cells of a FG memory or a MONOS memory. Although a silicon nitride film is normally used as the charge storage film in which the charge of the basic cells of a MONOS memory is to be stored, a SrTiO$_3$ film having Ru added thereto or the like may be used instead. Although a SiO$_2$ film is normally used as the tunneling film through which electrons are to tunnel, it is also possible to use a SiON film, or a stacked film formed with SiO$_2$, Si$_3$N$_4$, and SiO$_2$, or the like. In other words, a structure in accordance with an embodiment is used so as to form the source and drain regions of a semiconductor and the source and drain metal electrodes of MISFET basic cells. Accordingly, the contact resistance at the connecting portions can be made much lower, and a memory that consumes less electricity can be realized.

In a NOR-type structure, the source and drain regions of the semiconductor of the basic cells are connected to the source and drain metals. In other words, a MISFET in accordance with an embodiment can be used as it is, if the gate insulating film is formed with an insulating film, a charge storage film, and another insulating film. If the charge storage film is made of polysilicon, a FG memory is formed. If the charge storage film is formed as a trap insulating film that traps charges, a MONOS memory is formed. The essential aspect of this structure is that an oxide in accordance with an embodiment is inserted between the semiconductor source and drain regions and the source and drain metals. With this structure, a memory that consumes less electricity can be realized.

In a structure having a NAND string, the semiconductor source and drain regions are not necessarily connected to the source and drain metals in some of the basic cells, and this technique should be applied only to appropriate parts.

If the contact between the semiconductor source and drain and the source and drain metals has low resistance, a memory having some other structure may be formed, whether the structure is of a NOR type or a NAND type, regardless of the power consumption at the contact portions. With such perspectives in sight, controlling the contact resistance is very beneficial. For example, two memory cells are arranged to share the source region. A right-side drain and a left-side drain are formed on both sides, and data is stored in both the right-side memory cell and the left-side memory cell. The two cells form one cell that stores four-value data.

Although the drain current needs to be detected at this point, memory cells that consume less electricity can be formed, since the contact resistance is low. This structure may be formed with two left and right memories storing four-value data, may be formed with four directions (four bits, 16 values), or may be formed with cells stacked in a vertical direction.

Ge Substrate

This embodiment of the present invention is a technique for controlling the junctions at the interface between a semiconductor and a metal. A case where this technique is applied to a CMIS structure using a Ge substrate is now described. At present, there is the problem that the work function is pinned at 4.6 eV at the junctions between Ge and a metal. Ideally, it is desirable that the work function is 4.66 eV or greater in the case of p-type Ge, and is 4.0 eV or smaller in the case of n-type Ge. Alternatively, the pinning position (4.6 eV) is effective in the case of p-type Ge, and the technique in accordance with this embodiment may be used to pin the work function at 4.0 eV or smaller in the case of n-type Ge substrate. In this case, the technique in accordance with this embodiment is applied only to the n-MISFET side. For example, if HfO$_2$ having W added thereto is used, the effective work function can be pinned at a work function position in the neighborhood of 3.9 eV, as shown in FIG. 6. To form an n-MISFET having the source and drain made of n-type Ge, a HfO$_2$ film having W added thereto should be inserted as the interfacial control oxide film into the junction face in contact with the source and drain electrodes made of W. In a p-MISFET having the source and drain regions made of p-type Ge, the interfacial control oxide film is not inserted, and the pinning effect of the work function at 4.6 eV can be used.

As a modification of the p-MISFET having the source and drain regions made of p-type Ge, an HfO$_2$ film having both W and N added thereto may be used as the interfacial control oxide film, so as to form the source and drain metal electrodes having a greater effective work function than the effective work function (4.6 eV) of the case where the interfacial control oxide film is not inserted. Although N is added as an example, the effective work function can also be made greater by adding an element selected from the group including C, B, Mg, Ca, Sr, Ba, Al, Sc, Y, La, and lanthanoids (Ce, Pr, Nd, Pm, Sm, Eu, Gd, Tb, Dy, Ho, Er, Tm, Yb, and Lu), as will be later described.

Further, as a modification of the above n-MISFET having the source and drain regions made of n-type Ge, the interfacial control oxide film may be formed by adding at least one material selected from the group including F, H, and Ta to a HfO$_2$ film having W added thereto. In this case, the effective work function can be made even smaller (3.9 eV or smaller).

Figure 9:
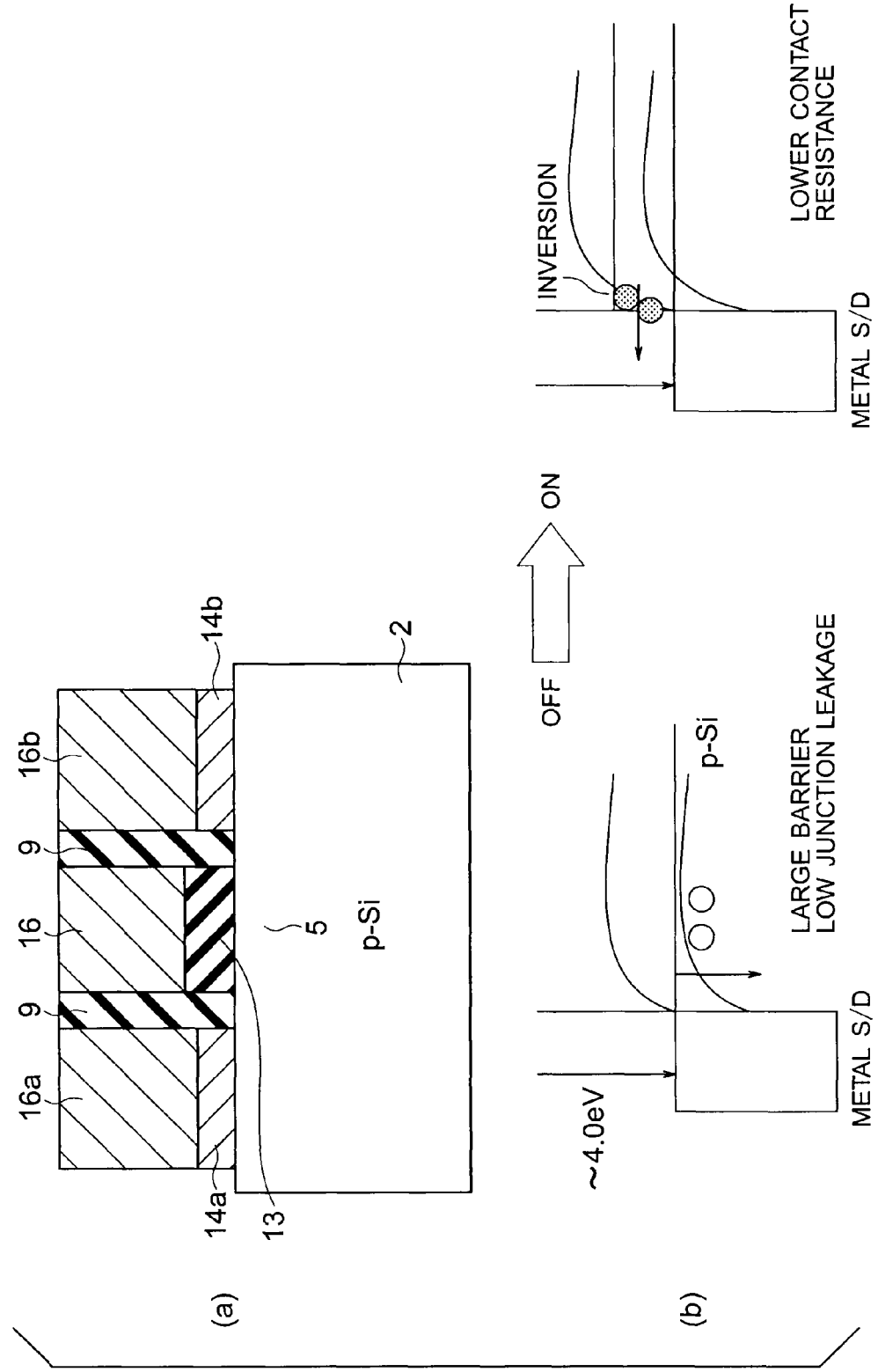
FIGS. 9(a) and 9(b) are diagrams showing a semiconductor device according to an embodiment.
Figure 10:
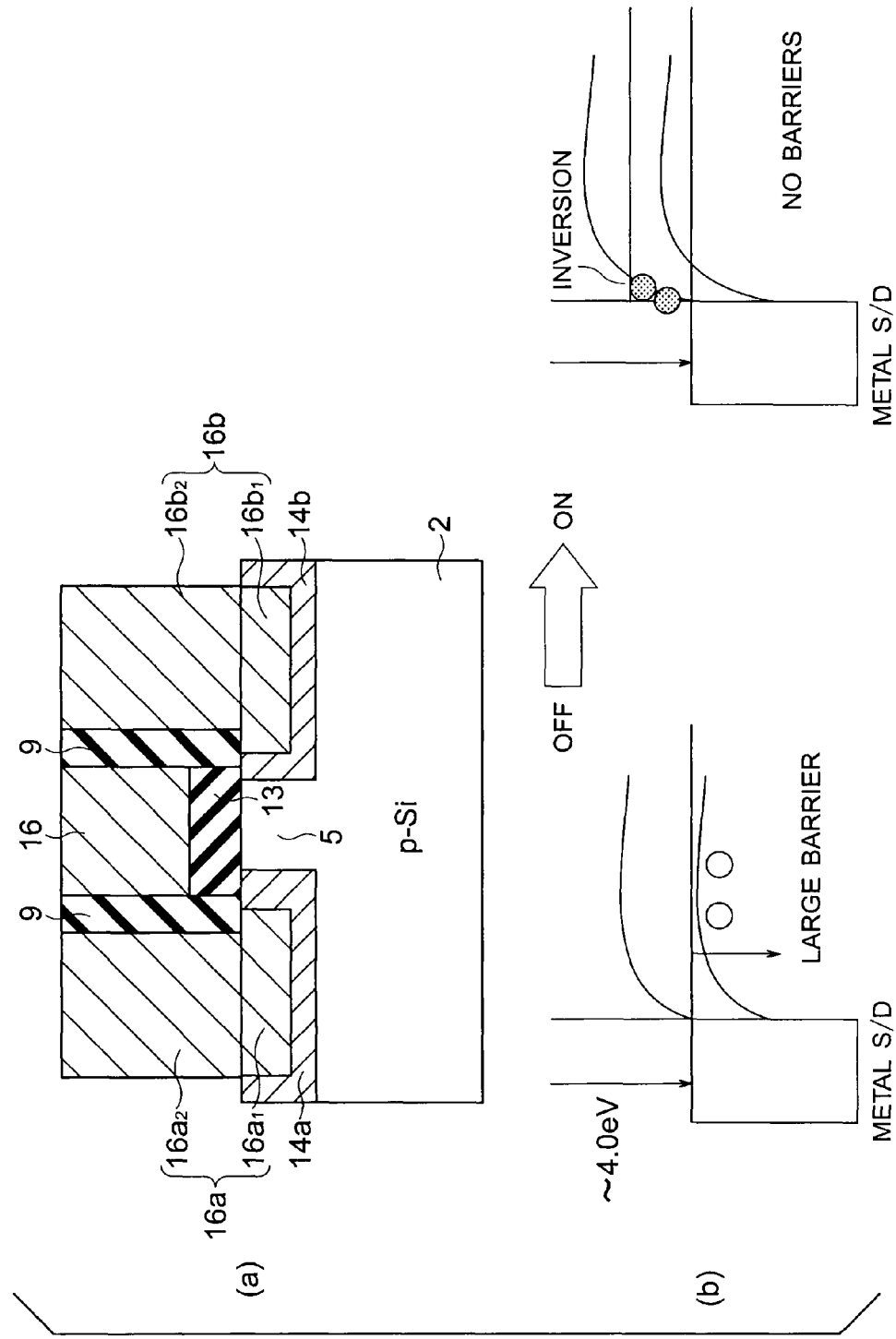
FIGS. 10(a) and 10(b) are diagrams showing a semiconductor device according to an embodiment.

Connections Between Metal Source and Drain Regions and Semiconductor Channel Region n-MISFET If an oxide film having a smaller work function than the bottom (the lower end) of the conduction band (CB) of Si can be formed, the Schottky barrier at the interface can be restricted to 1.1 eV (equivalent to the bandgap of Si) or greater in a channel-off state, and can be reduced to zero in a channel-on state, by inserting the oxide film as the interfacial control oxide film between metal source and drain regions and a p-type Si channel region. In other words, it is possible to form an n-MISFET that has less current leakage (hereinafter also referred to as the junction leakage) in the off state, and maintains ohmic connections in the on state. FIGS. 9(a) and 9(b) show a first example of such an n-MISFET, and FIGS. 10(a) and 10(b) show a second example of such an n-MISFET. The n-MISFET of the first example includes a gate insulating film 13 formed on a channel region 5 in the surface of a p-type silicon substrate 2, and a gate electrode 16 that is formed on the gate insulating film 13 and is made of a metal selected from the group including TiN, W, TaN, and TaC, for example. Interfacial control oxide films 14a and 14b are formed on the portions of the channel region 5 located on both sides of the gate electrode 16. A source electrode 16a and a drain electrode 16b made of a metal selected from the group including TiN, W, TaN, and TaC are formed on the interfacial control oxide film 14a and the interfacial control oxide film 14b. The gate electrode 16 is electrically insulated from the source electrode 16a and the drain electrode 16b by sidewalls 9 that are formed on side faces of the gate electrode 16 and are made of an insulating material.

In the n-MISFET of the first example, the interfacial control oxide film 14a and the interfacial control oxide film 14b are provided between the channel region 5 made of p-type Si and the source electrode 16a and the drain electrode 16b made of a metal. If a HfO$_2$ film having W added thereto illustrated in FIG. 6 is used as each of the interfacial control oxide films 14a and 14b, a smaller work function than the lower edge of the conduction band of HfO$_2$ can be achieved. Accordingly, the Schottky barrier at the interface can be made 1.1 eV (equivalent to the bandgap of Si) or greater in the channel-off state, and can be made zero in the channel-on state (see FIG. 9(b)). Thus, it is possible to form a MISFET that has smaller junction leakage in the off state, and maintains ohmic connections in the on state.

As shown in FIGS. 10(a) and 10(b), the n-MISFET of the second example includes a gate insulating film 13 formed on a channel region 5 in the surface of a p-type silicon substrate 2, and a gate electrode 16 that is formed on the gate insulating film 13 and is made of a metal selected from the group including TiN, W, TaN, and TaC, for example. A first source electrode $16a_1$ and a first drain electrode $16b_1$ that are made of a metal selected from the group including TiN, W, TaN, and TaC are buried at the portions of the silicon substrate 2 located on both sides of the gate electrode 16. An interfacial control oxide film 14a and an interfacial control oxide film 14b are provided between the silicon substrate 2 and the first source electrode $16a_1$ and the first drain electrode $16b_1$, or between the channel region 5 and the first source electrode $16a_1$ and the first drain electrode $16b_1$. A second source electrode $16a_2$ and a second drain electrode $16b_2$ are further formed on the first source electrode $16a_1$ and the first drain electrode $16b_1$, respectively.

In the n-MISFET of the second example, the interfacial control oxide film 14a and the interfacial control oxide film 14b are provided between the channel region 5 made of p-type Si and the first source electrode $16a_1$ and the first drain electrode $16b_1$ made of a metal. If a HfO$_2$ film having W added thereto illustrated in FIG. 6 is used as each of the interfacial control oxide films 14a and 14b, a smaller work function than the lower edge of the conduction band of HfO$_2$ can be achieved. Accordingly, the Schottky barrier at the interface can be made 1.1 eV (equivalent to the bandgap of Si) or greater in the channel-off state, and can be made zero in the channel-on state (see FIG. 10(b)). Thus, it is possible to form an n-MISFET that has smaller junction leakage in the off state, and maintains ohmic connections in the on state.

With a Si substrate being taken into consideration, the energy level of the interfacial control oxide films to be inserted should be 4.05 eV or smaller in work function. Also, if the oxide films exhibit the electric conduction characteristics of a metal, the thin films may be regarded as (parts of) the metal source and drain. In this manner, it is possible to form an n-MISFET that has much higher contact resistance between the p-type Si channel and the metal source and drain in the off state, and has much lower contact resistance in the on state.

Although not shown in the drawings, a second interfacial control oxide film may be inserted between the gate insulating film 13 and the gate electrode 16 in each of FIGS. 9(a), 9(b) and FIGS. 10(a), 10(b), so as to optimize the work function of the gate electrode 16. The second interfacial control oxide film may have a different amount of additional material from the above interfacial control oxide films, and should normally be designed to have a greater value (4.05 eV or greater) than the bottom of the conduction band of Si.

p-MISFET

Likewise, if an oxide film having a larger work function than the top of the valence band (VB) of Si can be formed, the Schottky barrier at the interface can be restricted to 1.1 eV (equivalent to the bandgap of Si) or greater in a channel-off state, and can be reduced to zero in a channel-on state, by inserting the oxide film (as the interfacial control oxide film) between metal source and drain regions and an n-type Si channel. In other words, it is possible to form a p-MISFET that has less junction leakage in the off state, and maintains ohmic connections in the on state.

FIGS. 11(a) and 11(b) show a first example of such a p-MISFET, and FIGS. 12(a) and 12(b) show a second example of such a p-MISFET. The p-MISFET of the first example includes a gate insulating film 33 formed on a channel region 25 in the surface of an n-type silicon substrate 22, and a gate electrode 36 that is formed on the gate insulating film 33 and is made of a metal selected from the group including TiN, W, TaN, and TaC, for example. Interfacial control oxide films 34a and 34b are formed on the portions of the channel region 25 located on both sides of the gate electrode 36. A source electrode 36a and a drain electrode 36b made of a metal selected from the group including TiN, W, TaN, and TaC are formed on the interfacial control oxide film 34a and the interfacial control oxide film 34b. The gate electrode 36 is electrically insulated from the source electrode 36a and the drain electrode 36b by sidewalls 29 that are formed on side faces of the gate electrode 36 and are made of an insulating material.

In the p-MISFET of the first example, the interfacial control oxide film 34a and the interfacial control oxide film 34b are provided between the channel region 25 made of n-type Si and the source electrode 36a and the drain electrode 36b made of a metal. If a HfON film having W added thereto illustrated in FIG. 6 is used as each of the interfacial control oxide films 34a and 34b, a greater work function than the upper edge of the valence band of HfON can be achieved. Accordingly, the Schottky barrier at the interface can be made 1.1 eV (equivalent to the bandgap of Si) or greater in the channel-off state, and can be reduced to zero in the channel-on state. Thus, it is possible to form a p-MISFET that has smaller junction leakage in the off state, and maintains ohmic connections in the on state.

As shown in FIGS. 12(a) and 12(b), the p-MISFET of the second example includes a gate insulating film 33 formed on a channel region 25 in the surface of an n-type silicon substrate 22, and a gate electrode 36 that is formed on the gate insulating film 33 and is made of a metal selected from the group including TiN, W, TaN, and TaC, for example. A first source electrode $36a_1$ and a first drain electrode $36b_1$ that are made of a metal selected from the group including TiN, W, TaN, and TaC are buried at the portions of the silicon substrate 22 located on both sides of the gate electrode 36. An interfacial control oxide film 34a and an interfacial control oxide film 34b are provided between the silicon substrate 22 and the first source electrode $36a_1$ and the first drain electrode $36b_1$, or between the channel region 25 and the first source electrode $36a_1$ and the first drain electrode $36b_1$. A second source electrode $36a_2$ and a second drain electrode $36b_2$ are further formed on the first source electrode $36a_1$ and the first drain electrode $36b_1$, respectively.

In the p-MISFET of the second example, the interfacial control oxide film 34a and the interfacial control oxide film 34b are provided between the channel region 25 made of n-type Si and the first source electrode $36a_1$ and the first drain electrode $36b_1$ made of a metal. If a HfON film having W added thereto illustrated in FIG. 6 is used as each of the interfacial control oxide films 34a and 34b, a greater work function than the upper edge of the valence band of HfON can be achieved. Accordingly, the Schottky barrier at the interface can be made 1.1 eV (equivalent to the bandgap of Si) or greater in the channel-off state, and can be reduced to zero in the channel-on state. Thus, it is possible to form a p-MISFET that has smaller junction leakage in the off state, and maintains ohmic connections in the on state.

With a Si substrate being taken into consideration, the energy level of the interfacial control oxide films to be inserted should be 5.17 eV or greater in work function. Also, if the oxide films exhibit the electric conduction characteristics of a metal, the thin films may be regarded as (parts of) the metal source and drain. In this manner, it is possible to form a p-MISFET that has much higher contact resistance between the n-type Si channel and the metal source and drain in the off state, and has much lower contact resistance in the on state.

Figure 11:
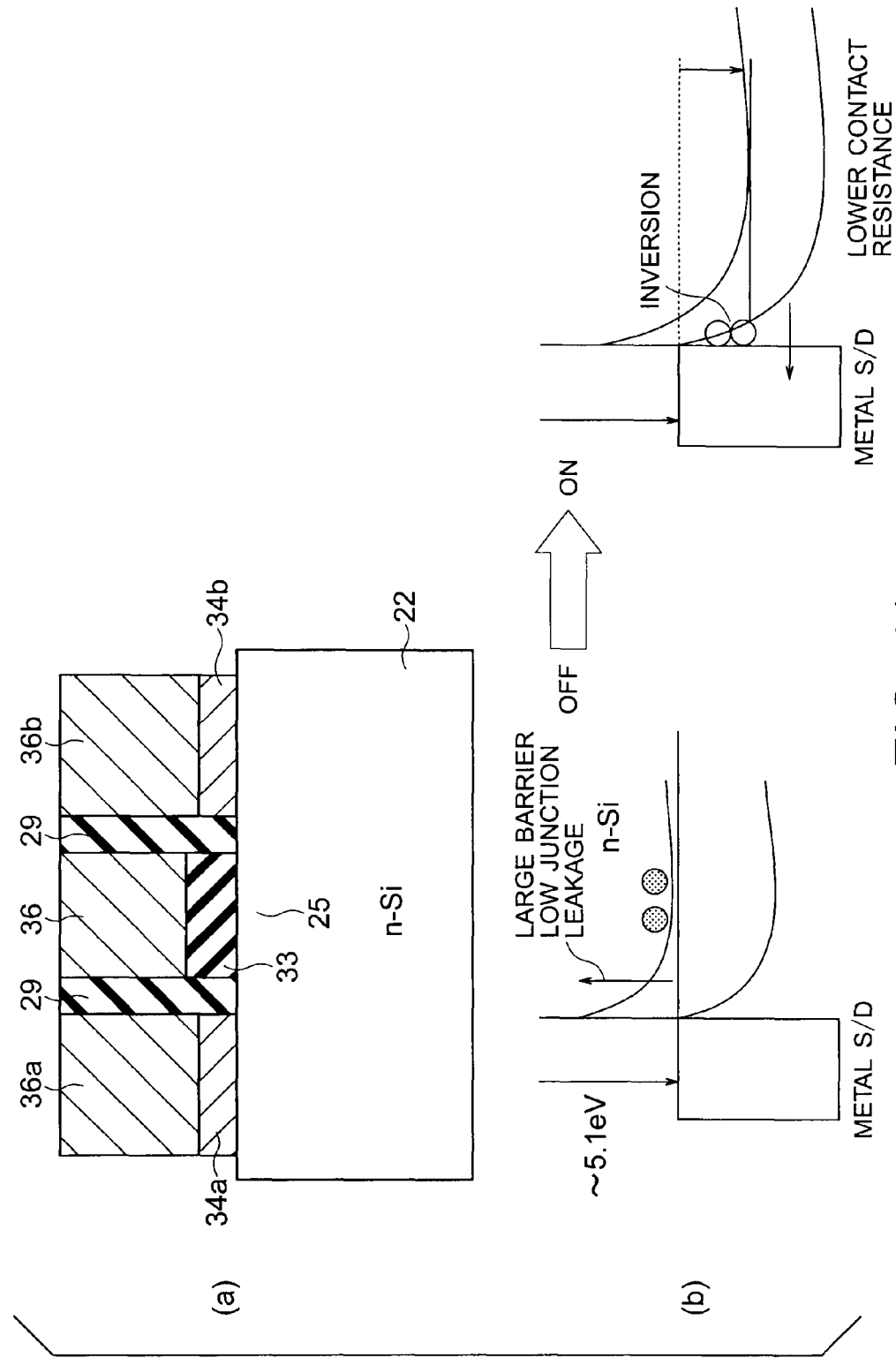
FIGS. 11(a) and 11(b) are diagrams showing a semiconductor device according to an embodiment.
Figure 12:
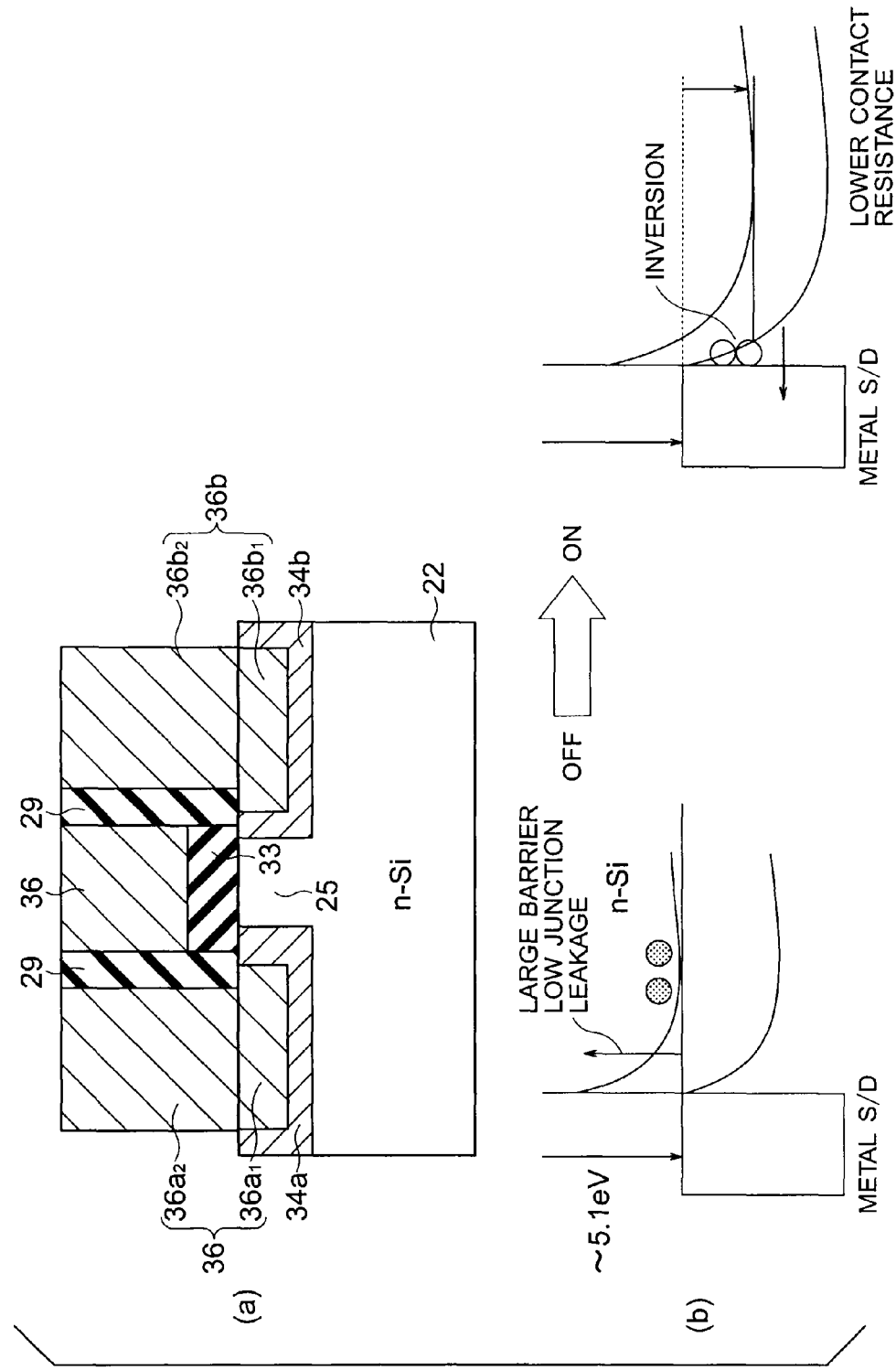
FIGS. 12(a) and 12(b) are diagrams showing a semiconductor device according to an embodiment.

Although not shown in the drawings, a second interfacial control oxide film may be inserted between the gate insulating film 33 and the gate electrode 36 in each of FIGS. 11 and 12, so as to optimize the work function of the gate electrode 36. The second interfacial control oxide film may have a different amount of additional material from the above interfacial control oxide films, and should normally be designed to have a smaller value (5.17 eV or smaller) than the top of the valence band of Si.

The above technique may be applied only to the n-MISFET or only to the p-MISFET, or may be applied to a CMIS structure.

Application to Memory Cell Structures

With one of the MISFETs being basic cells, the technique can be applied to a floating gate (FG) memory or a MONOS memory having a NAND string formed therein. Also, it is possible to apply the technique to a FG memory or a MONOS memory having a NOR structure. There is not a particular restriction on each of the films forming the basic cells of a FG memory or a MONOS memory. Although a silicon nitride film is normally used as the charge storage film in which the charge of the basic cells of a MONOS memory is to be stored, a $SrTiO_3$ film having Ru added thereto or the like may be used instead. Although a $SiO_2$ film is normally used as the tunneling film through which electrons are to tunnel, it is also possible to use a SiON film, or a stacked film formed with $SiO_2$, $Si_3N_4$, and $SiO_2$, or the like. In other words, a structure in accordance with an embodiment of the present invention is used so as to establish connections between the semiconductor channel and the metal source and drain regions of MISFET basic cells. Accordingly, in the channel-on state, the contact resistance at the connecting portions can be made much lower, and a memory that consumes less electricity can be realized. In the channel-off state, leakage can be prevented, and a memory that does not waste electricity can be achieved.

In a NOR-type structure, the metal source and drain regions of the basic cells are connected to the source and drain metals. In other words, a MISFET in accordance with an embodiment of the present invention can be used as it is, if the gate insulating film is formed with an insulating film, a charge storage film, and another insulating film. If the charge storage film is made of polysilicon, a FG memory is formed. If the charge storage film is formed as a trap insulating film that traps charges, a MONOS memory is formed. The essential aspect of this structure is that an oxide film in accordance with an embodiment of the present invention is inserted between the channel and the metal source and drain regions.

In a structure having a NAND string, the metal source and drain regions of the basic cells are not necessarily connected to the source and drain metals, and this technique should be applied only to appropriate parts. In other words, a MISFET in accordance with an embodiment of the present invention can be used as it is, if the gate insulating film is formed with an insulating film, a charge storage film, and another insulating film. If the charge storage film is made of polysilicon, a FG memory is formed. If the charge storage film is formed as a trap insulating film that traps charges, a MONOS memory is formed. The features of this structure are that an oxide in accordance with an embodiment of the present invention is inserted between the channel and the metal source and drain, and the metal source and drain regions are not necessarily connected to the source and drain metals.

Ge Substrate

At present, junction leakage is a serious problem in FETs using Ge substrates, because of small bandgaps. To counter this problem, an interfacial control oxide film having an effective work function of 4.0 eV or smaller is used in an n-MISFET, so that the barrier against holes in the off state can be made greater than the bandgap. For example, an interfacial control oxide film having an effective work function of 3.9 eV is used so as to realize a hole barrier of 0.76 eV (=0.66+0.1 eV), instead of a hole barrier of 0.66 eV (equivalent to the bandgap of Ge). The value of 0.1 eV is the difference between 3.9 eV and 4.0 eV, which is the value of the bottom of CB. This value can be made even larger by adjusting the work function.

Likewise, an interfacial control oxide film having an effective work function of 4.66 eV or greater is used in a p-MISFET, so that the barrier against electrons in the off state can be made greater than the bandgap. For example, an interfacial control oxide film having an effective work function of 5.0 eV is used so as to realize an electron barrier of 1.0 eV (=0.66+ 0.34 eV), instead of an electron barrier of 0.66 eV. The value of 0.34 eV is the difference between 5.0 eV and 4.66 eV, which is the value of the top of VB. This value can be made even larger by adjusting the work function. Conventional structures that cause large current leakage in the off state are not easy to use. However, with a structure in accordance with an embodiment of the present invention, the problem of large leakage in the off state can be readily solved.

Control on Interface between Metal and Dielectric Material in Metal/Dielectric Material/Metal Capacitor At the interface between a metal and a dielectric material, the barrier felt by the carriers of one side is often very low. For example, in a ferroelectric $Pb(Zr, Ti)O_3$ (PZT) capacitor of platinum Pt electrodes, or in Pt/PZT/Pt, the barriers against electrons is low, and the voltage resistance is low. Therefore, the leakage current is large, and it is difficult to maintain polarization after the power is turned off. This applies to all ferroelectric films such as a barium titanate $BaTiO_3$ (BTO) film and a bismuth strontium tantalate film (a $SrBi_2Ta_2O_9$ (SBT) film). Therefore, in a memory using a ferroelectric capacitor, it is necessary to increase the thickness of the dielectric film or the like, so as to maintain nonvolatility. As a result, enough polarization cannot be maintained, and high-voltage driving is performed. If a capacitor electrode having a sufficiently large effective work function can be formed here, leakage can be reduced, and the dielectric material can be made thinner. Thus, enough polarization can be achieved, and low-voltage driving can be performed.

The same goes for a capacitor that includes a high-dielectric film such as a $SrTiO_3$ (STO) film or a $Ta_2O_5$ film. At present, even if a large amount of charge is induced through voltage application, the power consumption becomes large, because of the large leakage. To counter this problem, an interfacial control oxide film is provided, so as to form a higher barrier to be felt by electrons. In this manner, the leakage can be reduced, even if the film thickness of the high-dielectric film is reduced. As the leakage becomes smaller, the dielectric material can be made thinner, and a sufficient amount of charge can be maintained. Furthermore, low-voltage driving can be performed.

When this technique is applied to a MIM structure, it is possible to apply this technique only to one side. Alternatively, a structure may be formed for each side with a different concept. For example, the electron barrier may be made higher on one side, and the hole barrier may be made higher on the other. Also, the structure of this embodiment may be applied only to one side, and is not applied to the other.

Generalization

An embodiment of the present invention is a technique related to control on the interface between a semiconductor and a metal. For example, it is a technique for controlling the junction between a metal and a various substrate such as a Si substrate, a Ge substrate, a GaAs substrate, a SOI (Silicon On Insulator) substrate, a GOI (Germanium On Insulator) substrate. This technique can be applied to various kinds of semiconductor devices. In the above description, MISFETs, FG memories, MONOS memories, and MIM capacitors have been described as examples. However, the embodiment can be applied to a semiconductor device, so that the characteristics of the semiconductor device can be improved by controlling the barrier at the interface between the semiconductor and the metal, and various effects can be expected. By lowering the barrier at the interface or reducing the barrier to zero (forming an ohmic connection), the interfacial contact resistance can be made lower. On the other hand, by expanding the barrier, the junction leakage can be reduced, and the leakage current of a capacitor can be made smaller. Also, in a MISFET that has source and drain metal electrodes connected to the channel region, the barrier can be made lower or higher, depending on the on/off state of the channel.

The technique in accordance with this embodiment is not limited by the structure of the subject semiconductor device. For example, the technique in accordance with this embodiment can be applied not only to a flat-type MISFET, but also to a FIN transistor, a tri-gate transistor, a round-gate transistor, or a vertical transistor. The technique can also be applied to a memory cell formed by incorporating a FG or charge storing structure into such a transistor structure. The capacitor structure is not necessarily of a flat type, and may be of a trench type, a crown type, or the like.

Amount of High-Valency Material to be Added

Next, the amount of high-valency material to be added to each interfacial control oxide film used in an embodiment of the present invention is described.

Figure 13:
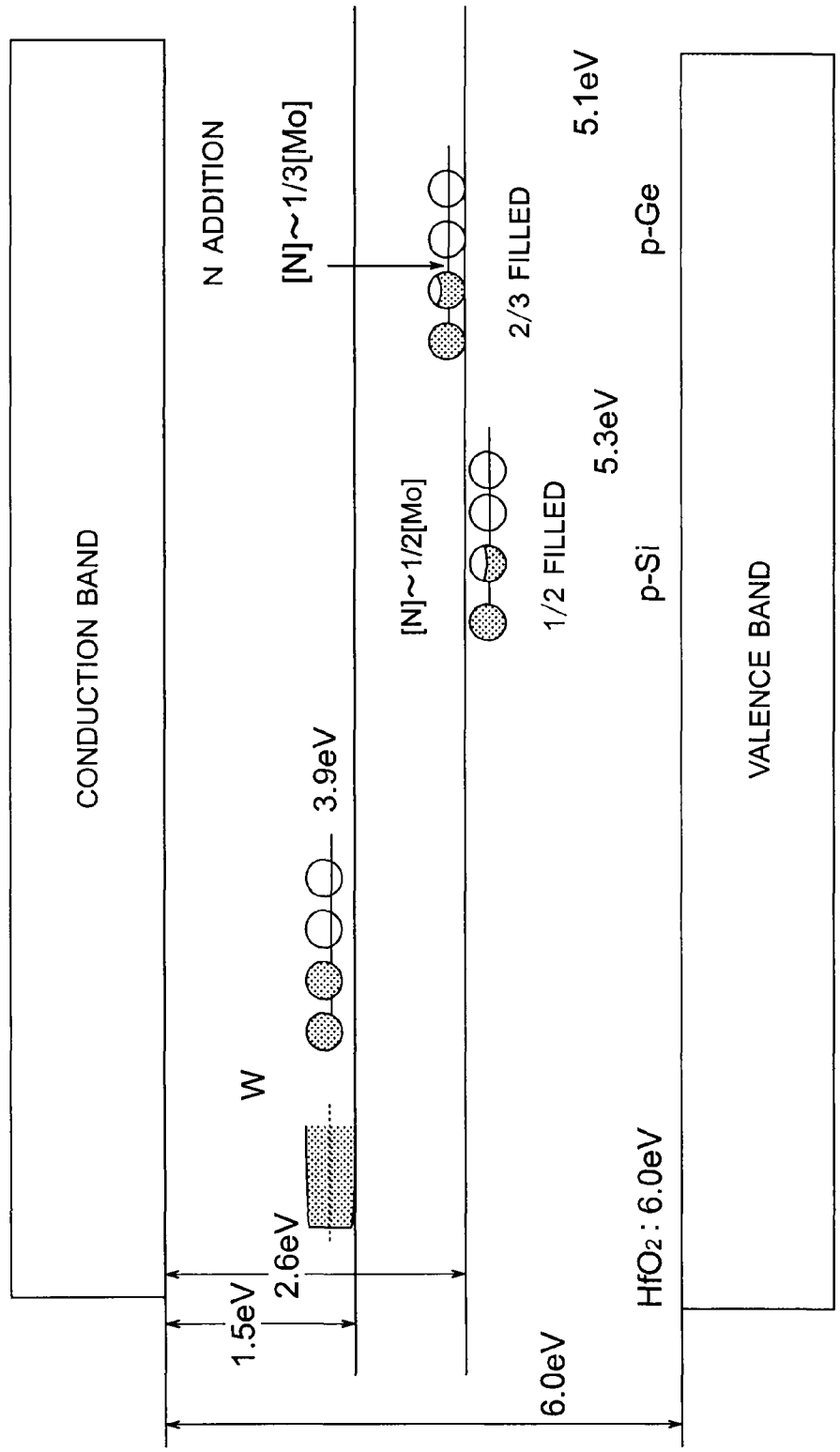
FIG. 13 is a diagram for explaining a level that is generated in the gap when a Type-A element is added to $HfO_2$.

First, the conditions for metallization in a case where an additional material is introduced are described. Where a represents the lattice constant, an interaction is caused between additional materials when one or more additional materials are introduced into a 2a×2a×2a unit. In this manner, $HfO_2$, which is originally an insulating material, obtains metallic properties. Converted into area density, it is $1\times10^{14}$ atoms/$cm^2$. With the band structure being taken into consideration, the level in the gap has a width, and a narrow and small dispersive band is generated in the gap, as shown in FIG. 13. Since more than two atoms cannot be added to an area of a×a, and the area of a×a is $25\times10^{-16}$ $cm^2$, more than two atoms/$(25\times10^{-16}$ $cm^2)$, or more than $8\times10^{14}$ atoms/$cm^2$, cannot be added in terms of area density. Therefore, two atoms/$(25\times10^{-16}$ $cm^2)$ or $8\times10^{14}$ atoms/$cm^2$ is the maximum value. Even if $8\times10^{14}$ atoms/$cm^2$ or more is added, the excess amount is simply precipitated. When the area density of the additional material is in the range of $1\times10^{14}$ atoms/$cm^2$ to $8\times10^{14}$ atoms/$cm^2$, a metallic level appears in the gap. This oxide film can turn into a metal, or can function as a thin film that serves as an interfacial control oxide film and a metal film. If the thin metal film is inserted into the interface between the semiconductor and the metal, the thin metal film becomes an interfacial control oxide film having an interfacial state introduced thereinto, and can have a work function pinned at the Fermi level of the interfacial control oxide film.

If the oxide film for controlling the interface is a thin film, metallization of the oxide film is not necessary. To achieve a sufficient pinning effect to perform the pinning at the Fermi level, one state should exist in an area of 8a×8a. Therefore, $6 \times 10^{12}$ atoms/cm$^2$ or more is required. In this case, if the physical film thickness of the HfO$_2$ film becomes larger than 2 nm, the hopping resistance becomes higher. Accordingly, in a case where metallization is not performed, a film thickness of 2 nm or smaller is appropriate. If one or more additional materials are introduced into an area of 2a×2a, metallization is performed, or hopping conduction becomes possible. Accordingly, restrictions on the film thickness are lifted. In other words, when the area density of the additional material is $1 \times 10^{14}$ atoms/cm$^2$ or greater, restrictions on the film thickness are lifted.

When the area density of the additional material is in the range of $6 \times 10^{12}$ atoms/cm$^2$ to $1 \times 10^{14}$ atoms/cm$^2$, a level appears in the gap, but the oxide film does not exhibit metallic properties and becomes a film with hopping conduction. However, it is considered that the oxide film has much lower resistance than a tunnel insulating film having no additional materials added thereto. This is because the wave function spread is sufficiently large, and hopping conduction is valid, as a film that has a large dielectric constant and does not have a very wide bandgap is used as the base material of the interfacial control oxide film. It should be noted here that there is a correlation between a large dielectric constant and a narrow bandgap. For example, SiO$_2$ with a small dielectric constant has a wide bandgap, and HfO$_2$ with a large dielectric constant has a narrow gap. If a thin oxide film having a state in the gap is inserted into the interface between a semiconductor and a metal, the oxide film serves as an interfacial control oxide film having an interfacial state introduced thereinto, and the work function can be pinned at the Fermi energy of the interfacial control oxide film.

Supply of Electrons into Level in Gap with Ta, F, and H

As described above, by adding a high-valency material, a level can be formed in the bandgap. However, the level in the gap does not always appear at an optimum position. To counter this problem, the inventors developed a method for artificially moving the level up and down. When excess electrons are introduced into a level in a gap, the electron correlation energy becomes greater, and the level is elevated. When electrons are introduced, it is possible to introduce a material such as Ta, which carries more excess electrons than Hf, and forms a conduction band when Hf is substituted. Alternatively, a material that receives fewer electrons than oxygen is substituted by oxygen, so as to leave excess electrons. As a result, electrons are introduced into the level in the gap. Examples of such materials include F and H. The easiest material for the introduction is H (hydrogen). For example, through exposure to low-temperature plasma hydrogen or excited hydrogen, atomic hydrogen can be obtained.

Atomic hydrogen (H) is normally incorporated into an oxide through oxygen defects and the likes. In an embodiment of the present invention, however, there are few oxygen defects, and hydrogen introduction through oxygen defects does not occur. In the embodiment of the present invention, a high-valency material forms a level in the gap, and electrons are released into the level, so that the lattice-point hydrogen can be stabilized. Accordingly, hydrogen is incorporated into the oxide film having the high-valency material added thereto. In this manner, hydrogen is incorporated into the oxide film having the high-valency material added thereto, but is not incorporated into other components such as the gate insulating film in this embodiment.

Conventional FGA (Forming Gas Anneal) or H$_2$ gas anneal is also described. At the time of FGA, hydrogen is hardly incorporated into the gate insulating film and the oxide film having a high-valency material added thereto in the embodiment of the present invention. This is because H$_2$ is stable as molecules, and cannot be incorporated into a normal oxide film. This is also because there is no energy gain sufficient for dissociating hydrogen molecules, though electrons can be released into the added high-valency material.

Electron Emission from Level in Gap with N, B, C, Mg, Ca, Sr, Ba, Al, Sc, Y, La, Ce, Pr, Nd, Pm, Sm, Eu, Gd, Tb, Dy, Ho, Er, Tm, Yb, and Lu On the other hand, when electrons are emitted from the level, the electron correlation energy decreases, and the level becomes lower accordingly. To emit electrons from the level, it is necessary to establish a situation where the valence band receives electrons. In the case of Hf, four electrons are emitted. If electron emission is smaller than the electron emission in the case of Hf, there is an electron shortage. In such a case, electrons are emitted from the level in the gap. Trivalent and bivalent materials satisfy this requirement. More specifically, the materials that satisfy this requirement are Mg, Ca, Sr, Ba, Al, Sc, Y, La, Ce, Pr, Nd, Pm, Sm, Eu, Gd, Tb, Dy, Ho, Er, Tm, Yb, and Lu. Alternatively, a material that receives more excess electrons than oxygen is substituted by oxygen. As a result, electrons are obtained from the level in the gap. Such materials are N, C, and B.

Referring now to FIG. 5, FIG. 6, and FIGS. 13 to 15, the optimum value of an effective work function is described. An embodiment of the present invention concerns a technique of designing an interfacial control oxide film that has an optimum work function for the junctions between the semiconductor source and drain regions and the source and drain metal electrodes of an n-MISFET and a p-MISFET, and has a narrow band in the gap (or a hopping level).

This technique can be used as a technique of controlling the barriers against carriers at the junctions between a semiconductor channel and metal source and drain, a technique of controlling the barriers against carriers in a MIM capacitor, and the likes. It should be noted here that the metal source and drain are connected directly to the semiconductor channel. More specifically, an n-MISFET is to be connected to a p-type, and a p-MISFET is to be connected to an n-type. In the off state, leakage current should be reduced. In an n-MISFET, an interfacial control oxide film having a smaller work function than an n-type band edge should be used. In a p-MISFET, an interfacial control oxide film having a greater work function than a p-type band edge should be used. As a result, in the on state, carriers flow in an ohmic fashion. In the off state, the leakage current is properly restricted. In a MIM capacitor, it is essential that the barriers against carriers are made taller so as to restrict leakage current. Basically, Fermi level pinning near the center of the gap is effective in making the electron and hole barriers taller. In some cases, specific arrangement might become necessary. For example, the barrier against electrons should be made taller.

As shown in FIG. 5, when a high-valency material is added to HfO$_2$, a level appears in the gap of HfO$_2$. A case where the energy position appears above the lower edge (the bottom) (=4.05 eV) of the conduction band of Si (where the work function is small) is categorized as Type-A. A case where the energy position appears in the gap of Si is categorized as Type-B. A case where the energy position appears below the upper edge (the top) of the valence band of Si (where the work function is large) is categorized as Type-C. Coincidentally, the same categories can be set for Ge. The same illustrations as those in FIGS. 16, 17, and 18 can be obtained, except that the lower edge of the conduction band of Ge is 4.00 eV, and the upper edge of the valence band of Ge is 4.66 eV.

Figure 14:
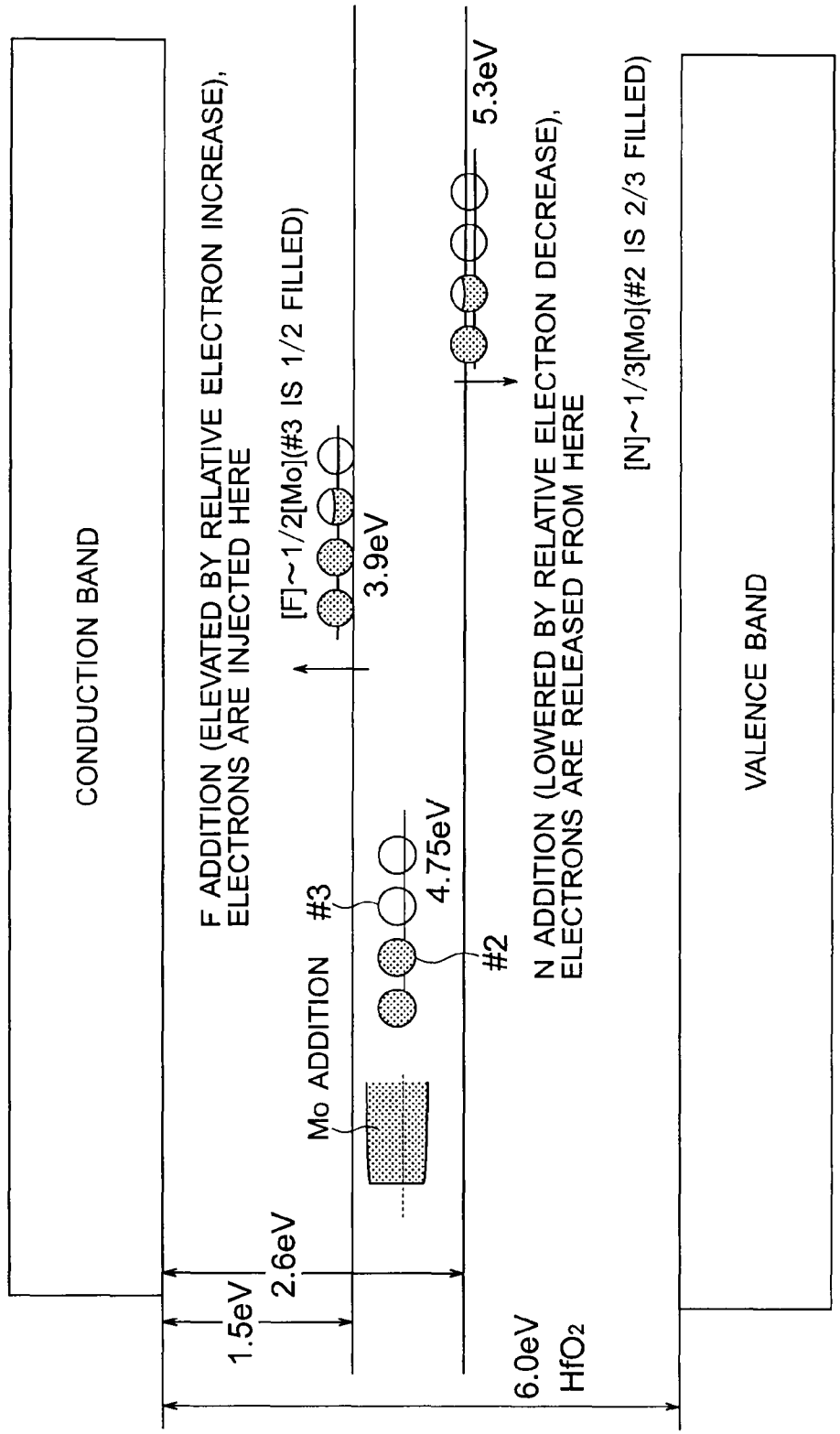
FIG. 14 is a diagram for explaining a level that is generated in the gap when a Type-B element is added to $HfO_2$.
Figure 15:
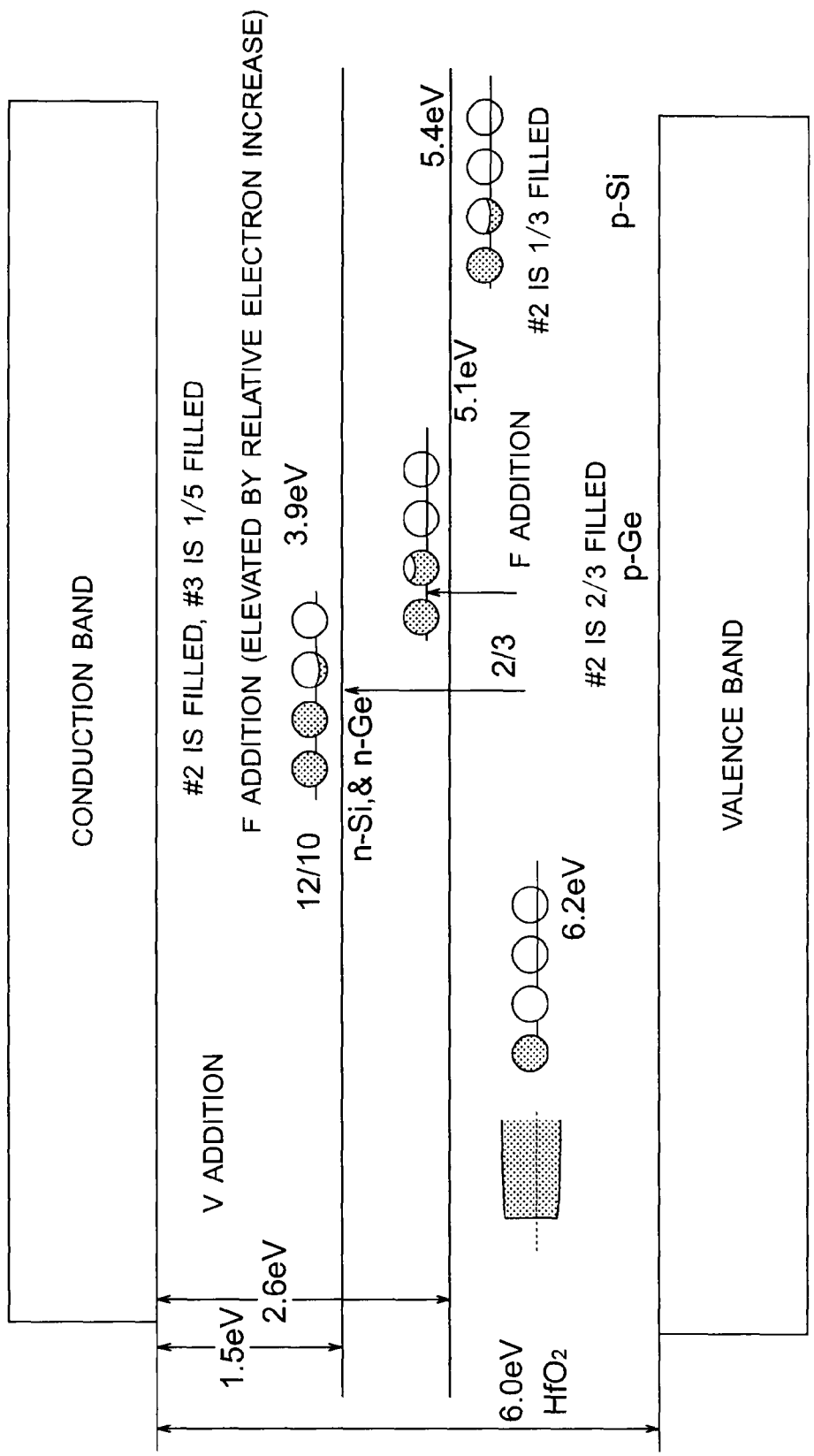
FIG. 15 is a diagram for explaining a level that is generated in the gap when a Type-C element is added to $HfO_2$.

FIGS. 13, 14, and 15 illustrate an example of Type-A, an example of Type-B, and an example of Type-C, respectively. Type-A is an example case where W is added. Type-B is an example case where Mo is added. Type-C is an example case where V is added.

Type-B

Referring to FIG. 14, Type-B where Mo is added to a $HfO_2$ (or $ZrO_2$, Hf silicate, or Zr silicate) dielectric oxide is briefly described. The band offset between $HfO_2$ and Si is approximately 1.5 eV on the conduction band side. Since the bandgap of Si is 1.1 eV, and the bandgap of $HfO_2$ is 6.0 eV, the band offset between $HfO_2$ and Si is 3.4 eV (=6.0−(1.5+1.1)) on the valence band side. When Mo is added to $HfO_2$, oxygen is coordinated around the Mo added to $HfO_2$. At this point, the level in the gap is formed with d electrons of the added material, and has doubly-degenerated $dz^2$ orbit and $dx^2-y^2$ orbit. On this orbit, up to four electrons per added material can be buried. The difference between the number of electrons in the outermost shell of the added material Mo and the number (4) of electrons in the outermost shell of Hf is the number of electrons contained in the level in the gap. For example, six electrons exist in the outermost shell of Mo. Four of them are handed on to $HfO_2$, but two (=6−4) electrons become excess electrons. Those excess electrons are accommodated in the level of Mo that appears in the gap of $HfO_2$. That is, level in the gap originated from Mo appears in the bandgap of $HfO_2$. This level in the gap forms a narrow band through a Mo interaction. In this manner, a metal oxide (a metal oxide of $HfO_2$ having Mo added thereto) can be generated by adding Mo to $HfO_2$. Determined by the level appearing in the gap, the work function becomes approximately 4.75 eV.

When nitrogen is further introduced, electrons can be emitted from the level formed by Mo. As nitrogen is introduced, oxygen is substituted. Since nitrogen can receive more electrons than oxygen, nitrogen receives electrons from Mo, and the film is stabilized. As a result, the number of electrons in the level formed by Mo decreases. As the number of electrons decreases, the interaction among electrons becomes smaller, and the level becomes lower. As can be seen from FIG. 14, when one nitrogen atom is introduced for three Mo atoms (approximately ⅔ of the second state is filled), a metal oxide having a work function in the neighborhood of 5.3 eV is generated. It becomes clear that the work function can be controlled by adjusting the nitrogen amount. Accordingly, a junction with low contact resistance can be obtained between p-type Si and a metal. For example, this technique is effective for junctions between the semiconductor source and drain made of p-type Si (semiconductor source and drain regions of a p-MISFET) and source and drain metal electrodes (FIGS. 8(a) and 8(b)). This technique is also effective for interface of junctions between an n-type Si channel and metal source and drain (a p-MISFET having the metal source and drain) (FIGS. 11(a) and 11(b), and FIGS. 12(a) and 12(b)).

Since nitrogen receives electrons, nitrogen is called an electron receptor material in this specification. Other than nitrogen, there are more electron receptor materials. Carbon (C) and boron (B) have the same characteristics as the characteristics of materials that substitute oxygen. In an embodiment of the present invention, an oxide of Hf or Zr is considered to exhibit the same characteristics, if Hf or Zr is substituted by Mg, Ca, Sr, Ba, Al, Sc, Y, La, or a lanthanoid (Ce, Pr, Nd, Pm, Sm, Eu, Gd, Tb, Dy, Ho, Er, Tm, Yb, or Lu). Having a small valence number, and emitting fewer electrons than Hf and Zr, oxygen can receive electrons from another element (Mo in the case illustrated in FIG. 14).

In the above described case of simultaneous addition of Mo and N, it is possible to obtain junctions between semiconductor source and drain made of p-type Si (the semiconductor source and drain regions of a p-MISFET) and source and drain metal electrodes, or junctions between an n-type Si channel and metal source and drain (a p-MISFET having the metal source and drain). Although example cases where the substrate is made of Si have been described above, the concept explained above can be applied to other semiconductor substrates. The only difference is that the optimum work function has various values. For example, in the case of the interface between a metal and source and drain regions of p-type Si, the structure is designed so that the work function becomes 5.17 eV or greater. In the case of the interface between a metal and source and drain regions of p-type Ge, the structure is designed so that the work function becomes 4.66 eV or greater. In this manner, the optimum value of the work function varies. The same applies to n-type semiconductors.

Next, a case where fluorine (F) is introduced as an additional material, instead of N, is described. In this case, electrons are injected into the level in the gap, so as to elevate the level. Accordingly, an interfacial control oxide film having an optimum work function for junctions with the source and drain regions of n-type Si can be designed. As fluorine is introduced, oxygen is substituted. Since fluorine cannot receive more electrons than oxygen, the electrons emitted from Hf become excess electrons. The excess electrons are transferred into the level in the gap formed by Mo, so that the film is stabilized. As a result, the number of electrons in the level formed by Mo increases, and the level is elevated. As can be seen from FIG. 14, when one fluorine atom is introduced for two Mo atoms (approximately ½ of the third state is filled), a metal oxide having a work function in the neighborhood of 3.9 eV is generated. Accordingly, it becomes clear that the work function can be controlled by adjusting the fluorine amount.

Since fluorine emits electrons, fluorine is called an electron emission material. There are not many other electron emission materials. The most effective material is fluorine. Introduction is the easiest with hydrogen. For example, hydrogen can be introduced by leaving $HfO_2$ in low-temperature plasma hydrogen. In an embodiment of the present invention, an oxide of Hf or Zr is considered to exhibit the same characteristics as above, if Hf or Zr is substituted by Ta. This is because Ta has a large valence number, and can emit more excess electrons than Hf and Zr. Accordingly, electron emission materials are considered to be fluorine, hydrogen, and Ta.

In Type-B illustrated in FIG. 14, a level appears in the Si gap, as a metal is added. To shift this level upward, electrons should be introduced by adding F or the like. To shift the level downward, on the other hand, electrons should be pulled out by adding N or the like. Here, it is also possible to form a HfON film having Mo added thereto as an initial film, instead of a $HfO_2$ film having Mo added thereto. By forming a film having the level of the added material (Mo) shifted downward, an interfacial control oxide film suitable for connecting source and drain regions of p-type Si to source and drain metal electrodes is achieved. F or the like is then added to the interfacial control oxide film, so as to form a film suitable for connecting source and drain regions of n-type Si to source and drain metal electrodes. In this case, excess electrons are introduced by the amount of the downward shift in the initial film (the amount of increase in work function). On the other hand, it is also possible to form a HfOF film having Mo added thereto as an initial film, so as to obtain an interfacial control oxide film suitable for connecting source and drain regions of n-type Si to source and drain metal electrodes. N or the like is then added to the interfacial control oxide film, so as to form an interfacial control oxide film suitable for connecting source and drain regions of p-type Si to source and drain metal electrodes. In this case, excess electrons are pulled out by the amount of the upward shift in the initial film (the amount of decrease in work function). In this manner, it is possible to develop the process for forming both an n-MISFET and a p-MISFET (a CMIS structure).

Type-A

Referring now to FIG. 13, Type-A where tungsten (W) is added to $HfO_2$ is described. In Type-A, when tungsten (W) is added to $HfO_2$, a level appears in the gap, and a W interaction forms a narrow band in the gap. Determined by the level that appears, the work function becomes approximately 3.9 eV. This work function can be used for junctions with source and drain regions of n-type Si or source and drain regions of n-type Ge. It is of course possible to further reduce the work function by introducing F, H, Ta, or the like. The use of an interfacial control oxide film having a small work function for connecting a p-type semiconductor channel to metal source and drain has the advantage that the off leakage (junction leakage) can be reduced.

When nitrogen is further introduced, electrons can be emitted from the level formed by W. As a result, the number of electrons in the level formed by W decreases, and the level becomes lower accordingly. As can be seen from FIG. 13, when one nitrogen atom is introduced for two W atoms (approximately ½ of the second state is filled), a metal oxide having a work function in the neighborhood of 5.3 eV is generated, and the metal oxide turns into an interfacial control oxide film for connecting source and drain regions of p-type Si to metal electrodes. When one nitrogen atom is introduced for three W atoms (approximately ⅔ of the second state is filled), a metal oxide having a work function in the neighborhood of 5.1 eV is generated, and the metal oxide turns into an interfacial control oxide film for connecting source and drain regions of p-type Ge to metal electrodes. Accordingly, the work function can be controlled by adjusting the nitrogen amount, and an optimum work function can be selected, depending on the type of the semiconductor. The use of an interfacial control oxide film having a large work function for connecting an n-type semiconductor channel to metal source and drain has the advantage that the off leakage (junction leakage) can be reduced.

Type-C

Referring now to FIG. 15, Type-C where vanadium (V) is added to $HfO_2$ is described. In Type-C, when vanadium (V) is added to $HfO_2$, a level appears in the gap, and a V interaction forms a narrow band in the gap, as shown in FIG. 15. Determined by the level that appears, the work function becomes approximately 6.2 eV. When fluorine is further introduced, electrons can be introduced into the level formed by V. As a result, the number of electrons in the level formed by V increases, and the level becomes higher accordingly. As can be seen from FIG. 15, when one fluorine atom is introduced for three V atoms (approximately ⅓ of the second state is filled), a metal oxide having a work function in the neighborhood of 5.4 eV is generated, and the metal oxide turns into an interfacial control oxide film to be used for connecting source and drain regions of p-type Si to source and drain metal electrodes. When two fluorine atoms are introduced for three V atoms (approximately ⅔ of the second state is filled), a metal oxide having a work function in the neighborhood of 5.1 eV is generated, and the metal oxide turns into an interfacial control oxide film to be used for connecting source and drain regions of p-type Ge to source and drain metal electrodes. Further, when twelve fluorine atoms are introduced for ten V atoms (the second state is filled, and ⅕ of the third state is also filled), a metal oxide having a work function in the neighborhood of 3.9 eV is generated, and the metal oxide turns into an interfacial control oxide film to be used for connecting source and drain regions of n-type Si to source and drain metal electrodes, or an interfacial control oxide film to be used for connecting source and drain regions of n-type Ge to source and drain metal electrodes. Accordingly, it becomes clear that the work function can be controlled by adjusting the fluorine amount. The use of an interfacial control oxide film having a large work function for connecting an n-type semiconductor channel to metal source and drain has the advantage that the off leakage (junction leakage) can be reduced. Also, the use of an interfacial control oxide film having a small work function for connecting a p-type semiconductor channel to metal source and drain has the advantage that the off leakage (junction leakage) can be reduced.

Figure 16:
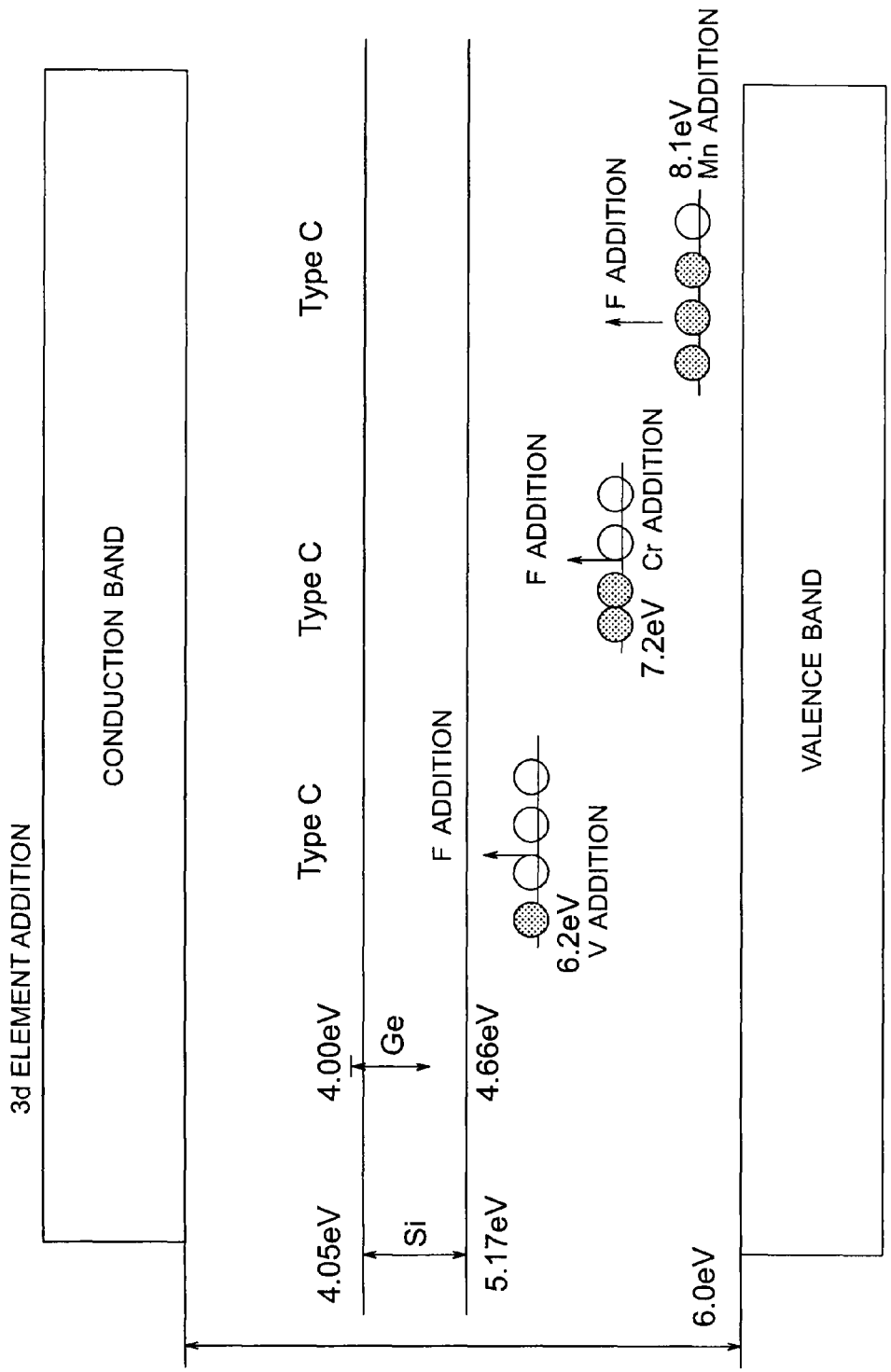
FIG. 16 is a diagram for explaining levels that are generated in the gap when 3d elements are added to $HfO_2$.
Figure 17:
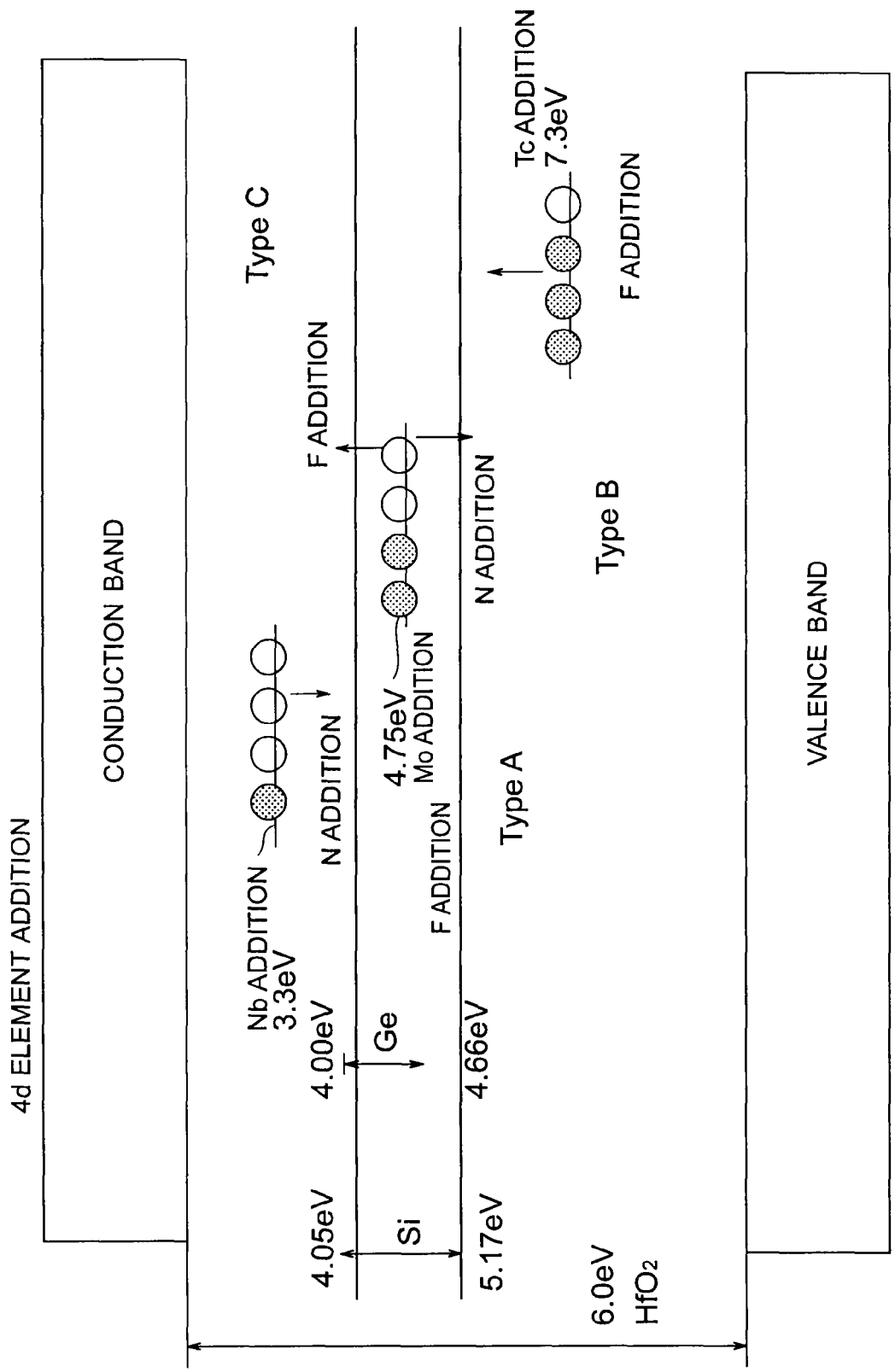
FIG. 17 is a diagram for explaining levels that are generated in the gap when 4d elements are added to $HfO_2$.
Figure 18:
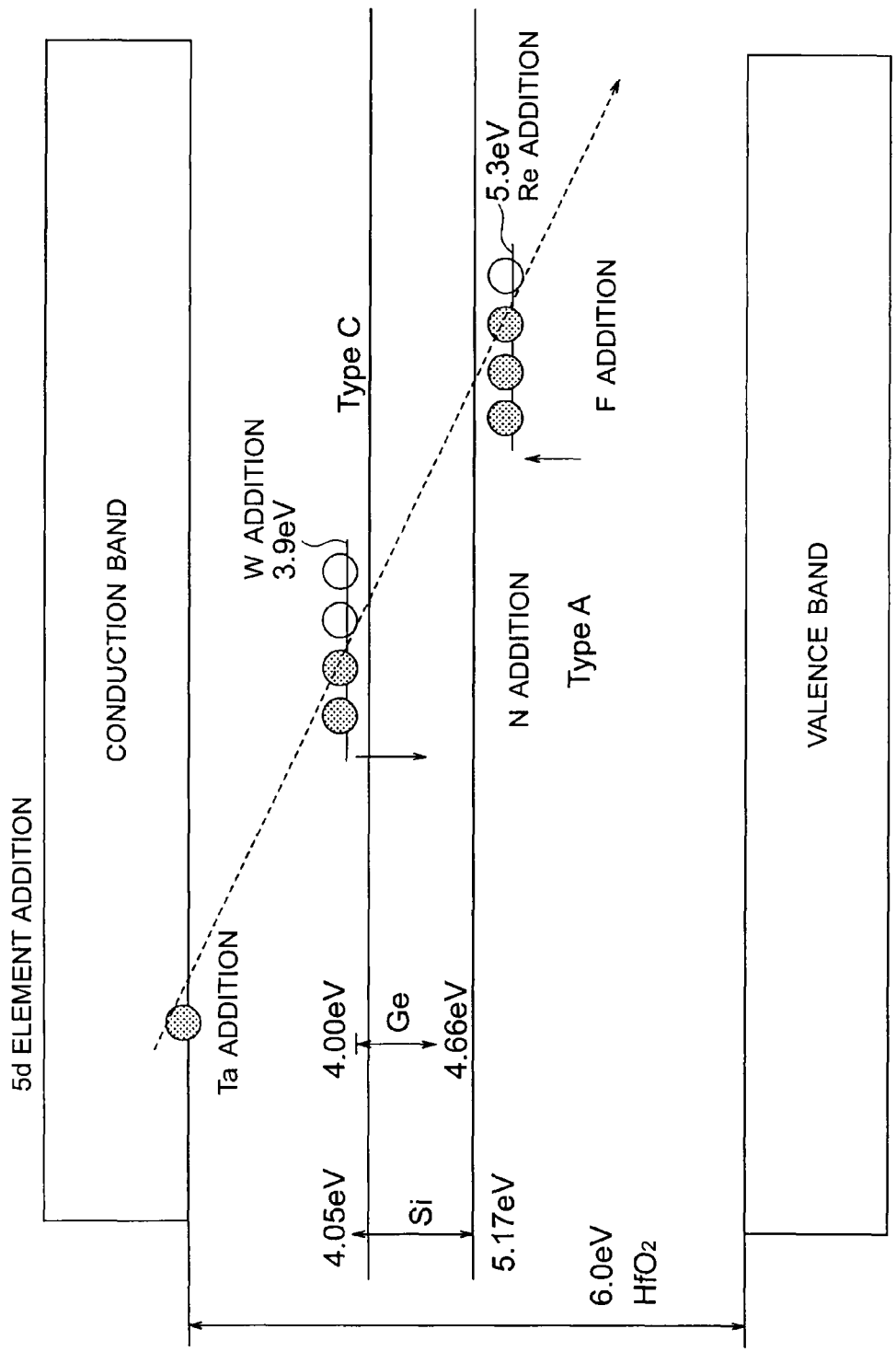
FIG. 18 is a diagram for explaining levels that are generated in the gap when 5d elements are added to $HfO_2$.

FIGS. 16, 17, and 18 show the levels in the gap formed in cases where 3d elements introduced into $HfO_2$, the levels in the gap formed in cases where 4d elements are introduced into $HfO_2$, and the levels in the gap formed in cases where 5d elements are introduced into $HfO_2$. Those levels are the results of calculations performed according to the first-principles calculation. The same results are obtained from calculations performed with respect to $ZrO_2$. The first-principles calculation is based on the density functional approach, and concerns calculations for local density approximations. The potentials used here are ultrasoft pseudopotentials. The potentials of materials such as Hf, O, N, and F used in the calculations have already been used in various forms, and have high reliability. For example, the lattice constant of $HfO_2$ ($a_0$=9.55 Bohr=5.052 Å) obtained through the calculation is shorter than an experimental value (9.603 Bohr=5.08 Å) only by 0.55%, and can be regarded as an appropriate value.

FIG. 16 illustrates cases where V, Cr, and Mn are added as 3d elements into $HfO_2$. All the cases where a 3d element is added to $HfO_2$ are of Type-C, and an appropriate effective work function cannot be obtained by adding only a 3d element. When V, Cr, and Mn are added, levels appear at 6.2 eV, 7.2 eV, and 8.1 eV, respectively. To obtain an appropriate effective work function, it is necessary to add an element such as F and inject electrons.

FIG. 17 illustrates cases where Nb, Mo, and Tc are added as 4d elements into $HfO_2$. The case where Nb is added is of Type-A, and to obtain a large effective work function in this case, it is necessary to add an element such as N and pull out electrons. If a small work function is sufficient, there is not need to perform anything, and the small work function can be used as it is. The case where Mo is added is of Type-B, and to obtain an appropriate effective work function in this case, it is necessary to add an element such as F or N. The case where Tc is added is of Type-C, and to obtain a small effective work function in this case, it is necessary to add an element such as F and inject electrons. When Nb, Mo, and Tc are added, levels appear at 3.3 eV, 4.75 eV, and 7.3 eV, respectively.

FIG. 18 illustrates cases where Ta, W, and Re are added as 5d elements into $HfO_2$. In the case where Ta is added, the level exists in the conduction band of $HfO_2$. Accordingly, Ta can be regarded as an electron donation material. The case where W is added is of Type-A, and to obtain a large effective work function in this case, it is necessary to add an element such as N and emit electrons. The case where Re is added is of Type-C, and to obtain a small effective work function in this case, it is necessary to add an element such as F and inject electrons. When W and Re are added, levels appear at 3.9 eV and 5.3 eV, respectively.

Silicate

Figure 19:
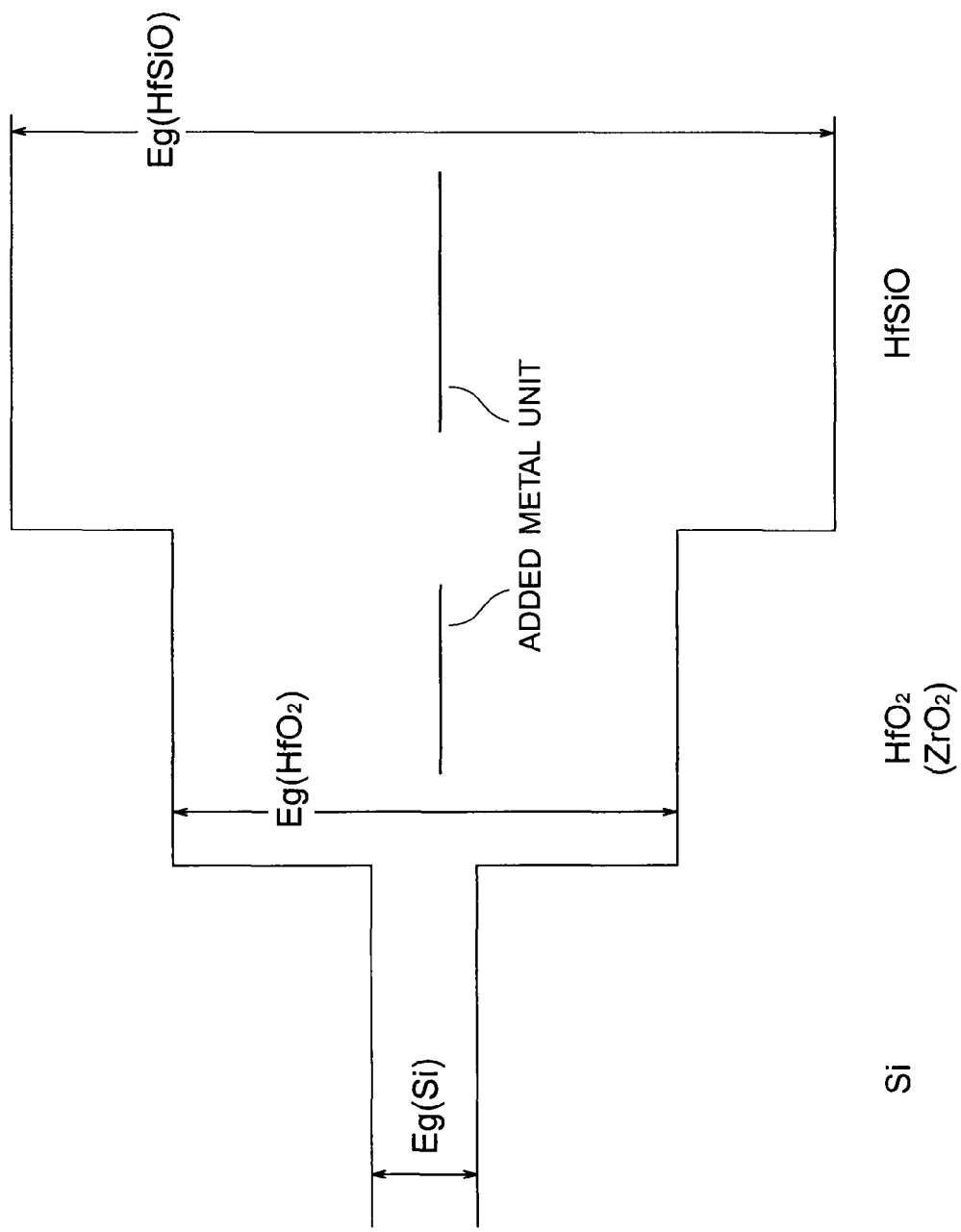
FIG. 19 is a diagram showing the positional relationships among the band offsets of a Si substrate, a $HfO_2$ film, and a HfSiO film.

As shown in FIG. 19, the same relationship as above is observed between silicate and the gap position of Si. More specifically, with silicate, an interaction between Si and oxygen is added. As a result, the bottom of the conduction band of $HfO_2$ (or $ZrO_2$) is elevated, and the top of the valence band becomes lower. However, there is not a change in the positional relationship between Si and the level in the gap formed by adding a metal. In FIG. 19, Eg(Si) represents the energy gap of Si, Eg($HfO_2$) represents the energy gap of $HfO_2$, and Eg(HfSiO) represents the energy gap of HfSiO.

In $HfO_2$ (or $ZrO_2$) and each silicate, the effective work function is set at 4.05 eV or smaller for connecting source and drain regions of n-type Si to source and drain metal electrodes, and the effective work function is set at 5.17 eV or greater for connecting source and drain regions of p-type Si to source and drain metal electrodes. In doing so, the effective work function can be adjusted by emitting electrons (through the addition of N or the like) or inject electrons (through the addition of F or the like). The same applies to Ge or other semiconductors.

In a MISFET that has metal source and drain, the effective work function is set at 5.17 eV or greater for connecting the metal source and drain to an n-type channel region, and the effective work function is set at 4.05 eV or smaller for connecting the metal source and drain to a p-type channel region.

Figure 20:
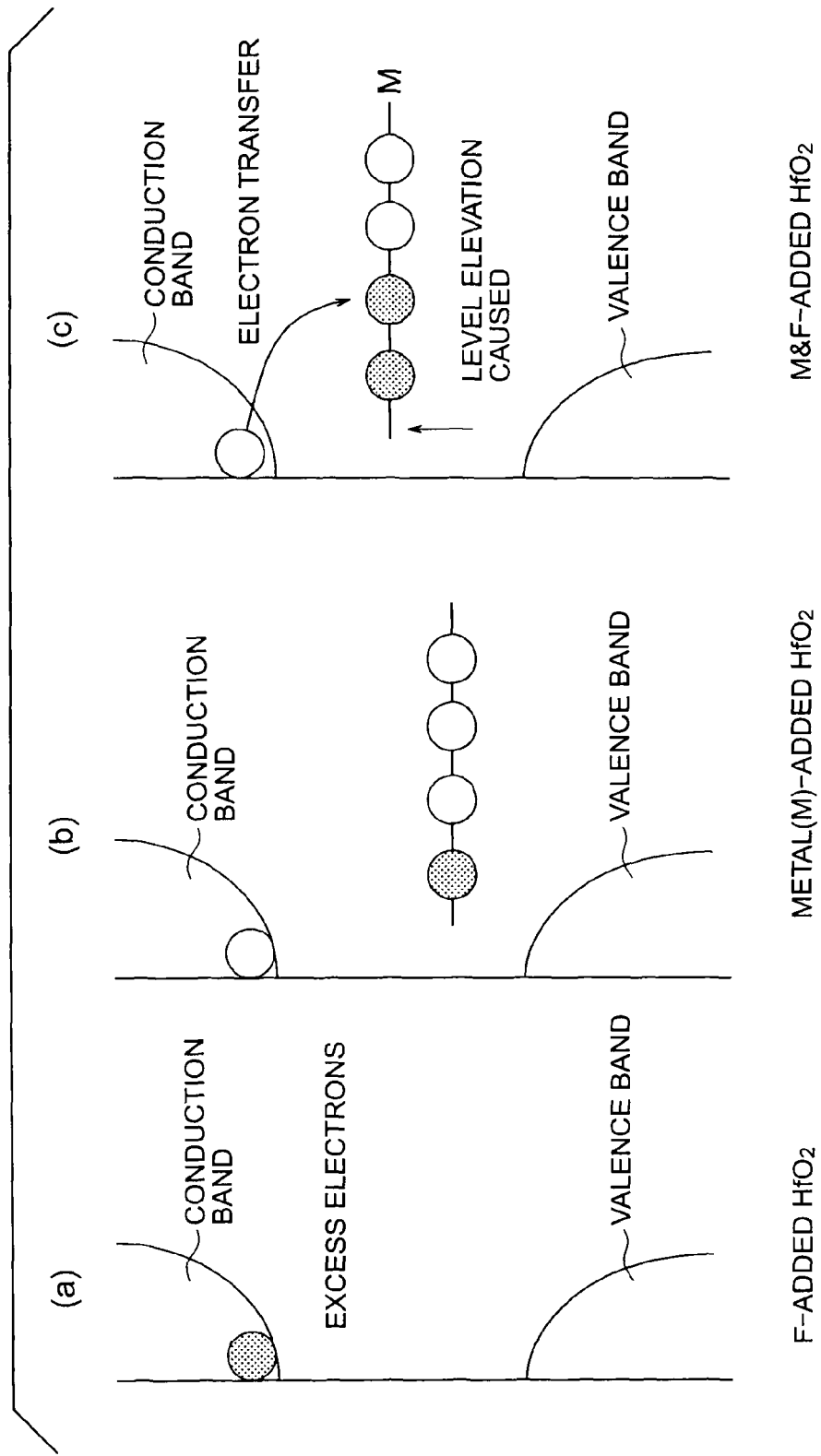
FIGS. 20(a) to 20(c) are diagrams for explaining a situation where the addition of F is facilitated by adding a metal to $HfO_2$.
Figure 21:
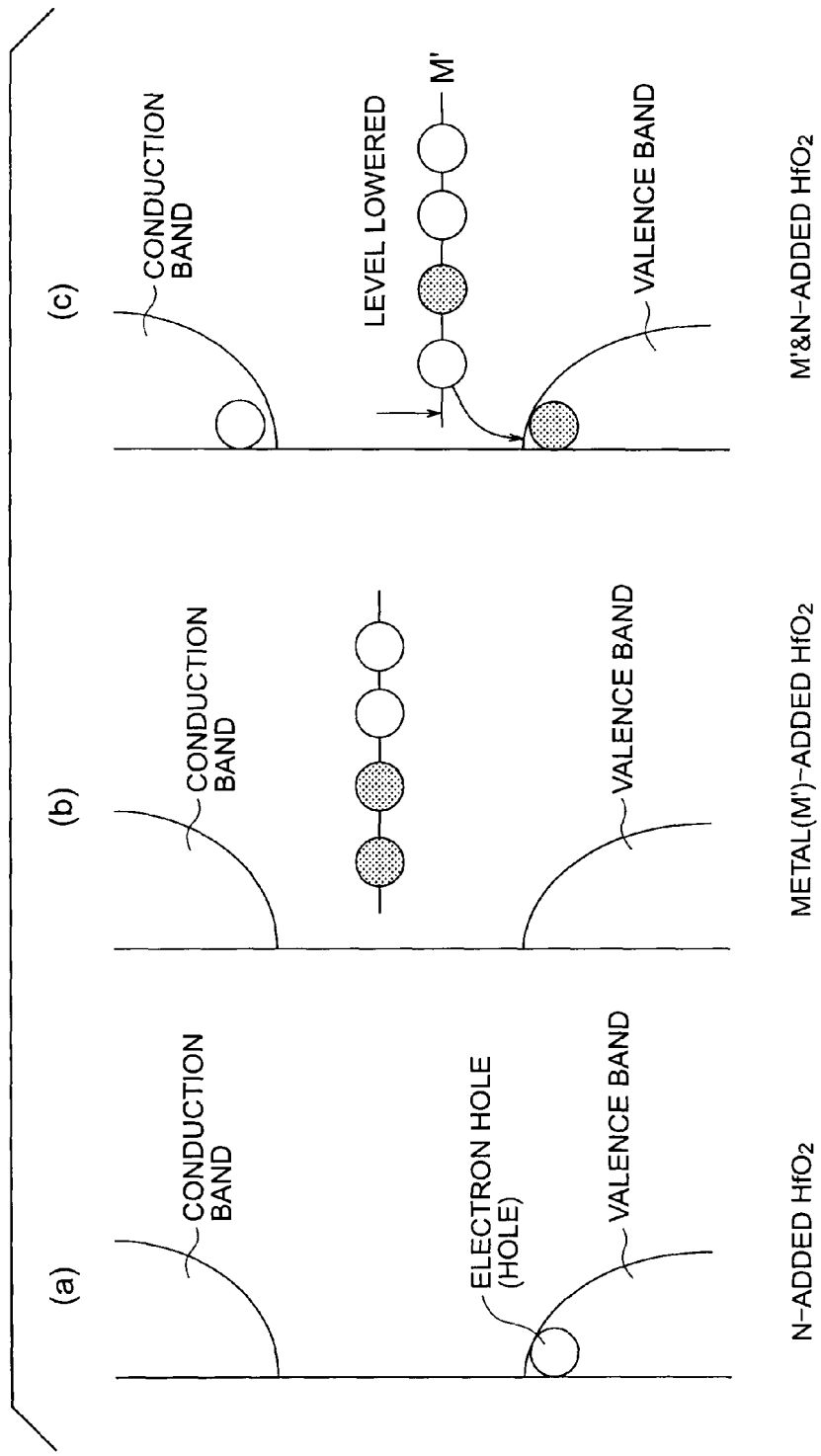
FIGS. 21(a) to 21(c) are diagrams for explaining a situation where the addition of N is facilitated by adding a metal to $HfO_2$.

Referring now to FIGS. 20(a) to 21(c), the reason that F, N, and the likes can be more easily introduced into $HfO_2$ than in conventional cases is described. The reason lies in stabilization of the energy of electrons. First, a case where F is added is described. As shown in FIG. 20(a), when F is introduced in a simple manner, excess electrons are introduced to the bottom of the conduction band, and a high energy state is achieved accordingly. However, when a metal is introduced as an additional material, electrons are transferred to a lower energy level formed by the added metal (FIG. 20(b)), and excess electrons caused by the addition of F are transferred (FIG. 20(c)). Accordingly, the energy of the entire system becomes lower, and F is more easily introduced than in conventional cases.

The introduction of Ta, F, and H can be selectively concentrated onto the region of an oxide film having a high-valency material added thereto. This is because electrons can be transferred to the high-valency material in the region where the high-valency material exists, and a greater energy gain can be achieved than in a case where electrons are scattered in other regions.

In a case where N is added, an electron shortage is caused. The electron shortage causes an electron hole to appear at the top of the conduction band (FIG. 21(a)). Normally, negatively-charged oxygen is emitted to procure electrons. However, by introducing a metal additional material, electrons can be procured from the energy level (FIG. 21(b)) formed by the metal additional material (FIG. 21(c)). At this point, the position of the electron hole formed by the addition of N is lower than the position of the level of the metal, in terms of energy. Since the energy of the entire system becomes lower due to the procurement of electrons, N is more easily introduced than in conventional cases.

The introduction of Mg, Ca, Sr, Ba, Al, Sc, Y, La, Ce, Pr, Nd, Pm, Sm, Eu, Gd, Tb, Dy, Ho, Er, Tm, Yb, Lu, N, C, and B can be selectively concentrated onto the region of an oxide film having a high-valency material added thereto. This is because electrons can be received from the high-valency material in the region where the high-valency material exists, and a greater energy gain can be achieved than in a case where electrons are scattered in other regions.

Examples of techniques for additional material introduction include a technique involving ion implantation, a technique involving film formation and heat diffusion, a technique involving additional material introduction from an atmosphere at the time of film formation, a technique involving additional material introduction from an atmosphere after film formation, a technique involving introduction of an additional material as a film forming gas used in CVD (Chemical Vapor Deposition) or ALD (Atomic Layer Deposition), technique involving additional material introduction as a target of sputtering, and a technique involving additional material introduction into the substrate and sidewalls, and diffusion in a later heating step. Particularly, F or N can be introduced into a Si substrate, and can be further introduced into interfacial control oxide films through a heat process. As described above, F and N can easily enter interfacial control oxide films. Accordingly, F and N can pass through the substrate and the gate insulating film, and are selectively and intensively introduced into the interfacial control oxide films.

When nitrogen is added to silicates of $HfO_2$ and $ZrO_2$ (HfSiO and ZrSiO), a $Si_3N_4$ structure takes precedence. More specifically, nitrogen is not introduced into $HfO_2$, but Si—N bonds are formed. However, when a metal additional material is added, there is an energy decrease due to the nitrogen introduction to the $HfO_2$ side, as described above. Accordingly, nitrogen is introduced into the $HfO_2$ side. In this case, Hf—N bonds take precedence. Here, it becomes apparent that the level in a silicate can be adjusted with nitrogen or the like.

Next, the relative amount of the second additional material is described.

First, the relative amount of an additional material such as N in the case of Type-A is described.

Relative to the amount $[\alpha]$ (atoms/cm$^2$) of an element $\alpha$ as an additional material selected from the group including Nb and W, the amount $[\beta]$ (atoms/cm$^2$) of an element $\beta$ as an additional material selected from the group including N, C, B, Mg, Ca, Sr, Ba, Al, Sc, Y, La, Ce, Pr, Nd, Pm, Sm, Eu, Gd, Tb, Dy, Ho, Er, Tm, Yb, and Lu satisfies the following relationship:

$$0.08 \times [\alpha] < [\beta] \times K < [\alpha] \times ([\text{number of electrons in outermost shell of the element } \alpha] - 4) \quad (1)$$

Here, the number of electrons in the outermost shell of the element α is five in the case of Nb, and is six in the case of W. As for K, there are the following relationships:

where the element β is N, K is 1;

where the element β is C, K is 2;

where the element β is B, K is 3;

where the element β is Mg, Ca, Sr, or Ba, K is 2; and where the element β is Al, Sc, Y, La, Ce, Pr, Nd, Pm, Sm, Eu, Gd, Tb, Dy, Ho, Er, Tm, Yb, or Lu, K is 1.

Where the element β is N, C, or B, the electrons in the outermost shell is one short, two short, and three short, respectively, compared with oxygen (O). Therefore, the numbers of electrons that can be received when the added element β is substituted by oxygen is 1, 2, and 3, respectively, and these values are the values of K in the respective cases. Where the element β is Mg, Ca, Sr, or Ba, the number of emitted electrons is two short of the number of electrons in a tetravalent hafnium (Hf), since the element β is a bivalent material. Accordingly, two holes are formed at the upper edge of the valence band when the element β is added, and the upper edge of the valence band can receive two electrons. Here, the value of K is two. In other words, where the element β is Mg, Ca, Sr, or Ba, K represents the number of electrons the upper edge of the valence band can receive. Where the element β is Al, Sc, Y, La, Ce, Pr, Nd, Pm, Sm, Eu, Gd, Tb, Dy, Ho, Er, Tm, Yb, or Lu, the element β is a trivalent material. Accordingly, when the element β is added, the number of electrons the upper edge of the valence band can receive is one, which is the value of K. In view of this, [β]×K represents the electron amount that can be received by adding the element β. The relative upper limit is determined by the fact that only up to ([number of electrons in outermost shell of element α]−4) electrons can be emitted from the level formed by the element α.

Also, ([number of electrons in outermost shell of element α]−4) is the number of electrons that can be emitted from the first additional material. The lower limit is considered to be 0.08×[α]<[β]×K. This is because the electron emission effect (lowering of the level position) is first observed when electrons enter the positions of Hf atoms around the position of one Hf atom. Since up to twelve Hf atoms exist around the one Hf atom, an electron correlation effect cannot be observed unless the amount of electrons is approximately $1/12 = 0.083$.

The basic structure of $HfO_2$ is a cubic calcium fluoride structure. In this basic structure, eight oxygen atoms exist in the vicinity of one Hf atom, and twelve Hf atoms exist outside the oxygen atoms. Basically, the maximum number of peripheral Hf atoms is 12. Even if $HfO_2$ becomes a tetragonal structure, a monoclinic structure, or an amorphous structure, there are almost no changes in the basic electron features, such as the aspect that the conduction band is formed with 5d components of Hf, and the aspect that the valence band is formed with 2p components of oxygen.

Although there is only one first element α to be added in the above description, two kinds of first elements may be added. In such a case, the added amount [α] is the sum of the amounts of those two elements. Although there is only one second element β to be added in the above description, two or more kinds of second elements may be added. In such a case, [β]×K in the expression (1) is the sum of the products of those elements and K. For example, where the second elements to be added are $β_1$ and $β_2$, and the corresponding values of K are $K_1$ and $K_2$, [β]×K in the expression (1) becomes $[β_1]×K_1 + [β_2]×K_2$. This also applies to the cases described later. Also, to achieve the effects of an embodiment of the present invention by adding an additional material, an area density of $4.8×10^{11}$ atoms/$cm^2$ (=$0.08×6×10^{12}$ atoms/$cm^2$) or more is necessary, since a level is not formed in the gap if the area density of the additional material is less than $6×10^{12}$ atoms/$cm^2$. If the area density of the additional material is less than $4.8×10^{11}$ atoms/$cm^2$, the additional material can be regarded as an impurity.

Next, the relative amount of an additional material such as N or F in the case of Type-B is described.

Where an amount [Mo] (atoms/$cm^2$) of Mo is added to $HfO_2$, F, H, or Ta is further added so as to form an n-MOS transistor, and N or the like is further added so as to form a p-MOS transistor.

The amount [γ] (atoms/$cm^2$) of a first additional element γ selected from the group including F, H, and Ta satisfies the following relationship:

$$0.08×[Mo]<[γ]<[Mo]×2 \quad (2)$$

At the same time, the amount [δ] (atoms/$cm^2$) of a second additional element δ selected from the group including N, C, B, Mg, Ca, Sr, Ba, Al, Sc, Y, La, Ce, Pr, Nd, Pm, Sm, Eu, Gd, Tb, Dy, Ho, Er, Tm, Yb, and Lu satisfies the following relationship:

$$0.08×[Mo]<[δ]×K<[Mo]×2 \quad (3)$$

Since the number of electrons in the outermost shell of Mo is six, the upper limit appears in an n-MOS transistor when [Mo]×2 electrons are received, and the upper limit appears in a p-MOS transistor when [Mo]×2 electrons are emitted. Here, K is the number of electrons that can be received by adding a second element δ, and there are the following relationships:
where the second element δ is N, K is 1;
where the second element δ is C, K is 2;
where the second element δ is B, K is 3;
where the second element δ is Mg, Ca, Sr, or Ba, K is 2; and
where the second element δ is Al, Sc, Y, La, Ce, Pr, Nd, Pm, Sm, Eu, Gd, Tb, Dy, Ho, Er, Tm, Yb, or Lu, K is 1.

In a case where a second element such as nitrogen (N) is to be added to both the n-MIS transistor and the p-MIS transistor when a CMIS device of Type-B or a CMIS device in which Mo is to be added is formed, for example, N is added to the first oxide film of the n-MIS transistor and the second oxide film of the p-MIS transistor, so as to form a p-MIS transistor using the oxide film as the interfacial control oxide film or the gate electrode. After that, a first element such as F is added only to the first oxide film, so as to form an n-MOS transistor using the oxide film as the interfacial control oxide film or the gate electrode.

In this case, relative to the Mo amount [Mo] (atoms/$cm^2$), the amount [γ] (atoms/$cm^2$) of the first element γ (such as F, H, or Ta) and the amount [δ] (atoms/$cm^2$) of the second element δ (such as N) satisfy the following relationships:

$$0.08×[Mo]<[γ]<[Mo]×2+[δ]×K \quad (4)$$

$$0.08×[Mo]<[δ]×K<[Mo]×2 \quad (5)$$

Here, K is the number of electrons that can be received by adding a second element δ. In the relationship (4), the lower limit is the same as that of the relationship (2), but the upper limit reflects the fact that Mo receives more electrons. The relationship (5) is the same as the relationship (3).

In a case where a first element such as fluorine (F) is to be added to both the n-MIS transistor and the p-MIS transistor when a CMIS device of Type-B or a CMIS device in which Mo is to be added is formed, for example, F is added to the first oxide film of the n-MIS transistor and the second oxide film of the p-MIS transistor, so as to form an n-MIS transistor using the oxide film as the interfacial control oxide film or the gate electrode. After that, a second element such as N is added only to the second oxide film, so as to form a p-MOS transistor using the oxide film as the interfacial control oxide film or the gate electrode.

In this case, relative to the Mo amount [Mo] (atoms/$cm^2$), the amount [∈] (atoms/$cm^2$) of the first element ∈ (such as F, H, or Ta) and the amount [ζ] (atoms/$cm^2$) of the second element ζ (such as N) satisfy the following relationships:

$$0.08×[Mo]<[∈]<[Mo]×2 \quad (6)$$

$$0.08×[Mo]<[ζ]×K<[Mo]×2+[∈] \quad (7)$$

Here, K is the number of electrons that can be received by adding a second element ζ. Since F emits only one electron when F is added, the relationship (6) is the same as the relationship (2) when K is 1. In the relationship (7), the lower limit is the same as that of the relationship (2), but the upper limit reflects the fact that Mo emits more electrons.

Next, the relative amount of an additional material such as F in the case of Type-C is described.

Relative to the amount [η] (atoms/cm$^2$) of a first element η as an additional metal, the amount [θ] (atoms/cm$^2$) of a second element θ as an additional material selected from the group including F, H, and Ta satisfies the following relationship:

$$0.08 \times [\eta] < [\theta] < [\eta] \times (8 - [\text{number of electrons in outermost shell of first element } \eta]) \quad (8)$$

Here, the number of electrons in the outermost shell of the first element η is five in the case of V, is six in the case of Cr, and is seven in the case of Mn, Tc, or Re.

EXAMPLES

The following is a description of Examples of the present invention, with reference to the accompanying drawings.

Example 1

Type-A, n-Si

Figure 22:
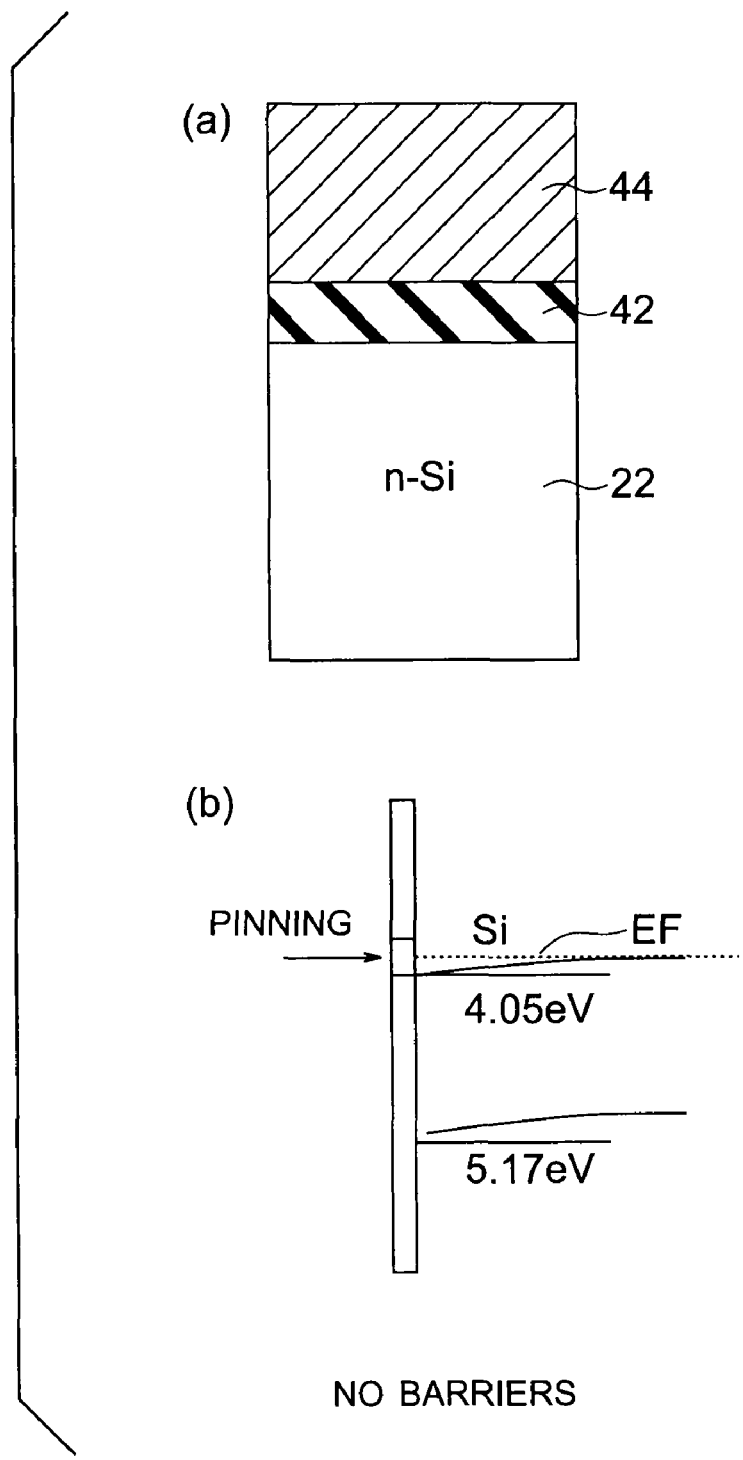
FIGS. 22(a) and 22(b) are diagrams showing a semiconductor device according to Example 1.

FIGS. 22(a) and 22(b) show a semiconductor device of Example 1 of the present invention. The semiconductor device of this example has a stacked structure formed with a HfO$_2$ film 42 that is formed on an n-type silicon substrate 22 and has W added thereto, and a metal film 44 that is made of W and is formed on the HfO$_2$ film 42, as shown in FIG. 22(a). The W added to HfO$_2$ is an additional material of Type-A, which moves the level in the band caused by the W addition to a position located above the bottom of the conduction band of Si, and a barrier-less junction with the n-type Si substrate 22 is formed.

The semiconductor device of this example is formed in the following manner. First, the HfO$_2$ film is formed on the n-type Si substrate 22 by sputtering or the like, and the W film is then formed on the HfO$_2$ film by sputtering. An anneal is performed at 1050° C. in vacuum, and a FGA (forming gas anneal) is performed at 450° C. in a H$_2$ atmosphere. Through this heating process, W diffuses into HfO$_2$, and a level in the HfO$_2$ gap is formed in the neighborhood of 3.9 eV in work function. The level in the gap is the level formed when W is added to HfO$_2$. The band lineup at this point is shown in FIG. 22(b). The manufacture method used here may also be a co-sputtering technique using a HfO$_2$ target and a W target at the same time. When the electric characteristics of the junction between the HfO$_2$ film 42 having W added thereto and the metal film 44 made of W are measured, the measurement results show that the interfacial contact resistance is very low, and ohmic characteristics are observed. The ohmic characteristics are generated because the work function of the metal is pinned at the level in the gap, as shown in FIG. 22(b). Although W is used as the additional material in this example, it is possible to use Nb.

In a case where the semiconductor device of this example is applied to the source and drain regions of n-type Si and the source and drain metal electrode of an n-MISFET, the work function of the HfO$_2$ film 42 having W added thereto may be set at approximately 4.0 eV, with the stacked structure of the gate insulating film and the metal gate electrode formed on the gate insulating film of the n-MISFET being taken into consideration.

It is also possible to add a material such as N to the HfO$_2$ film 42 having W added thereto. If a material such as N is not added, the work function is 3.9 eV only with the addition of W, and the work function is 3.3 eV only with the addition of Nb. To achieve a larger work function than 3.9 eV, a material such as N should be introduced. By doing so, electrons are emitted from the level in the gap, and the level can be made deeper. Other than nitrogen (N), it is possible to introduce C, B, Mg, Ca, Sr, Ba, Al, Sc, Y, La, Ce, Pr, Nd, Pm, Sm, Eu, Gd, Tb, Dy, Ho, Er, Tm, Yb, or Lu, so as to achieve a larger work function.

Comparative Example 1

Figure 23:
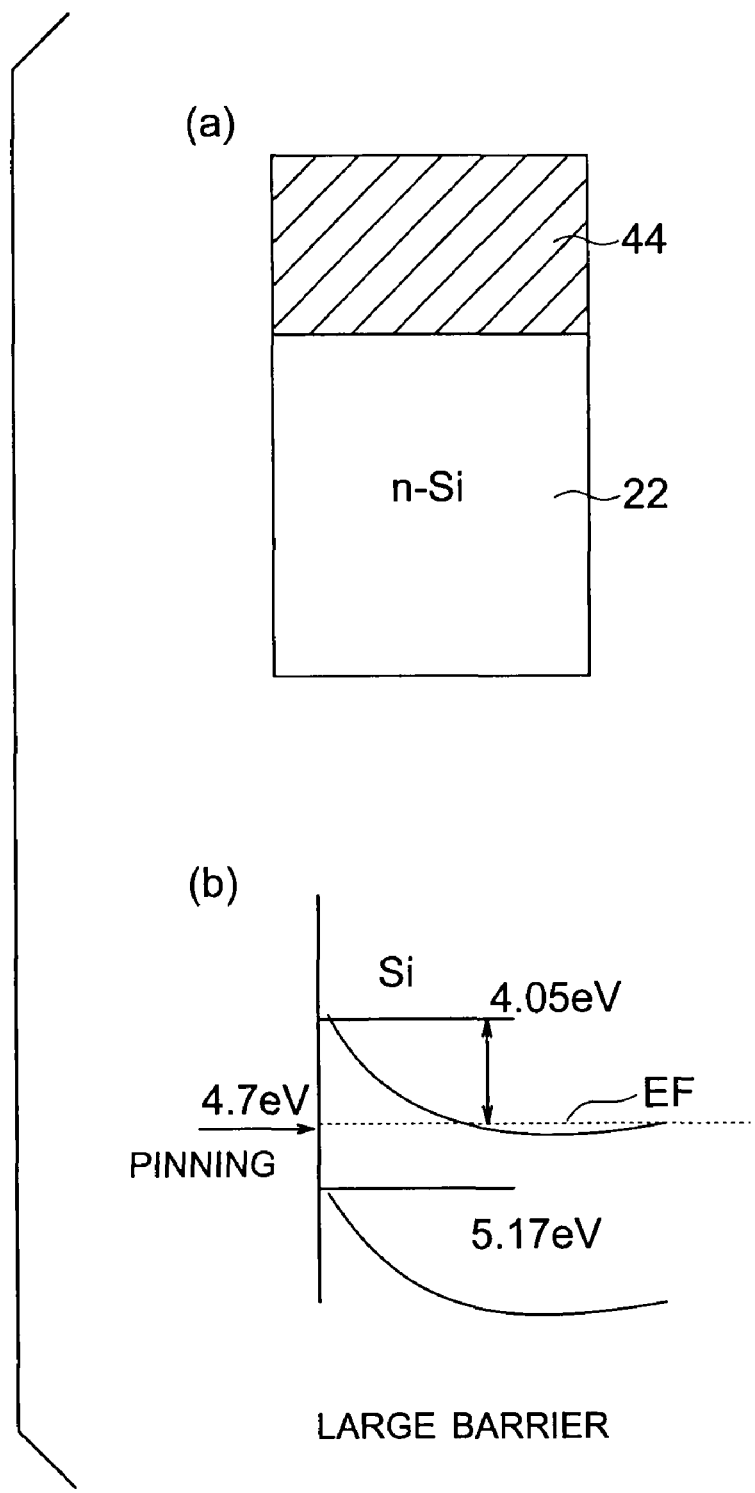
FIGS. 23(a) and 23(b) are diagrams showing a semiconductor device according to a comparative example 1 of Example 1.

FIGS. 23(a) and 23(b) show a semiconductor device of Comparative Example 1 of this example. This semiconductor device of Comparative Example 1 is the same as the semiconductor device of Example 1 shown in FIG. 22(a), except that the HfO$_2$ film 42 having W added thereto is removed. This semiconductor device of Comparative Example 1 is formed in the following manner.

First, as shown in FIG. 23(a), a W film 44 is formed on an n-type Si substrate 22, and an anneal is performed at 450° C. in vacuum. After that, an anneal is performed at 1050° C. in vacuum, and a FGA (forming gas anneal) is performed at 450° C. in a H$_2$ atmosphere. When the electric characteristics of the junction between the n-type Si substrate 22 and the metal film 44 made of W are measured, the measurement results show that the interfacial contact resistance is very high, and ohmic characteristics are not observed. This is because, the metal is pinned onto Si, as can be seen from the band lineup shown in FIG. 23(b). The pinning position is at the position of approximately 4.7 eV in work function. The height of the barrier is as large as 0.65 eV (=4.7−4.05). Those facts confirm that the resistance is much higher than in Example 1.

Comparative Example 2

A semiconductor device of Comparative Example 2 of this example is now described. This semiconductor device of Comparative Example 2 is the same as the semiconductor device of Example 1 shown in FIG. 22(a), except that the HfO$_2$ film 42 having W added thereto is replaced with a Si$_3$N$_4$ thin film having no materials added thereto. It becomes apparent that, when the Si$_3$N$_4$ film having no materials added thereto is inserted between the metal film and the n-type Si substrate, the barrier height is greatly reduced. More specifically, the barrier height is in the range of 0.2 eV to 0.3 eV against the metal of an n-type work function. As a result, the electric characteristics of the junction between the metal film and the Si$_3$N$_4$ film do not exhibit ohmic characteristics. This is because the tunnel resistance of the Si$_3$N$_4$ film is high. Compared with the resistance in Example 1, the resistance is higher. This comparative example confirms that it is difficult to optimize the work function simply by introducing an oxide film (such as a Si$_3$N$_4$ film, an Al$_2$O$_3$ film, a SiO$_2$ film, a GeO$_2$ film, a HfO$_2$ film, or a ZrO$_2$ film), and the tunnel resistance becomes higher.

(Modification 1) Type-A, p-Si

Figure 24:
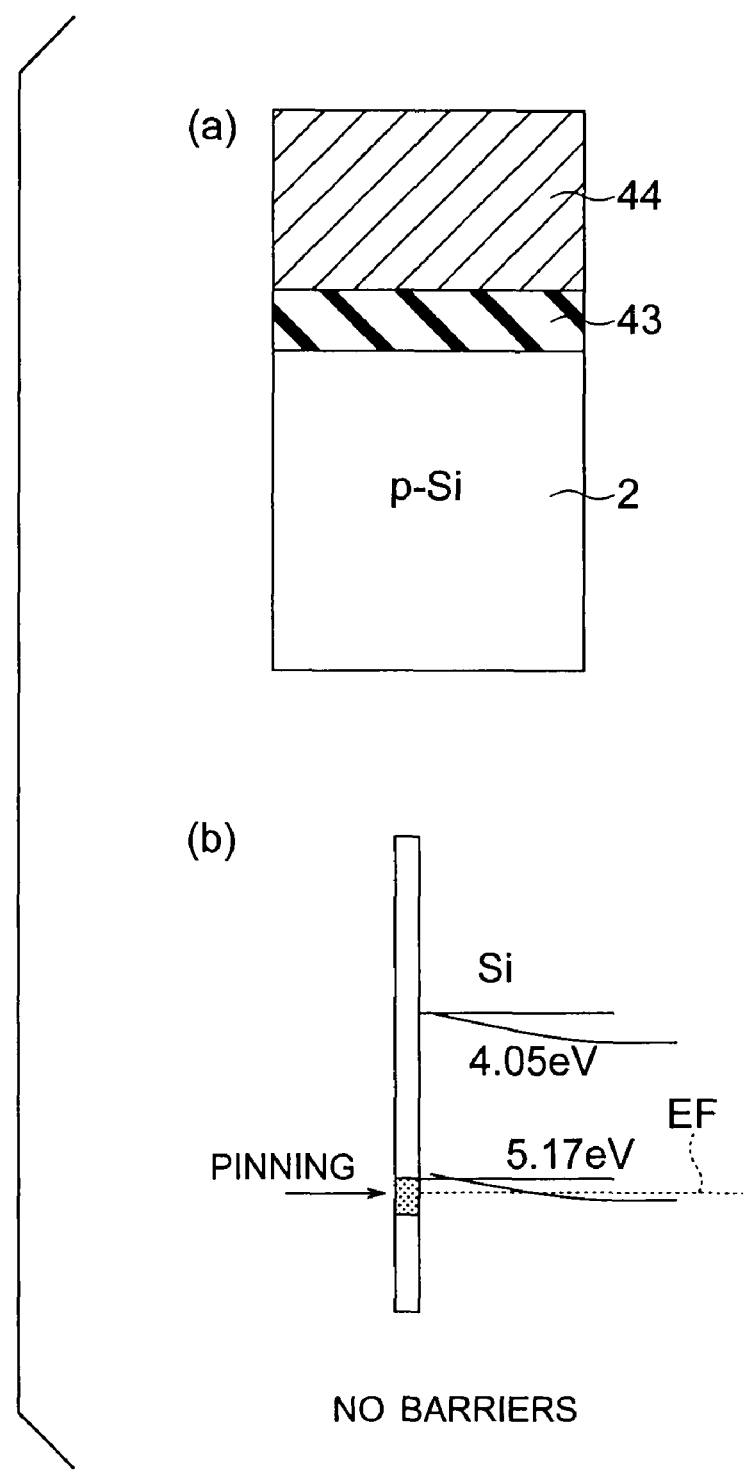
FIGS. 24(a) and 24(b) are diagrams showing a semiconductor device according to Modification 1 of Example 1.

FIGS. 24(a) and 24(b) show a semiconductor device of Modification 1 of this example. The semiconductor device of this modification has a stacked structure formed with a HfON film 43 that is formed on a p-type Si substrate 2 and has W added thereto, and a metal film 44 that is made of W and is formed on the HfON film 43. The W added to HfO$_2$ is an additional material of Type-A, which moves the level in the band caused by the W addition to a position located above the bottom of the conduction band of Si. By further adding N, the level in the band can be moved to a position located below the top of the valence band of Si. Through the addition of N and W, a barrier-less junction with the p-type Si substrate 2 is formed.

The semiconductor device of this modification is formed in the following manner. First, the HfON film 43 having W added thereto is formed on the p-type silicon substrate 2. This HfON film 43 is formed in an $Ar/O_2/N_2$ atmosphere by a co-sputtering technique using a W target and a $HfO_2$ target. During the film formation, nitrogen is introduced into the film, and an anneal is performed at 450° C. in a $N_2$ atmosphere. After that, an anneal is performed at 1050° C. in vacuum, and a FGA (forming gas anneal) is performed at 450° C. in a $H_2$ atmosphere. By optimizing the $N_2$ partial pressure during the film formation and the $N_2$ anneal conditions after the film formation, a level in the gap in $HfO_2$ is formed in the neighborhood of 5.3 eV in work function. This level in the gap is formed by the addition of nitrogen that moves the level formed by the addition of W to $HfO_2$. The band lineup at this point is shown in FIG. 24(b). When the electric characteristics of the junction between the HfON film 43 and the metal film 44 are measured, the measurement results show that the interfacial contact resistance is very low, and ohmic characteristics are observed. The ohmic characteristics are generated because the work function of the metal is pinned at the level in the gap shown in FIG. 24(b).

Although nitrogen (N) is introduced so as to optimize the work function in this modification, the work function can also be optimized by introducing C, B, Mg, Ca, Sr, Ba, Al, Sc, Y, La, Ce, Pr, Nd, Pm, Sm, Eu, Gd, Tb, Dy, Ho, Er, Tm, Yb, or Lu, instead of N. In any case, the work function can be made approximately 5.3 eV.

Although W is used as the additional material in this modification, it is also possible to use Nb.

(Modification 2) Type-B, n-Si

Next, a semiconductor device of Modification 2 of this example is described. The semiconductor device of this modification has the same structure as the semiconductor device of Example 1 shown in FIG. 22(a), except that Mo (molybdenum) and F (fluorine) are used as additional materials to be added to $HfO_2$. The Mo added to $HfO_2$ is an additional material of Type-B, which moves the level in the band caused by the Mo addition to a position located between the conduction band and the valence band of Si. With this arrangement, a barrier-less junction with the n-type Si substrate is formed.

The semiconductor device of this modification is formed in the following manner. First, a $HfO_2$ film having Mo added thereto is formed on the n-type silicon substrate. The film formation is carried out in an $Ar/O_2$ atmosphere by a co-sputtering technique using a Mo target and a $HfO_2$ target. Fluorine ion implantation is then performed. After that, an anneal is performed at 1050° C. in vacuum, and a FGA (forming gas anneal) is performed at 450° C. in a $H_2$ atmosphere. By optimizing the implanted amount of F ions, a level in the gap in $HfO_2$ is formed in the neighborhood of 3.9 eV in work function. This level in the gap is formed by the addition of fluorine that moves the level formed by the addition of Mo to $HfO_2$. The band lineup here is the same as the band lineup shown in FIG. 22(b). When the electric characteristics of the junction between the $HfO_2$ film having Mo and F added thereto and the metal film are measured, the measurement results show that the interfacial contact resistance is very low, and ohmic characteristics are observed. The ohmic characteristics are generated because the work function of the metal is pinned at the level in the gap shown in FIG. 22(b).

Although fluorine (F) is introduced so as to optimize the work function in this modification, the work function can also be optimized by introducing H or Ta, instead of F. In any case, the work function can be made approximately 3.9 eV.

(Modification 3) Type-B, p-Si

Next, a semiconductor device of Modification 3 of this example is described. The semiconductor device of this modification has the same structure as the semiconductor device of Modification 1 shown in FIG. 24(a), except that Mo (molybdenum) and N (nitrogen) are used as additional materials to be added to $HfO_2$. The Mo added to $HfO_2$ is an additional material of Type-B, which moves the level in the band caused by the Mo addition to a position located between the conduction band and the valence band of Si. With this arrangement, a barrier-less junction with the p-type Si substrate is formed.

The semiconductor device of this modification is formed in the following manner. First, a HfON film having Mo added thereto is formed on the p-type silicon substrate. A W film is then formed on the HfON film by sputtering. The HfON film having Mo added thereto is formed in an $Ar/O_2/N_2$ atmosphere by a co-sputtering technique using a Mo target and a $HfO_2$ target. During the film formation, nitrogen is introduced into the film, and an anneal is performed at 450° C. in a $N_2$ atmosphere. After that, an anneal is further performed at 1050° C. in vacuum, and a FGA (forming gas anneal) is performed at 450° C. in a $H_2$ atmosphere. By optimizing the $N_2$ partial pressure during the film formation and the $N_2$ anneal conditions after the film formation, a level in the gap in $HfO_2$ is formed in the neighborhood of 5.3 eV in work function. This level in the gap is formed by the addition of nitrogen that moves the level formed by the addition of Mo to $HfO_2$. The band lineup here is the same as the band lineup shown in FIG. 24(b). When the electric characteristics of the junction between the HfON film having Mo added thereto and the W film are measured, the measurement results show that the interfacial contact resistance is very low, and ohmic characteristics are observed. The ohmic characteristics are generated because the work function of the metal is pinned at the level in the gap shown in FIG. 24(b).

Although nitrogen (N) is introduced so as to optimize the work function in this modification, the work function can also be optimized by introducing C, B, Mg, Ca, Sr, Ba, Al, Sc, Y, La, Ce, Pr, Nd, Pm, Sm, Eu, Gd, Tb, Dy, Ho, Er, Tm, Yb, or Lu, instead of N. In any case, the work function can be made approximately 5.3 eV.

(Modification 4) Type-C, n-Si

Next, a semiconductor device of Modification 4 of this example is described. The semiconductor device of this modification has the same structure as the semiconductor device of Example 1 shown in FIG. 22(a), except that additional materials of Type-C are added to $HfO_2$. The additional materials added to $HfO_2$ are V (vanadium) and H (hydrogen). The V added to $HfO_2$ is an additional material of Type-C, which moves the level in the band caused by the V addition to a position located below the top of the valence band of Si. With this arrangement, a barrier-less junction with the n-type Si substrate is formed.

The semiconductor device of this modification is formed in the following manner. First, a $HfO_2$ film having V added thereto is formed on the n-type silicon substrate. A W film is formed on the $HfO_2$ film by sputtering. The film formation of the $HfO_2$ film having V added thereto is carried out in an $Ar/O_2$ atmosphere by a co-sputtering technique using a V target and a $HfO_2$ target. Through exposure to plasma H at room temperature, hydrogen atoms are introduced into the $HfO_2$ film having V added thereto at the interface. After that, an anneal is performed at 1050° C. in vacuum, and a FGA (forming gas anneal) is performed at 450° C. in a $H_2$ atmosphere. By optimizing the period of time and the temperature of the exposure to plasma H, a level in the $HfO_2$ gap is formed in the neighborhood of 3.9 eV in work function. This level in the gap is formed by the addition of hydrogen that moves the level formed by the addition of V to $HfO_2$. The band lineup here is the same as the band lineup shown in FIG. 22(b). When the electric characteristics of the junction between the $HfO_2$ film having V added thereto and the W film are measured, the measurement results show that the interfacial contact resistance is very low, and ohmic characteristics are observed. The ohmic characteristics are generated because the work function of the metal is pinned at the level in the gap shown in FIG. 22(b).

Although hydrogen (H) is introduced so as to optimize the work function in this modification, the work function can also be optimized by introducing F or Ta, instead of H. In any case, the work function can be made approximately 3.9 eV.

Although V is used as an additional material in this modification, it is also possible to use any of Cr, Mn, Tc, or Re, instead of V.

(Modification 5) Type-C, p-Si

Next, a semiconductor device of Modification 5 of this example is described. The semiconductor device of this modification has the same structure as the semiconductor device of Modification 1 shown in FIG. 24(a), except that additional materials of Type-C are added to $HfO_2$. The additional materials added to $HfO_2$ are V (vanadium) and Ta (tantalum). The V added to $HfO_2$ is an additional material of Type-C, which moves the level in the band caused by the V addition to a position located below the top of the valence band of Si. With this arrangement, a barrier-less junction with the p-type Si substrate is formed.

The semiconductor device of this modification is formed in the following manner. First, a $HfO_2$ film having V and Ta added thereto is formed on the p-type silicon substrate. A W film is then formed on the $HfO_2$ film by sputtering. The $HfO_2$ film having V and Ta added thereto is formed in an $Ar/O_2$ atmosphere by a co-sputtering technique using a V target, a Ta target, and a $HfO_2$ target. After that, an anneal is further performed at 1050° C. in vacuum, and a FGA (forming gas anneal) is performed at 450° C. in a $H_2$ atmosphere. The amount of each additional material can be optimized by adjusting the power supplied to the respective targets. Accordingly, a level in the gap in $HfO_2$ is formed in the neighborhood of 5.3 eV in work function. This level in the gap is formed by the addition of Ta that moves the level formed by the addition of V to $HfO_2$. The band lineup here is the same as the band lineup shown in FIG. 24(b). When the electric characteristics of the junction between the $HfO_2$ film having V and Ta added thereto and the W film are measured, the measurement results show that the interfacial contact resistance is very low, and ohmic characteristics are observed. The ohmic characteristics are generated because the work function of the metal is pinned at the level in the gap shown in FIG. 24(b).

Although tantalum (Ta) is introduced so as to optimize the work function in this modification, the work function can also be optimized by introducing F or H, instead of Ta. In any case, the work function can be made approximately 5.3 eV.

Although vanadium (V) is used as an additional material in this modification, it is also possible to use Cr, Mn, Tc, or Re, instead of V.

To elevate the level in the gap, Ta (or F or H) is used in this modification. However, it is possible that none of those materials is used. In a case where none of those materials is used, a state of a very deep work function is obtained. If the contact between a p-type semiconductor and a metal (between a Si substrate and a metal, or between a Ge substrate and a metal, or the like) should simply exhibit ohmic characteristics, it is not necessary to introduce Ta (or F or H) where an additional material of Type-C is introduced.

Example 2

Type-A, n-Ge

Figure 25:
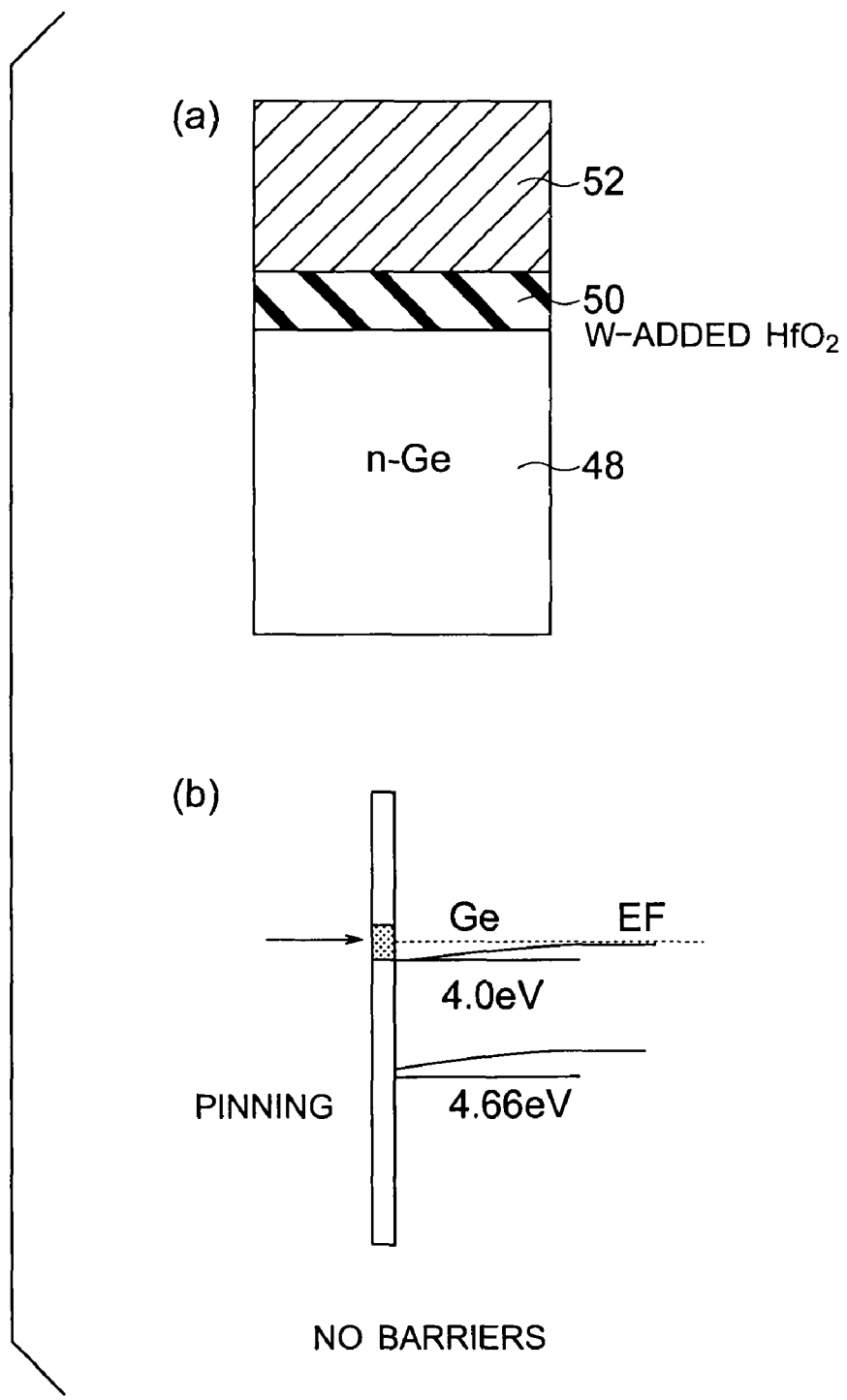
FIGS. 25(a) and 25(b) are diagrams showing a semiconductor device according to Example 2.

FIGS. 25(a) and 25(b) show a semiconductor device of Example 2 of the present invention. The semiconductor device of this example has a stacked structure formed with a $HfO_2$ film 50 that is formed on an n-type Ge substrate 48 and has W added thereto, and a metal film 52 that is made of W and is formed on the $HfO_2$ film 50, as shown in FIG. 25(a). The W added to $HfO_2$ is an additional material of Type-A, which moves the level in the band caused by the W addition to a position located above the bottom of the conduction band of Ge, and a barrier-less junction with the n-type Ge substrate 48 is formed.

The semiconductor device of this example is formed in the following manner. First, the $HfO_2$ film is formed on the n-type Ge substrate 48 by sputtering or the like, and the W film 52 is then formed on the $HfO_2$ film by sputtering. An anneal is performed at 1050° C. in vacuum, and a FGA (forming gas anneal) is performed at 450° C. in a $H_2$ atmosphere. Through this heating process, W diffuses into $HfO_2$ film, and a level in the $HfO_2$ gap is formed in the neighborhood of 3.9 eV in work function. The level in the gap is the level formed when W is added to $HfO_2$. The band lineup here is shown in FIG. 25(b). The manufacture method used here may also be a co-sputtering technique using a $HfO_2$ target and a W target at the same time. When the electric characteristics of the junction between the $HfO_2$ film 50 having W added thereto and the W film 52 are measured, the measurement results show that the interfacial contact resistance is very low, and ohmic characteristics are observed. The ohmic characteristics are generated because the work function of the metal is pinned at the level in the gap, as shown in FIG. 25(b).

Although W is used as the additional material in this example, it is possible to use Nb.

It is also possible to add a material such as N to the $HfO_2$ film 50 having W added thereto. If a material such as N is not added, the work function is 3.9 eV only with the addition of W, and the work function is 3.3 eV only with the addition of Nb. To achieve a larger work function than 3.9 eV, a material such as N should be introduced. By doing so, electrons are emitted from the level in the gap, and the level can be made deeper. Other than nitrogen (N), it is possible to introduce C, B, Mg, Ca, Sr, Ba, Al, Sc, Y, La, Ce, Pr, Nd, Pm, Sm, Eu, Gd, Tb, Dy, Ho, Er, Tm, Yb, or Lu, so as to achieve a larger work function.

Comparative Example 1

Figure 26:
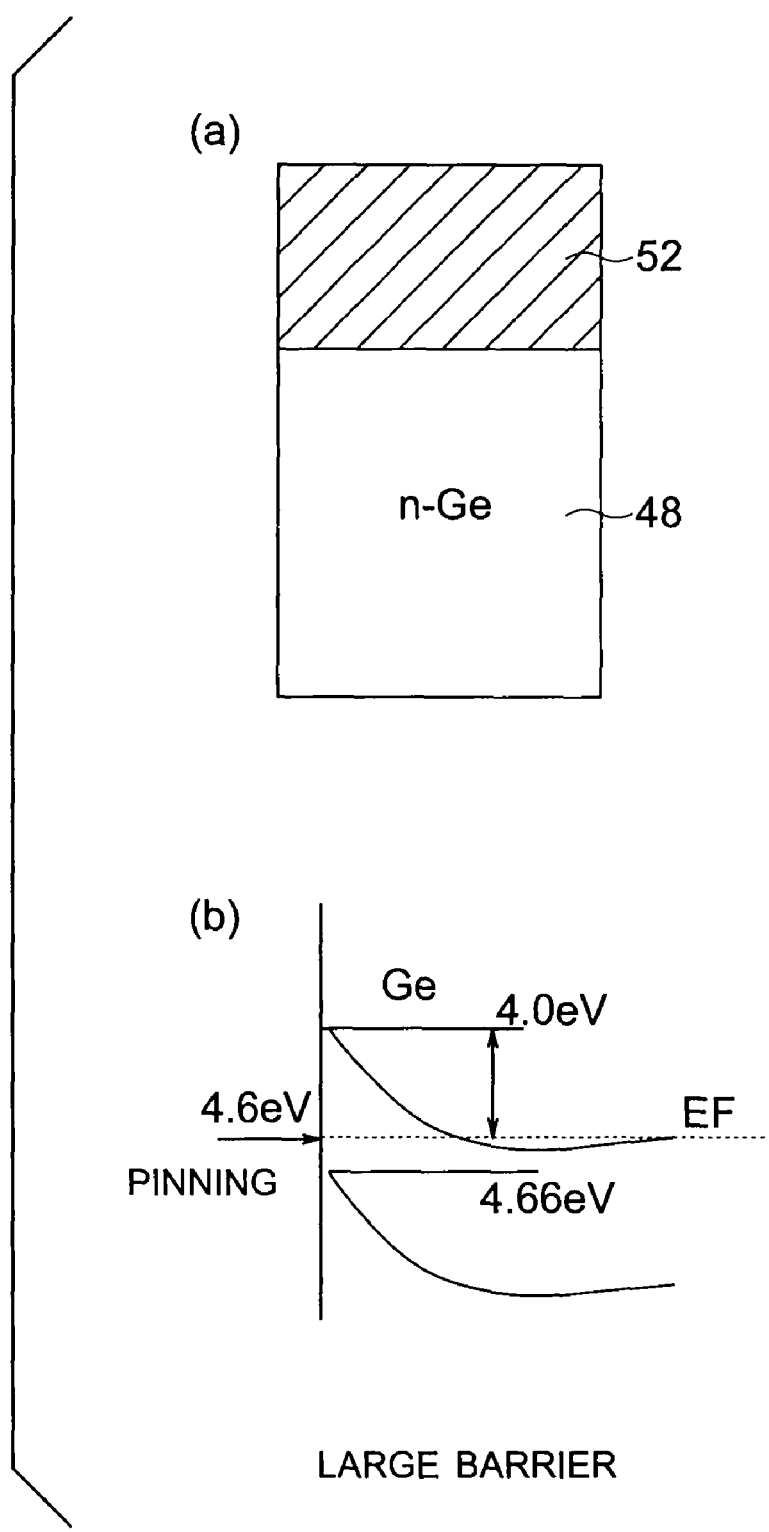
FIGS. 26(a) and 26(b) are diagrams showing a semiconductor device according to Comparative Example 1 of Example 2.

FIGS. 26(a) and 26(b) show a semiconductor device of Comparative Example 1 of this example. This semiconductor device of Comparative Example 1 is the same as the semiconductor device of Example 2 shown in FIG. 25(a), except that the $HfO_2$ film 50 having W added thereto is removed. This semiconductor device of Comparative Example 1 is formed in the following manner.

First, as shown in FIG. 26(a), a W film 52 is formed on an n-type Ge substrate 48, and an anneal is performed at 450° C. in vacuum. After that, an anneal is performed at 1050° C. in vacuum, and a FGA (forming gas anneal) is performed at 450° C. in a $H_2$ atmosphere. When the electric characteristics of the junction between the n-type Ge substrate 48 and the W film 52 are measured, the measurement results show that the interfacial contact resistance is very high, and ohmic characteristics are not observed. This is because, the metal is pinned onto Si, as can be seen from the band lineup shown in FIG. 26(b). The pinning position is at the position of approximately 4.6 eV in work function. The height of the barrier is as large as 0.6 eV (=4.6−4.0). Those facts confirm that the resistance is much higher than in Example 2.

Comparative Example 2

A semiconductor device of Comparative Example 2 of this example is now described. This semiconductor device of Comparative Example 2 is the same as the semiconductor device of Example 2 shown in FIG. 25(a), except that the $HfO_2$ film 50 having W added thereto is replaced with a $Si_3N_4$ thin film having no materials added thereto. It becomes apparent that, when the $Si_3N_4$ film having no materials added thereto is inserted between the metal film and the n-type Ge substrate, the barrier height is greatly reduced. More specifically, the barrier height is in the range of 0.2 eV to 0.3 eV against the metal of an n-type work function. As a result, the electric characteristics of the junction between the metal film and the $Si_3N_4$ film do not exhibit ohmic characteristics. This is because the tunnel resistance of the $Si_3N_4$ film is high. Compared with the resistance in Example 2, the resistance is higher. This comparative example confirms that it is difficult to optimize the work function simply by introducing an oxide film (such as a $Si_3N_4$ film, an $Al_2O_3$ film, a $SiO_2$ film, a $GeO_2$ film, a $HfO_2$ film, or a $ZrO_2$ film), and the tunnel resistance becomes higher.

(Modification 1) Type-A, p-Ge

Figure 27:
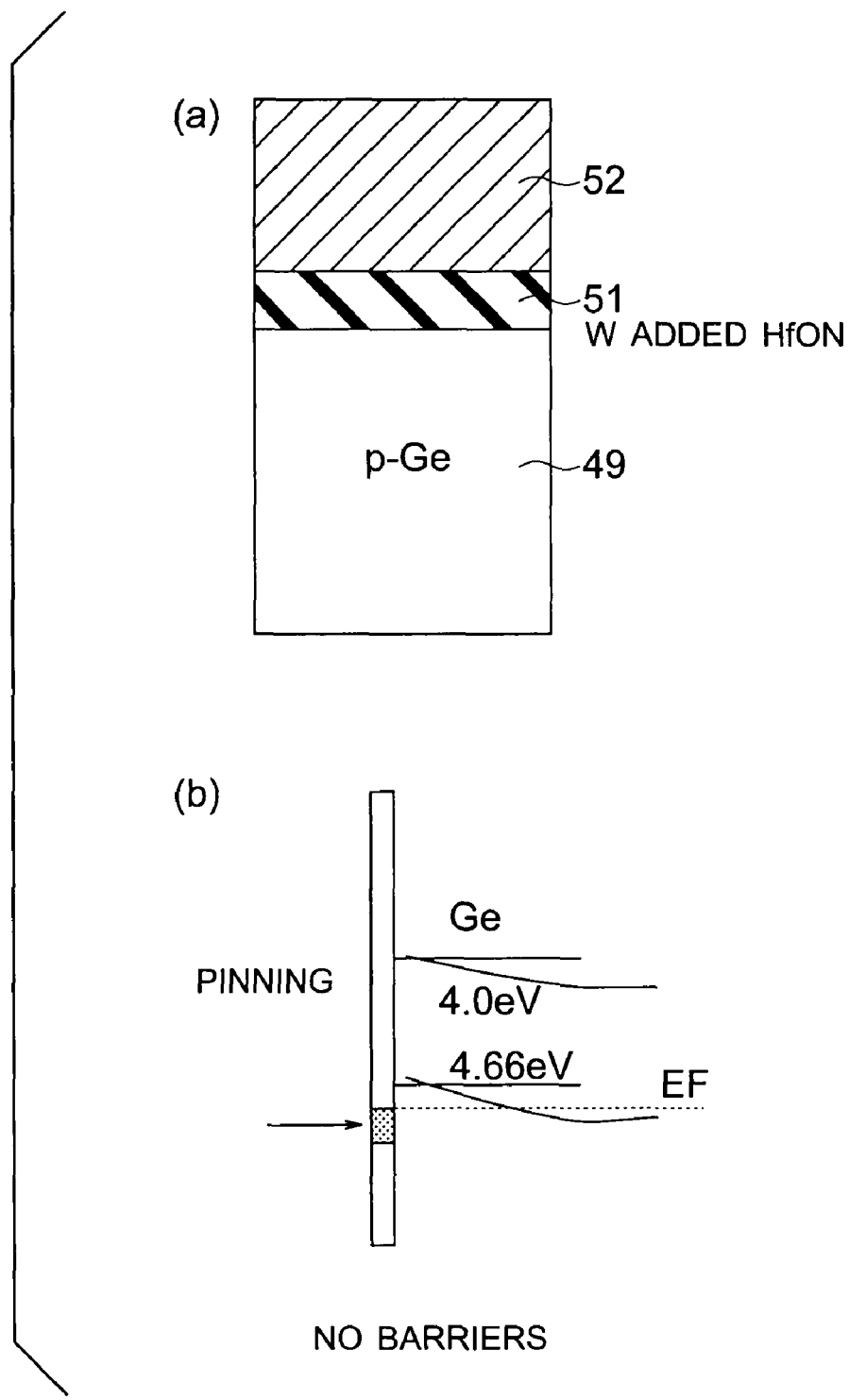
FIGS. 27(a) and 27(b) are diagrams showing a semiconductor device according to Modification 1 of Example 2.

FIGS. 27(a) and 27(b) show a semiconductor device of Modification 1 of this example. The semiconductor device of this modification has a stacked structure formed with a HfON film 51 that is formed on a p-type Ge substrate 49 and has W added thereto, and a metal film 52 that is made of W and is formed on the HfON film 51. The W added to $HfO_2$ is an additional material of Type-A, which moves the level in the band caused by the W addition to a position located above the bottom of the conduction band of Ge. By further adding N, the level in the band can be moved to a position located below the top of the valence band of Ge. Through the addition of N and W, a barrier-less junction with the p-type Ge substrate 49 is formed.

The semiconductor device of this modification is formed in the following manner. First, the HfON film 51 having W added thereto is formed on the p-type Ge substrate 49. This HfON film 51 is formed in an $Ar/O_2/N_2$ atmosphere by a co-sputtering technique using a W target and a $HfO_2$ target. During the film formation, nitrogen is introduced into the film, and an anneal is performed at 450° C. in a $N_2$ atmosphere. After that, an anneal is performed at 1050° C. in vacuum, and a FGA (forming gas anneal) is performed at 450° C. in a $H_2$ atmosphere. By optimizing the $N_2$ partial pressure during the film formation and the $N_2$ anneal conditions after the film formation, a level in the gap in $HfO_2$ is formed in the neighborhood of 5.0 eV in work function. This level in the gap is formed by the further addition of nitrogen that moves the level formed by the addition of W to $HfO_2$. The band lineup here is shown in FIG. 27(b). When the electric characteristics of the junction between the HfON film 51 and the metal film 52 are measured, the measurement results show that the interfacial contact resistance is very low, and ohmic characteristics are observed. The ohmic characteristics are generated because the work function of the metal is pinned at the level in the gap shown in FIG. 27(b).

Although nitrogen (N) is introduced so as to optimize the work function in this modification, the work function can also be optimized by introducing C, B, Mg, Ca, Sr, Ba, Al, Sc, Y, La, Ce, Pr, Nd, Pm, Sm, Eu, Gd, Tb, Dy, Ho, Er, Tm, Yb, or Lu, instead of N. In any case, the work function can be made approximately 5.0 eV.

Although W is used as the additional material in this modification, it is also possible to use Nb.

(Modification 2) Type-B, n-Ge

Next, a semiconductor device of Modification 2 of this example is described. The semiconductor device of this modification has the same structure as the semiconductor device of Example 2 shown in FIG. 25(a), except that Mo (molybdenum) and F (fluorine) are used as additional materials to be added to $HfO_2$. The Mo added to $HfO_2$ is an additional material of Type-B, which moves the level in the band caused by the Mo addition to a position located between the conduction band and the valence band of Ge. With this arrangement, a barrier-less junction with the n-type Ge substrate is formed.

The semiconductor device of this modification is formed in the following manner. First, a $HfO_2$ film having Mo added thereto is formed on the n-type Ge substrate, and a W film is formed on the $HfO_2$ film by sputtering. The film formation of the $HfO_2$ film having Mo added thereto is carried out in an $Ar/O_2$ atmosphere by a co-sputtering technique using a Mo target and a $HfO_2$ target. Fluorine ion implantation is then performed. After that, an anneal is performed at 1050° C. in vacuum, and a FGA (forming gas anneal) is performed at 450° C. in a $H_2$ atmosphere. By optimizing the implanted amount of F ions, a level in the gap in $HfO_2$ is formed in the neighborhood of 3.9 eV in work function. This level in the gap is formed by the addition of fluorine that moves the level formed by the addition of Mo to $HfO_2$. The band lineup here is the same as the band lineup shown in FIG. 25(b). When the electric characteristics of the junction between the $HfO_2$ film having Mo and F added thereto and the metal film are measured, the measurement results show that the interfacial contact resistance is very low, and ohmic characteristics are observed. The ohmic characteristics are generated because the work function of the metal is pinned at the level in the gap shown in FIG. 25(b).

Although fluorine (F) is introduced so as to optimize the work function in this modification, the work function can also be optimized by introducing H or Ta, instead of F. In any case, the work function can be made approximately 3.9 eV.

(Modification 3) Type-B, p-Ge

Next, a semiconductor device of Modification 3 of this example is described. The semiconductor device of this modification has the same structure as the semiconductor device of Modification 1 shown in FIG. 27(a), except that Mo (molybdenum) and N (nitrogen) are used as additional materials to be added to $HfO_2$. The Mo added to $HfO_2$ is an additional material of Type-B, which moves the level in the band caused by the Mo addition to a position located between the conduction band and the valence band of Ge. With this arrangement, a barrier-less junction with the p-type Ge substrate is formed.

The semiconductor device of this modification is formed in the following manner. First, a HfON film having Mo added thereto is formed on the p-type Ge substrate. A W film is then formed on the HfON film by sputtering. The HfON film having Mo added thereto is formed in an $Ar/O_2/N_2$ atmosphere by a co-sputtering technique using a Mo target and a $HfO_2$ target. During the film formation, nitrogen is introduced into the film, and an anneal is performed at 450° C. in a $N_2$ atmosphere. After that, an anneal is further performed at 1050° C. in vacuum, and a FGA (forming gas anneal) is performed at 450° C. in a $H_2$ atmosphere. By optimizing the $N_2$ partial pressure during the film formation and the $N_2$ anneal conditions after the film formation, a level in the gap in $HfO_2$ is formed in the neighborhood of 5.0 eV in work function. This level in the gap is formed by the addition of nitrogen that moves the level formed by the addition of Mo to $HfO_2$. The band lineup here is the same as the band lineup shown in FIG. 27(b). When the electric characteristics of the junction between the HfON film having Mo added thereto and the W film are measured, the measurement results show that the interfacial contact resistance is very low, and ohmic characteristics are observed. The ohmic characteristics are generated because the work function of the metal is pinned at the level in the gap shown in FIG. 27(b).

Although nitrogen (N) is introduced so as to optimize the work function in this modification, the work function can also be optimized by introducing C, B, Mg, Ca, Sr, Ba, Al, Sc, Y, La, Ce, Pr, Nd, Pm, Sm, Eu, Gd, Tb, Dy, Ho, Er, Tm, Yb, or Lu, instead of N. In any case, the work function can be made approximately 5.0 eV.

(Modification 4) Type-C, n-Ge

Next, a semiconductor device of Modification 4 of this example is described. The semiconductor device of this modification has the same structure as the semiconductor device of Example 2 shown in FIG. 25(a), except that additional materials of Type-C are added to $HfO_2$. The additional materials added to $HfO_2$ are V (vanadium) and H (hydrogen). The V added to $HfO_2$ is an additional material of Type-C, which moves the level in the band caused by the V addition to a position located below the top of the valence band of Ge. With this arrangement, a barrier-less junction with the n-type Ge substrate is formed.

The semiconductor device of this modification is formed in the following manner. First, a $HfO_2$ film having V added thereto is formed on the n-type Ge substrate. A W film is formed on the $HfO_2$ film by sputtering. The film formation of the $HfO_2$ film having V added thereto is carried out in an $Ar/O_2$ atmosphere by a co-sputtering technique using a V target and a $HfO_2$ target. Through exposure to plasma H at room temperature, hydrogen atoms are introduced into the $HfO_2$ film having V added thereto at the interface. After that, an anneal is performed at 1050° C. in vacuum, and a FGA (forming gas anneal) is performed at 450° C. in a $H_2$ atmosphere. By optimizing the period of time and the temperature of the exposure to plasma H, a level in the $HfO_2$ gap is formed in the neighborhood of 3.9 eV in work function. This level in the gap is formed by the addition of hydrogen that moves the level formed by the addition of V to $HfO_2$. The band lineup here is the same as the band lineup shown in FIG. 25(b). When the electric characteristics of the junction between the $HfO_2$ film having V added thereto and the W film are measured, the measurement results show that the interfacial contact resistance is very low, and ohmic characteristics are observed. The ohmic characteristics are generated because the work function of the metal is pinned at the level in the gap shown in FIG. 25(b).

Although hydrogen (H) is introduced so as to optimize the work function in this modification, the work function can also be optimized by introducing F or Ta, instead of H. In any case, the work function can be made approximately 3.9 eV.

Although V is used as an additional material in this modification, it is also possible to use any of Cr, Mn, Tc, or Re, instead of V.

(Modification 5) Type-C, p-Si

Next, a semiconductor device of Modification 5 of this example is described. The semiconductor device of this modification has the same structure as the semiconductor device of Modification 1 shown in FIG. 27(a), except that additional materials of Type-C are added $HfO_2$. The additional materials added to $HfO_2$ are V (vanadium) and Ta (tantalum). The V added to $HfO_2$ is an additional material of Type-C, which moves the level in the band caused by the V addition to a position located below the top of the valence band of Ge. With this arrangement, a barrier-less junction with the p-type Ge substrate is formed.

The semiconductor device of this modification is formed in the following manner. First, a $HfO_2$ film having V and Ta added thereto is formed on the p-type Ge substrate. A W film is then formed on the $HfO_2$ film by sputtering. The $HfO_2$ film having V and Ta added thereto is formed in an $Ar/O_2$ atmosphere by a co-sputtering technique using a V target, a Ta target, and a $HfO_2$ target. After that, an anneal is further performed at 1050° C. in vacuum, and a FGA (forming gas anneal) is performed at 450° C. in a $H_2$ atmosphere. The amount of each additional material can be optimized by adjusting the power supplied to the respective targets. Accordingly, a level in the gap in $HfO_2$ is formed in the neighborhood of 5.0 eV in work function. This level in the gap is formed by the addition of Ta that moves the level formed by the addition of V to $HfO_2$. The band lineup here is the same as the band lineup shown in FIG. 27(b). When the electric characteristics of the junction between the $HfO_2$ film having V and Ta added thereto and the W film are measured, the measurement results show that the interfacial contact resistance is very low, and ohmic characteristics are observed. The ohmic characteristics are generated because the work function of the metal is pinned at the level in the gap shown in FIG. 27(b).

Although tantalum (Ta) is introduced so as to optimize the work function in this modification, the work function can also be optimized by introducing F or H, instead of Ta. In any case, the work function can be made approximately 5.0 eV.

Although V is used as an additional material in this modification, it is also possible to use Cr, Mn, Tc, or Re, instead of V.

To elevate the level in the gap, Ta (or F or H) is used in this modification. However, it is possible that none of those materials is used. In a case where none of those materials is used, a state of a very deep work function is obtained. If the contact between a p-type semiconductor and a metal (between a Si substrate and a metal, or between a Ge substrate and a metal, or the like) should simply exhibit ohmic characteristics, it is not necessary to introduce Ta (or F or H) where an additional material of Type-C is introduced.

Example 3

MIM Capacitor

Figure 28:
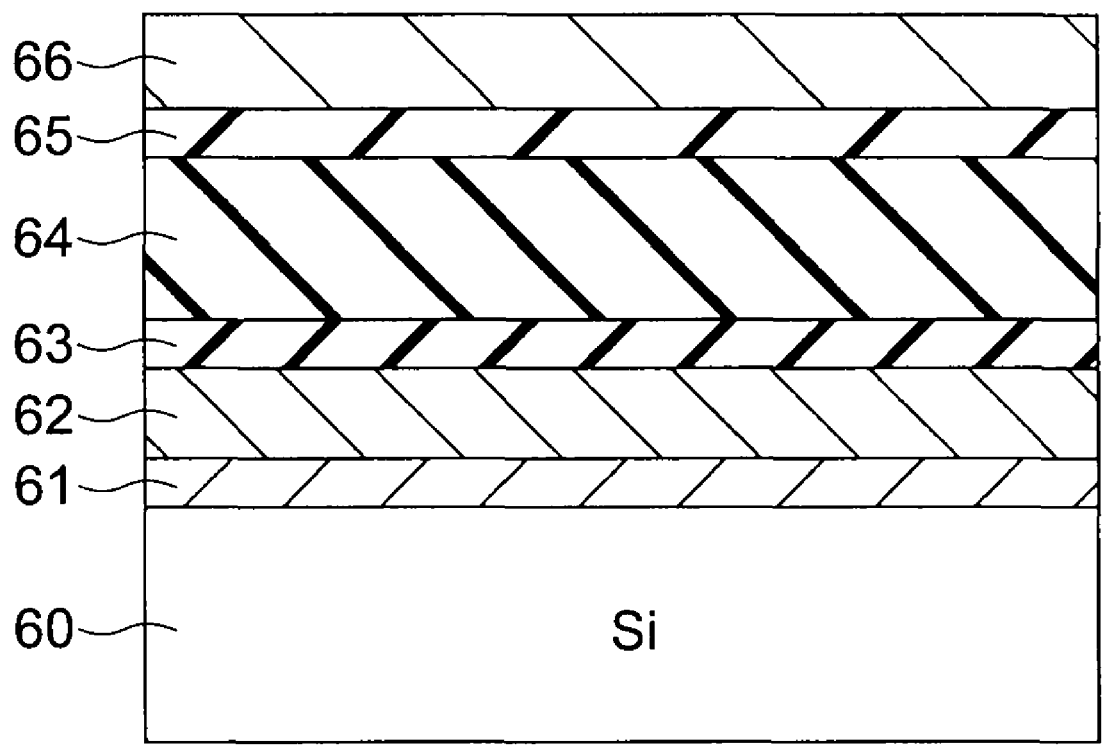
FIG. 28 is a cross-sectional diagram showing a semiconductor device according to Example 3.
Figure 29:
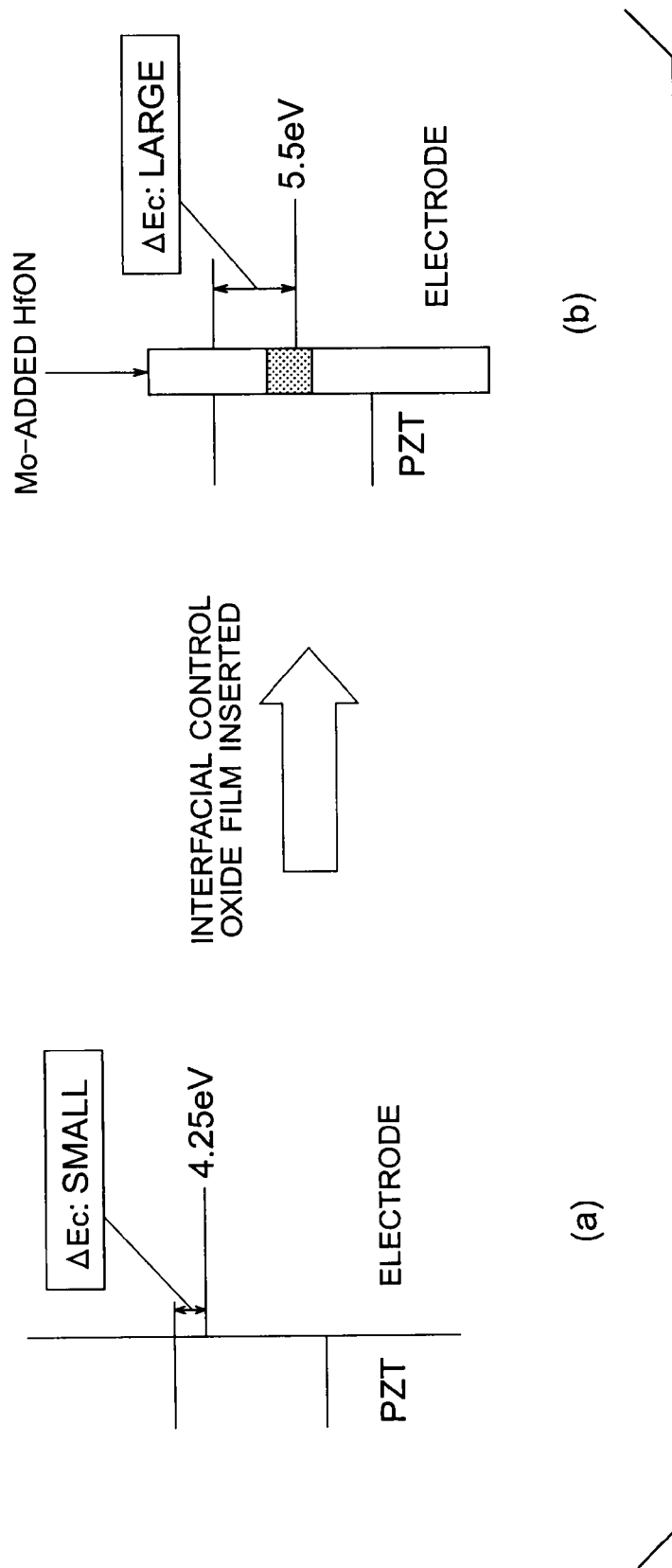
FIGS. 29(a) and 29(b) are diagrams for explaining the levels in the gap in Example 3.

Referring now to FIGS. 28 to 29(b), a semiconductor device of Example 3 of the present invention is described. The semiconductor device of this example is a MIM capacitor having a stacked structure including a metal, an insulating material, and a metal. As shown in FIG. 28, the stacked structure is formed on a silicon substrate 60, and includes a buffer layer 61 made of TiAlN, a $SrRuO_3$ electrode 62, a HfON film (an interfacial control oxide film) 63 having Mo added thereto, a ferroelectric film 64 made of $Pb(Zr,Ti)O_3$, a HfON film (an interfacial control oxide film) 65 having Mo added thereto, and a $SrRuO_3$ electrode 66, which are stacked in this order. Each of the films is formed by sputtering. Particularly, the HfON films 63 and 65 having Mo added thereto are formed in an $Ar/O_2/N_2$ atmosphere by a co-sputtering technique using a Mo target and a $HfO_2$ target. After all the film formation is completed, an anneal is performed at 1050° C. in vacuum, and a FGA (forming gas anneal) is performed at 450° C. in a $H_2$ atmosphere.

In the HfON films 63 and 65 having Mo added thereto in this example, a level in the gap in $HfO_2$ is formed, and the effective work function of the electrodes is pinned at the level, as shown in FIGS. 29(a) and 29(b). In this example, a level in the gap in $HfO_2$ is formed in the neighborhood of 5.5 eV in terms of work function. By one of the techniques described as the embodiments of the present invention, it is possible to design an interfacial control oxide film having an appropriate work function through a combination of other additional materials. For example, a gap state may be formed by adding V, Cr, Mn, Nb, Mo, Tc, W, or Re, so that the work function exists almost at the center of the gap of the ferroelectric material.

In the structure of this example, the barrier against electrons in the MIM capacitor is approximately 1.65 eV, and the barrier against holes is also approximately 1.65 eV. Therefore, if polarization is caused, the polarization can be maintained for a long time. In other words, if this capacitor is used as a capacitor in a ferroelectric memory (FeRAM), a very high-performance ferroelectric memory that does not change with time can be formed. In a FeRAM that includes the MIM capacitor of this example, refresh in operation is unnecessary, and a truly nonvolatile memory can be formed.

Although a $SrRuO_3$ oxide electrode is used as the capacitor electrode in this example, it is possible to use other various metals that have been conventionally used as electrode materials. Typical examples of such metals include W and TiN, which excel in processability. In the MIM capacitor of this example, the work function is determined by the inserted oxide. Accordingly, the electrode material can be freely selected.

Comparative Example

Next, a MIM capacitor in accordance with a comparative example of this example is described. The MIM capacitor of the comparative example is the same as the MIM capacitor of this example shown in FIG. 28, except that the interfacial control oxide film is removed. More specifically, the MIM capacitor of the comparative example has a stacked structure formed on a semiconductor substrate. The stacked structure includes a ferroelectric film formed with a TiAlN buffer layer, a $SrRuO_3$ electrode, and $Pb(Zr,Ti)O_3$, and a $SrRuO_3$ electrode stacked in this order. In this comparative example, oxygen defects are formed over time, and the barrier against electrons becomes as low as 0.2 eV. As a result, a leakage current flows, and the polarization quickly disappears. The change over time is very easily caused, and the polarization can be maintained only for several hours. If W or TiN electrodes and the likes are used, the leakage current is large in the initial stage. Therefore, such electrodes cannot be used.

(Modification) Novel Structure of DRAM Capacitor

In this example, maintenance of polarization of a ferroelectric material has been described. However, the same applies to a capacitor that includes a high-dielectric material such as $(Ba,Sr)TiO_3$, $SrTiO_3$, or $Ta_2O_5$. Here, it is essential that an oxide film for controlling the interface is provided so as to obtain a larger effective work function, or more particularly, a higher electron barrier. An oxide dielectric material easily has oxygen defects formed therein. When oxygen defects are actually formed, the barrier against electrons tends to become lower. If a high-dielectric material capacitor having the structure of this example incorporated thereinto is used as a DRAM (Dynamic Random Access Memory) capacitor, the charge storing and holding capability becomes high. Accordingly, the refresh operation can be reduced to approximately 10% of a conventional refresh operation. Thus, a high-speed DRAM with high long-term reliability can be obtained.

Example 4

MISFET Using Semiconductor S/D

Figure 30:
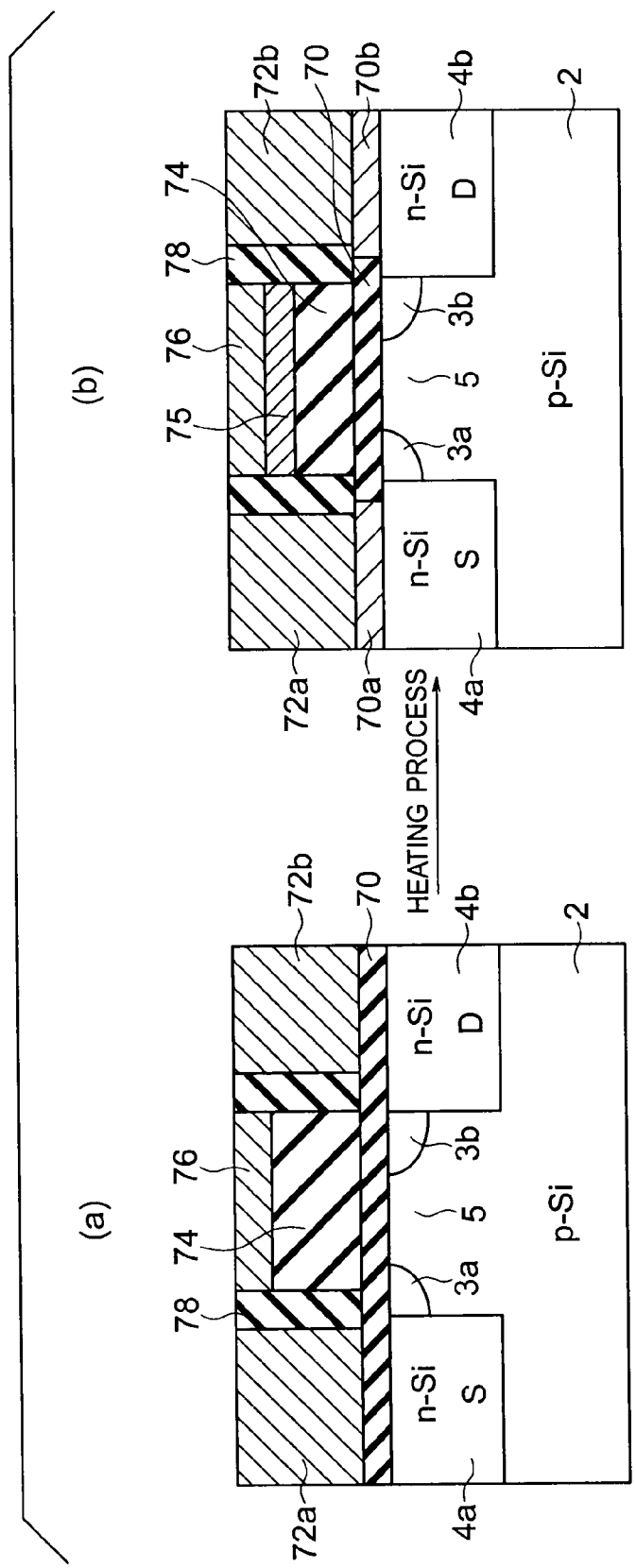
FIGS. 30(a) and 30(b) are cross-sectional diagrams showing the procedures for manufacturing a semiconductor device according to Example 4.

Referring now to FIGS. 30(a) and 30(b), a semiconductor device in accordance with Example 4 of the present invention is described. The semiconductor device of this example is an n-MISFET, and has an interfacial control oxide film between source and drain regions and source and drain metal electrodes. More specifically, as shown in FIG. 30(b), n-Si source regions 3a and 4a, and n-Si drain regions 3b and 4b are formed at a distance from each other on a p-type Si substrate 2. The source and drain regions include extension regions 3a and 3b. The region of the p-type Si substrate located between the source regions 3a and 4a and the drain regions 3b and 4b is a channel region 5. $HfO_2$ films (interfacial control oxide films) 70a and 70b having W added thereto are formed on the source region 4a and the drain region 4b, and a $HfO_2$ film 70 not having W added thereto is formed on the channel region 5. In the source and drain regions 4a and 4b, source and drain metal electrodes 72a and 72b made of W (tungsten), for example, are formed on the $HfO_2$ films 70a and 70b having W added thereto. In the channel region 5, a gate insulating film 74 made of HfSiON, for example, is formed on the $HfO_2$ film 70. A HfSiON film (an interfacial control oxide film) 75 having W added thereto is further formed on the gate insulating film 74. A gate electrode 76 made of W is formed on the HfSiON film (the interfacial control oxide film) 75. Sidewalls 78 made of an insulating material are formed between the source and drain metal electrodes 72a and 72b, and the gate insulating film 74 and the gate electrode 76, so that the gate electrode 76 is insulated from the source and drain metal electrodes 72a and 72b. In FIG. 30(b), the sidewalls 78 are formed, with the $HfO_2$ film 70 existing at the bottom portions of the sidewalls 78. However, the corresponding portions of the $HfO_2$ film 70 may be removed, so that the bottom portions of the sidewalls 78 are in contact with the Si substrate 2. The structure without the corresponding portions of the $HfO_2$ film is shown in FIG. 7(a).

Next, a method for manufacturing the n-MISFET of this example is described.

The stacked structure formed with the n-type Si substrates 4a and 4b, the $HfO_2$ film 70, and the metal electrodes 72a and 72b shown in FIG. 30(a) can be regarded as the stacked structure described in Example 1. The $HfO_2$ film 70 is formed on the n-type Si substrates (semiconductor source and drain) 4a and 4b by sputtering, and the W films 72a, 72b, and 76 are formed on the $HfO_2$ film 70 by sputtering. In this example, however, after the $HfO_2$ film 70 is formed, the gate insulating film 74 is formed, and n-type impurities are introduced into the Si substrate 2, so as to form the extension regions 3a and 3b. After that, a dummy gate electrode (not shown) is formed on the gate insulating film 74, and dummy source and drain electrodes (not shown) are formed on the portions of the $HfO_2$ film 70 located in the source and drain regions. Here, grooves are formed between the dummy electrode and the dummy source and drain electrodes. The sidewalls 78 made of an insulating material are formed to fill the grooves. After the dummy gate electrode and the dummy source and drain electrodes are removed, n-type impurities are introduced into the Si substrate 2, so as to form the source and drain regions 4a and 4b. After that, the gate electrode 76 made of W and the source and drain metal electrodes 72a and 72b made of W are formed at the same time, and flattening is performed by CMP.

An anneal is then performed at 1050° C. in vacuum, and a FGA (forming gas anneal) is performed at 450° C. in a $H_2$ atmosphere. Through this heating process, W diffuses into the portions of the $HfO_2$ film 70 located between the n-type Si source and drain regions 4a and 4b and the source and drain metal electrodes 72a and 72b, and a level in the $HfO_2$ gap is formed in the neighborhood of 3.9 eV in terms of work function. After W diffuses sufficiently, the interfacial control oxide films 70a and 70b formed with $HfO_2$ having W added thereto are formed (see FIG. 30(b)). By adjusting the anneal time and temperature, the interfacial control oxide films 70a and 70b can be hopping-conductive films (the W area density being equal to or more than $6\times10^{12}$ atoms/cm$^2$ to less than $1\times10^{14}$ atoms/cm$^2$) or band-conductive films (the W area density being in the range of $1\times10^{14}$ atoms/cm$^2$ to $8\times10^{14}$ atoms/cm$^2$). Between the two kinds, band-conductive films can have lower resistance as the interfacial control oxide films. Here, approximately $2\times10^{14}$ atoms/cm$^2$ of W in area density is introduced so as to form band-conductive films. At the same time, W also diffuses into the gate insulating film 74 and the gap between the gate insulating film 74 made of HfSiON and the gate electrode 76 made of W, so as to form the interfacial control oxide film 75. The interfacial control oxide film 75 has a level in the gap of a Hf silicate (HfSiO) formed in the neighborhood of 4.1 eV in work function. This interfacial control oxide film 75 has both tungsten W and nitrogen N introduced into a Hf silicate. Through the addition of tungsten W, the level in the gap is formed, and electrons are transferred to nitrogen through the level. Accordingly, the level in the gap becomes deeper. As a result, the level in the gap is formed in the neighborhood of 4.1 eV. By properly controlling the processing conditions for forming the interfacial control oxide films 70a and 70b and the interfacial control oxide film 75 in this manner, the work function can be optimized.

(Modification 1)

Figure 31:
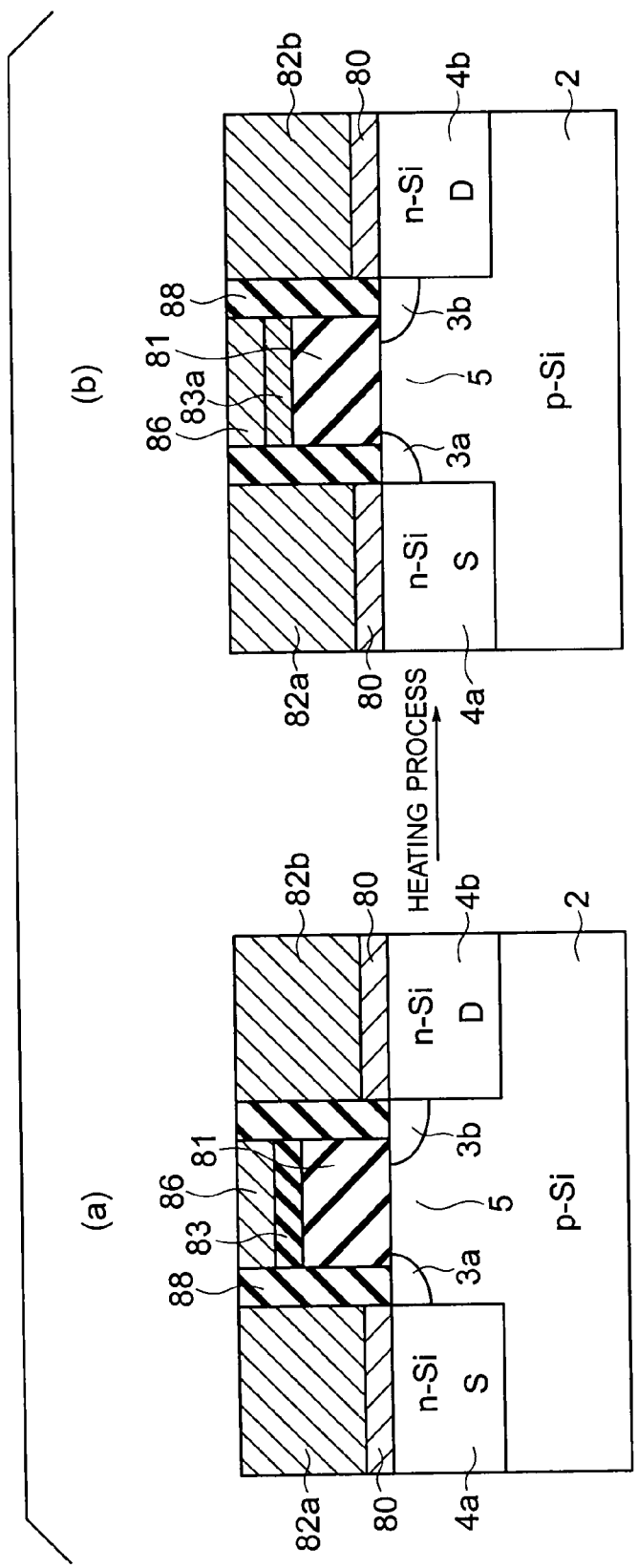
FIGS. 31(a) and 31(b) are cross-sectional diagrams showing the procedures for manufacturing a semiconductor device according to Modification 1 of Example 4.

Referring now to FIGS. 31(a) and 31(b), an n-MISFET in accordance with Modification 1 of Example 4 is described. As shown in FIG. 31(b), the n-MISFET of this modification differs from the n-MISFET of Example 4 in that TiN, instead of W, is used as the source and drain metal electrodes and the gate electrode, and $(Hf,Zr)O_2$ films 80 having Nb added thereto are formed between the n-type Si source and drain regions 4a and 4b and the source and drain electrodes 82a and 82b made of TiN. In this specification, notation (Hf,Zr) means that both Hf and Zr are contained. A gate insulating film 81 made of HfON is formed on the channel region 5. A (Hf,Zr)ON film (an interfacial control oxide film) 83a is formed on the gate insulating film 81, and a gate electrode 86 made of TiN is formed on the (Hf,Zr)ON film 83a. Sidewalls 88 made of an insulating material are formed between the gate electrode 86 and the source and drain metal electrodes 82a and 82b. In this modification, the bottom portions of the sidewalls 88 are in contact with the Si substrate 2.

The $(Hf,Zr)O_2$ films 80 having Nb added thereto and a $(Hf,Zr)O_2$ film 83 (see FIG. 31(a)) having Nb added thereto but not having N added thereto are formed by performing sputtering simultaneously on three targets: a $HfO_2$ target, a $ZrO_2$ target, and a Nb target. In this modification, film formation is performed, while the power supply to the $ZrO_2$ target is restricted, so that Hf/(Hf+Zr) becomes equal to 0.95.

Next, a method for manufacturing the n-MISFET of this modification is briefly described. The gate insulating film 81 made of HfON is formed on the channel region 5 of the p-type Si substrate 2. The extension regions 3a and 3b are formed by injecting n-type impurities into the Si substrate 2. After that, the $(Hf,Zr)O_2$ films 80 and 83 having Nb added thereto are formed on the entire surface. A resist is then applied onto the entire surface, and patterning is performed so as to form a dummy gate electrode (not shown) made of the resist and dummy source and drain electrodes (not shown). At this point, patterning is also performed on the $(Hf,Zr)O_2$ films 80 and 83 having Nb added thereto, so as to form grooves (not shown) between the dummy gate electrode and the dummy source and drain electrodes. The sidewalls 88 are then formed by filling the grooves with an insulating material, and the dummy gate electrode and the dummy source and drain electrodes are removed. After that, n-type impurities are injected into the Si substrate 2, so as to form the source and drain regions 4a and 4b. The metal electrodes made of TiN are then formed, and flattening is performed by CMP. An anneal is then performed at 1050° C. in vacuum, and a FGA (forming gas anneal) is performed at 450° C. in a $H_2$ atmosphere.

In the n-MISFET formed in this manner, the $(Hf,Zr)O_2$ films 80 having Nb added thereto between the n-type Si source and drain regions 4a and 4b and the TiN source and drain metal electrodes 82a and 82b have a level in the $HfO_2$ gap formed in the neighborhood of 3.3 eV in work function. Through the above heating process, the $(Hf,Zr)O_2$ film 83 having Nb added thereto causes an reaction at the interface with the gate insulating film 81 made of HfON, and turns into the (Hf,Zr)ON film 83a having Nb added thereto (see FIG. 31(b)). Having nitrogen added thereto, the (Hf,Zr)ON film 83a also having Nb added thereto has a work function as large as 4.1 eV. The work function of 3.3 eV can be used as the work function of the $(Hf,Zr)O_2$ films 80 that connect the source and drain regions 4a and 4b to the source and drain metal electrodes 82a and 82b, and has Nb added thereto. However, at the connecting portions between the gate insulating film 81 and the gate electrode 86 made of a metal, the work function needs to be optimized by the technique in accordance with an embodiment of the present invention.

Although N is added through a heating process in this modification, it is also possible to add N, C, B, Mg, Ca, Sr, Ba, Al, Sc, Y, La, Ce, Pr, Nd, Pm, Sm, Eu, Gd, Tb, Dy, Ho, Er, Tm, Yb, or Lu to the Nb-added $(Hf,Zr)O_2$ film 83 through ion implantation, or introduce nitrogen into the Nb-added $(Hf,Zr)O_2$ film 83 through plasma nitridation, before the gate electrode is formed. It is of course possible to introduce nitrogen or the like into the connecting portions between the source and drain regions 4a and 4b and the source and drain metal electrodes, and shift the level closer to the conduction band edge of silicon. This is because it is considered that both can be optimized in this manner, without any notable adjustment being made on the interfaces between the gate insulating film and the metal gate electrodes.

The following are examples of combinations of materials in Modification 1. The base material is an oxide film including at least one of Hf and Zr, i.g., $HfO_2$, $ZrO_2$, $(Hf,Zr)O_2$, Hf silicate, Zr silicate, or Hf and Zr silicate, and at least one material selected from W and Nb is added to the base material, so as to form a level in the gap. The level can be effectively used. Further, an oxide film that has a work function optimized by introducing at least one material selected from the group including N, C, B, Mg, Ca, Sr, Ba, Al, Sc, Y, La, Ce, Pr, Nd, Pm, Sm, Eu, Gd, Tb, Dy, Ho, Er, Tm, Yb, and Lu can be used as interfacial control oxide films.

Alternatively, the base material is an oxide film including at least one of Hf and Zr, i.g., $HfO_2$, $ZrO_2$, $(Hf,Zr)O_2$, Hf silicate, Zr silicate, or Hf and Zr silicate, and at least one material selected from the group including Mo, V, Cr, Mn, Tc, and Re is added to the base material, so as to form a level in the gap. An oxide film that has a work function optimized by introducing at least one material selected from the group including Ta, F, and H can be used as interfacial control oxide films. The introduction of each element may be performed not only by a co-sputtering technique. Some of the elements may be introduced from a film forming atmosphere, introduced through ion implantation, or introduced after film formation like plasma nitridation. In a case where Cr and Ta are introduced, for example, either Cr or Ta may be introduced first. A HfTaO film may be formed first, and a Cr film may be formed on the HfTaO film, so as to cause thermal diffusion. It is possible to use a co-sputtering technique that involves three targets of a Cr target, a Ta target, and a $HfO_2$ target in an $Ar/O_2$ atmosphere.

(Modification 2) Memory Cell

Figure 32:
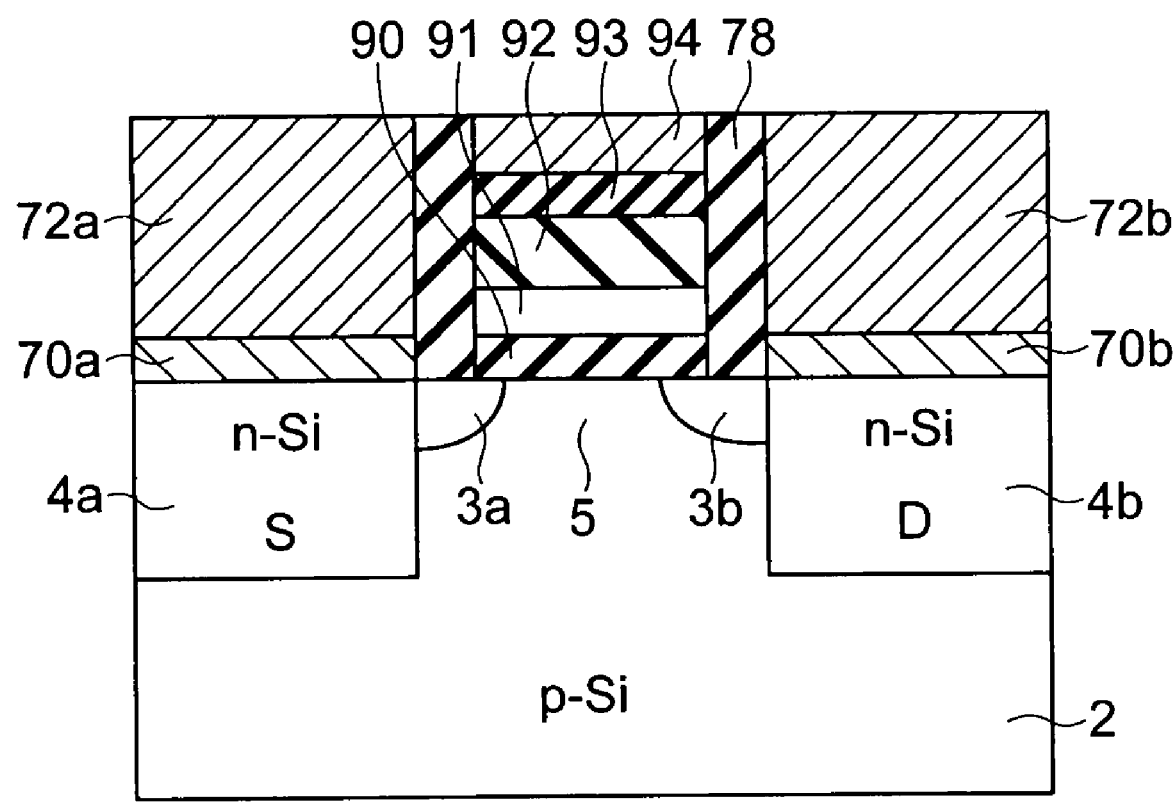
FIG. 32 is a cross-sectional diagram showing the procedures for manufacturing a semiconductor device according to Modification 2 of Example 4.

FIG. 32 shows a semiconductor device in accordance with Modification 2 of Example 4. The semiconductor device of this modification is a nonvolatile semiconductor memory device, and FIG. 32 is a cross-sectional view of a memory cell of the semiconductor memory device. As shown in FIG. 32, this memory cell has n-type Si source regions 3a and 4a and drain regions 3b and 4b formed at a distance from each other on a p-type Si substrate 2. Those source and drain regions include extension regions 3a and 3b. The region of the p-type Si substrate located between the source regions 3a and 4a and the drain regions 3b and 4b is a channel region 5. $HfO_2$ films (interfacial control oxide films) 70a and 70b having W added thereto are formed on the source region 4a and the drain region 4b, and source and drain electrodes 72a and 72b made of W are formed on the $HfO_2$ films 70a and 70b. On the channel region 5, a tunnel insulating film 90, a charge storing film 91, a block insulating film 92, a HfSiON film (an interfacial control oxide film) 93 having W added thereto, and a control electrode 94 made of W are stacked in this order. Sidewalls 78 made of an insulating material are formed between the stacked film formed with the tunnel insulating film 90, the charge storing film 91, the block insulating film 92, the HfSiON film (the interfacial control oxide film) 93 having W added thereto, and the control electrode 94 made of W, and the interfacial control oxide films 70a and 70b and the source and drain electrodes 72a and 72b. Accordingly, the stacked film is insulated from the interfacial control oxide films 70a and 70b and the source and drain electrodes 72a and 72b.

In this structure, the threshold value is controlled by storing charges, and the structure can operate as a memory by determining whether or not the channel is on. Also, lower resistance can be achieved by controlling the work function between the semiconductor source and drain regions and the source and drain metal electrodes. Thus, power consumption can be reduced.

As the tunnel insulating film (the insulating film for causing charge tunneling), an insulating film such as a $SiO_2$ film is used. The charge storing film 91 may be a floating gate (FG) electrode such as n-type polysilicon, or a trap insulating film such as a silicon nitride film, a Ru-added $SrTiO_3$ film, which can store charges or trap charges. The block insulating film 92 may be an insulating film with a large dielectric constant, such as a $LaAlO_3$ film, a $HfO_2$ film, or a $Al_2O_3$ film. The block insulating film 92 is designed not to allow the charges stored in the charge storing film 91 to move to the control electrode 94. A stacked structure should be formed so that the respective films can play the respective roles. Particularly, it is essential to form a structure that does not easily cause diffusion between the films, with interdiffusion being taken into consideration. Basically, charges are introduced and released by virtue of the tunneling effect of the tunnel insulating film from the channel side. Particularly, wrong charge injection from the control electrode 94 (made of W, for example) should be prevented. Therefore, in this modification, the interface of the block insulating film 92 on the side of the control electrode 94 is nitrided, and a $HfO_2$ oxide film is inserted into the interface with the control electrode. A heating process is then carried out, so that the interface turns into the HfON film (the interfacial control oxide film) 93 having W added thereto. Thus, a structure that has a large work function (approximately 5.7 eV) and prevents wrong charge injection from the control electrode 94 made of W is formed.

In this modification, W diffuses into the $HfO_2$ film between the semiconductor source and drain regions 4a and 4b and the source and drain electrodes 72a and 72b made of W, and a contact of 3.9 eV in terms of work function is formed. In short, an ohmic connection is established. This structure is very effective in a memory cell such as a NOR memory cell that performs control through a contact with the source and drain regions. In a NAND cell, only a partial contact is made with the source and drain regions. However, a contact is always made at the end portions of a NAND cell, and a large current flows in the structure. Therefore, lower contact resistance (being ohmic) is very important in reducing power consumption. However, conventional MISFETs may be used at the end portions, and in such a case, MISFETs of this example may be used. Regardless of whether the structure is of the NOR type or of the NAND type, memories of different structures can be used, without attention being paid to the power consumption, as long as the contact with the source and drain regions is ohmic. In view of this, controlling contact resistance is very effective.

(Modification 3) p-MISFET

Figure 33:
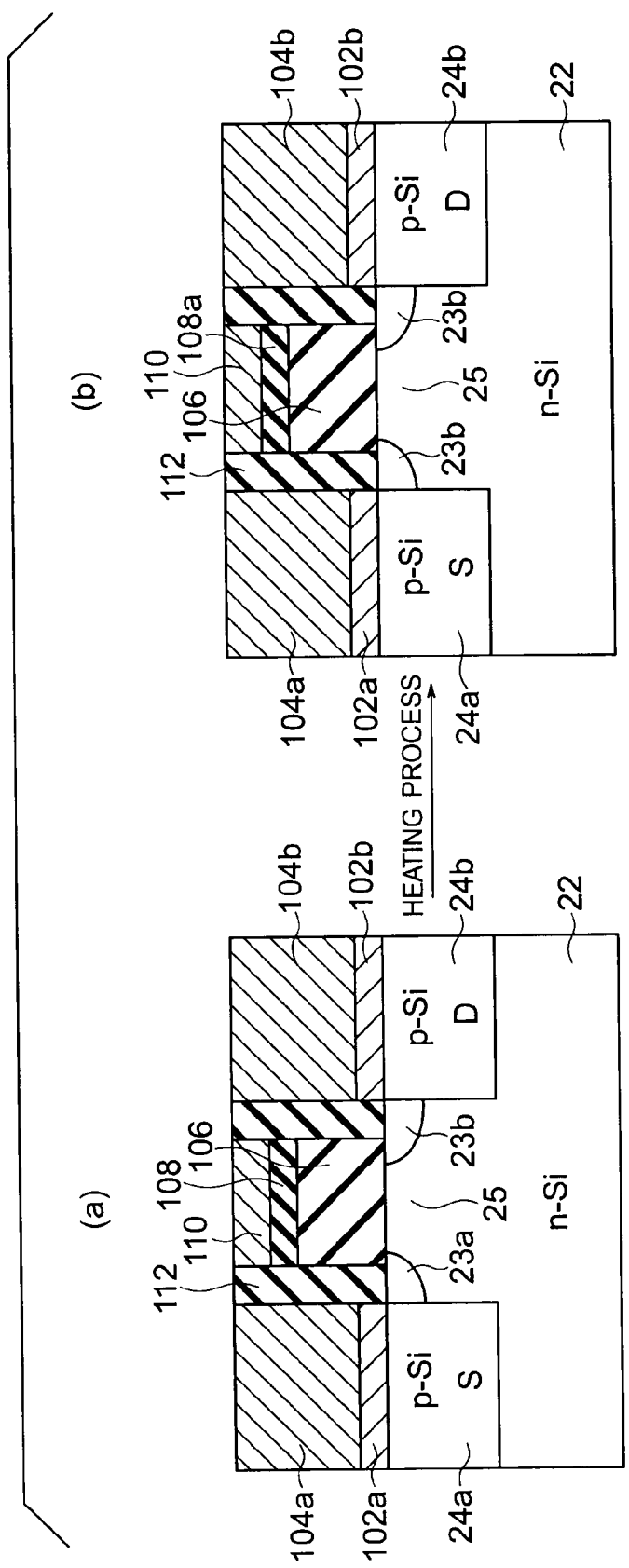
FIGS. 33(a) and 33(b) are cross-sectional diagrams showing the procedures for manufacturing a semiconductor device according to Modification 3 of Example 4.

Referring now to FIGS. 33(a) and 33(b), a semiconductor device in accordance with Modification 3 of Example 4 is described. The semiconductor device of this modification is a p-MISFET that has interfacial control oxide films between the source and drain regions and the source and drain metal electrodes. More specifically, as shown in FIG. 33(b), p-type Si source regions 23a and 24a and drain regions 23b and 24b are formed at a distance from each other on an n-type Si substrate 22. Those source and drain regions include extension regions 23a and 23b. The region of the n-type Si substrate located between the source regions 23a and 24a and the drain regions 23b and 24b is a channel region 25. $ZrO_2$ films (interfacial control oxide films) 102a and 102b having V added thereto are formed on the source and drain regions 24a and 24b. A HfTaON film 106 is formed on the channel region 25. In the source and drain regions 24a and 24b, source and drain metal electrodes 104a and 104b made of W (tungsten) are formed on the $ZrO_2$ films 102a and 102b having V added thereto. In the channel region 25, a $ZrO_2$ film (an interfacial control oxide film) 108a having V and Ta added thereto is formed on the gate insulating film 106 made of HfTaON, an a gate electrode 110 made of W is formed on the $ZrO_2$ film 108a. Sidewalls 112 made of an insulating material are formed between the stacked structure formed with the gate insulating film 106, the $ZrO_2$ film 108a, and the gate electrode 110, and the stacked structures formed with the V-added $ZrO_2$ films (the interfacial control oxide films) 102a and 102b and the source and drain metal electrodes 104a and 104b. In this manner, the gate electrode 110 is insulated from the source and drain metal electrodes 104a and 104b.

In this modification, the V-added $ZrO_2$ films are formed by performing sputtering simultaneously on two targets of a $ZrO_2$ target and a V target.

Next, a method for manufacturing the p-MISFET of this modification is briefly described. The gate insulating film 106 made of HfTaON is formed on the channel region 25 of the n-type Si substrate 22. The extension regions 23a and 23b are formed at the both sides of the gate insulating film 106 by injecting p-type impurities into the Si substrate 22. After that, the V-added $ZrO_2$ films 102a, 102b, and 108 are formed on the entire surface. A resist is then applied onto the entire surface, and patterning is performed so as to form a dummy gate electrode (not shown) made of the resist and dummy source and drain electrodes (not shown). At this point, patterning is also performed on the V-added $ZrO_2$ films 102a, 102b, and 108, so as to form grooves (not shown) between the dummy gate electrode and the dummy source and drain electrodes. The sidewalls 112 are then formed by filling the grooves with an insulating material, and the dummy gate electrode and the dummy source and drain electrodes are removed. After that, p-type impurities are injected into the Si substrate 22, so as to form the source and drain regions 24a and 24b at the both sides of the gate insulating film 106. The metal electrodes made of TiN are then formed, and flattening is performed by CMP. An anneal is then performed at 1050° C. in vacuum, and a FGA (forming gas anneal) is performed at 450° C. in a $H_2$ atmosphere.

In the p-MISFET formed in this manner, the V-added $ZrO_2$ films 102a and 102b between the p-type Si source and drain regions 24a and 24b and the TiN source and drain metal electrodes 104a and 104b have a level in the $ZrO_2$ gap formed in the neighborhood of 6.2 eV in work function. Through the above heating process, the $ZrO_2$ film 108 having V added thereto causes an reaction at the interface with the gate insulating film 106 made of HfTaON, and turns into the $ZrO_2$ film 108a having V and Ta added thereto (see FIG. 33(b)). Having Ta added thereto, the $ZrO_2$ film 108 also having V added thereto has a work function as small as 5.0 eV. The work function of 6.2 eV can be used as the work function of the $ZrO_2$ films 102a and 102b that connect the source and drain regions 24a and 24b to the source and drain metal electrodes 104a and 104b, and has V added thereto. However, at the connecting portions between the gate insulating film 106 and the gate electrode 110 made of a metal, the work function needs to be optimized by the technique in accordance with an embodiment of the present invention.

Although Ta is added through a heating process in this modification, it is also possible to add Ta, F, or H to the V-added $ZrO_2$ film by performing ion implantation or exposing the V-added $ZrO_2$ film to excited hydrogen, before the gate electrode is formed. It is of course possible to introduce Ta or the like into the connecting portions between the source and drain regions and the source and drain metal electrodes, and shift the level closer to the valence band edge of silicon. This is because it is considered that both can be optimized in this manner, without any notable adjustment being made on the interfaces between the gate insulating film and the metal gate electrodes.

The following are examples of combinations of materials in Modification 3. The base material is an oxide film including at least one of Hf and Zr, i.g., $HfO_2$, $ZrO_2$, $(Hf,Zr)O_2$, Hf silicate, Zr silicate, or Hf and Zr silicate, and Nb, W, or Mo (Type-A, Type-B) is added to the base material, so as to form a level in the gap. Further, an oxide film that has a work function optimized by introducing at least one material selected from the group including N, C, B, Mg, Ca, Sr, Ba, Al, Sc, Y, La, Ce, Pr, Nd, Pm, Sm, Eu, Gd, Tb, Dy, Ho, Er, Tm, Yb, and Lu can be used as interfacial control oxide films.

Alternatively, the base material is an oxide film including at least one of Hf and Zr, i.g., $HfO_2$, $ZrO_2$, $(Hf,Zr)O_2$, Hf silicate, Zr silicate, or Hf and Zr silicate, and at least one material selected from the group including V, Cr, Mn, Tc, and Re is added to the base material, so as to form a level in the gap. The resultant oxide film can also be used as interfacial control oxide films. This is particularly effective in a case where there is not a second added material such as F. Further, an oxide film that has a work function optimized by introducing at least one material selected from the group including Ta, F, and H can be used as interfacial control oxide films. This is particularly effective in a case where there is a second added material such as F. The introduction of each element may be performed not only by a co-sputtering technique. Some of the elements may be introduced from a film forming atmosphere, introduced through ion implantation, or introduced after film formation like excited hydrogen. In a case where V and Ta are introduced, for example, either V or Ta may be introduced first. A HfTaO film may be formed first, and a V film may be formed on the HfTaO film, so as to cause thermal diffusion. It is possible to use a co-sputtering technique that involves three targets of a V target, a Ta target, and a $HfO_2$ target in an $Ar/O_2$ atmosphere.

By optimizing the interfacial control oxide films between the gate insulating film and the metal gate electrodes, it is possible to cope with a MISFET having a SOI substrate. The work function should be simply shifted closer to the center of the gap of the SOI layer. This can be readily realized by a technique in accordance with an embodiment of the present invention. This can be realized even with a completely-depleted substrate, and this indicates that the technique in accordance with an embodiment of the present invention covers a very wide range.

It is essential that the work function can be freely adjusted by the technique in accordance with an embodiment of the present invention. Flexible adjustments are required collectively at the connecting portions between the semiconductor source and drain regions and the source and drain metal electrodes, and the connecting portions between the gate insulating film and the metal gate electrodes.

Example 5

MISFET Using Metal S/D

Figure 34:
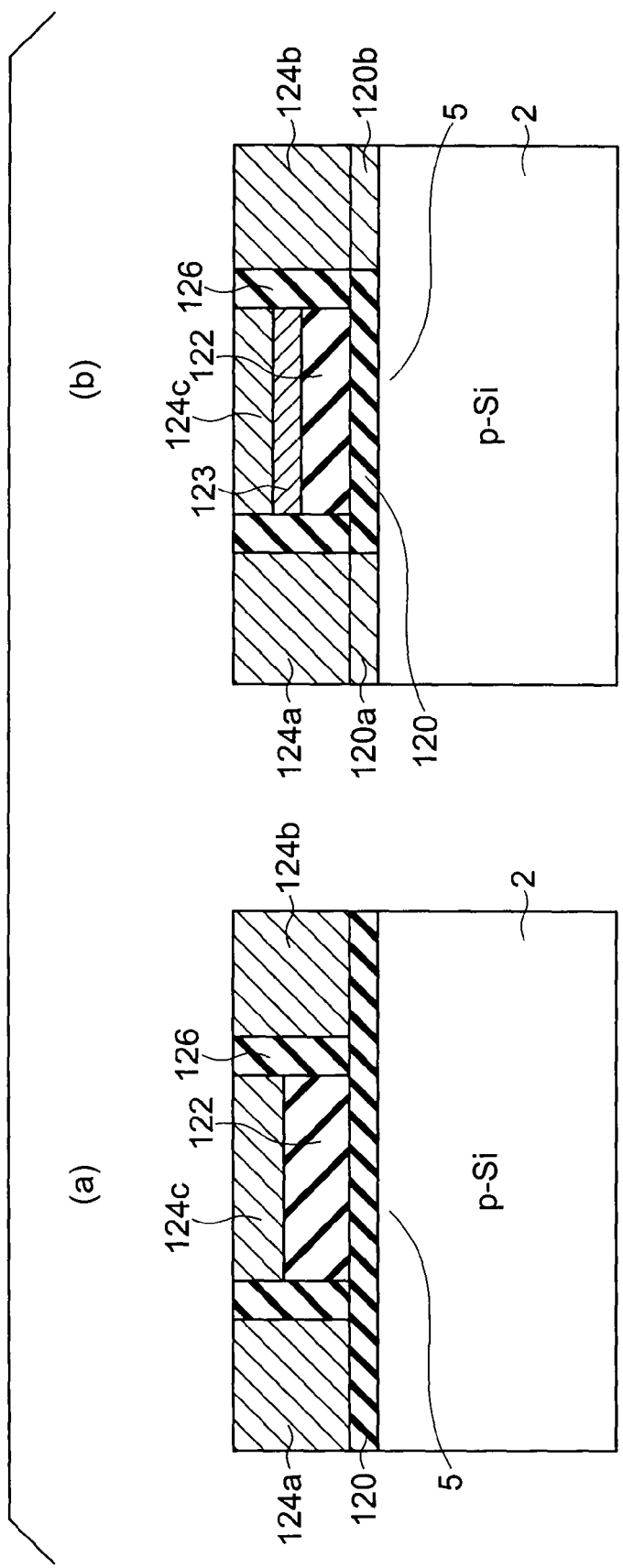
FIGS. 34(a) and 34(b) are cross-sectional diagrams showing the procedures for manufacturing a semiconductor device according to Example 5.
Figure 35:
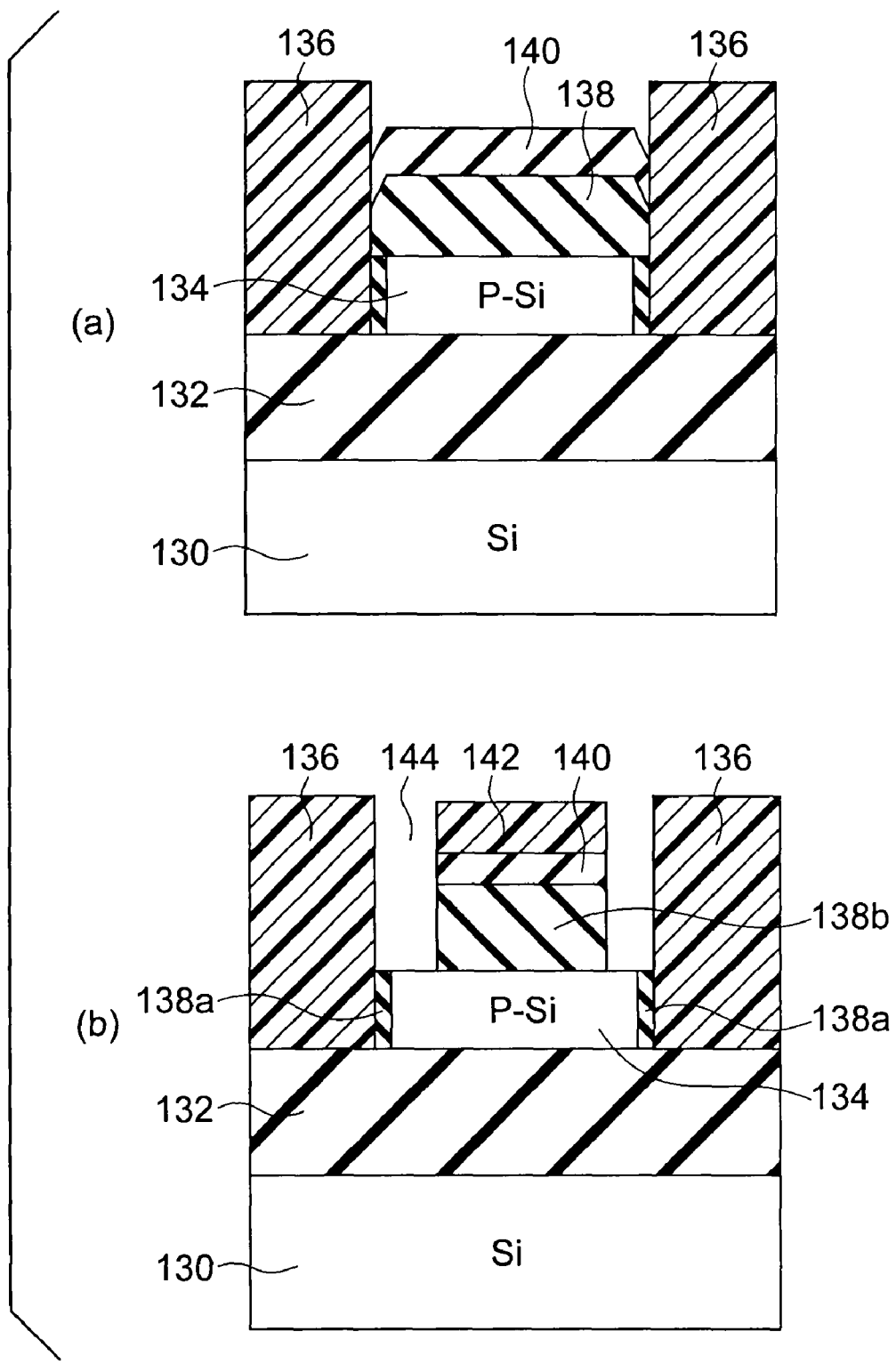
Figure 36:
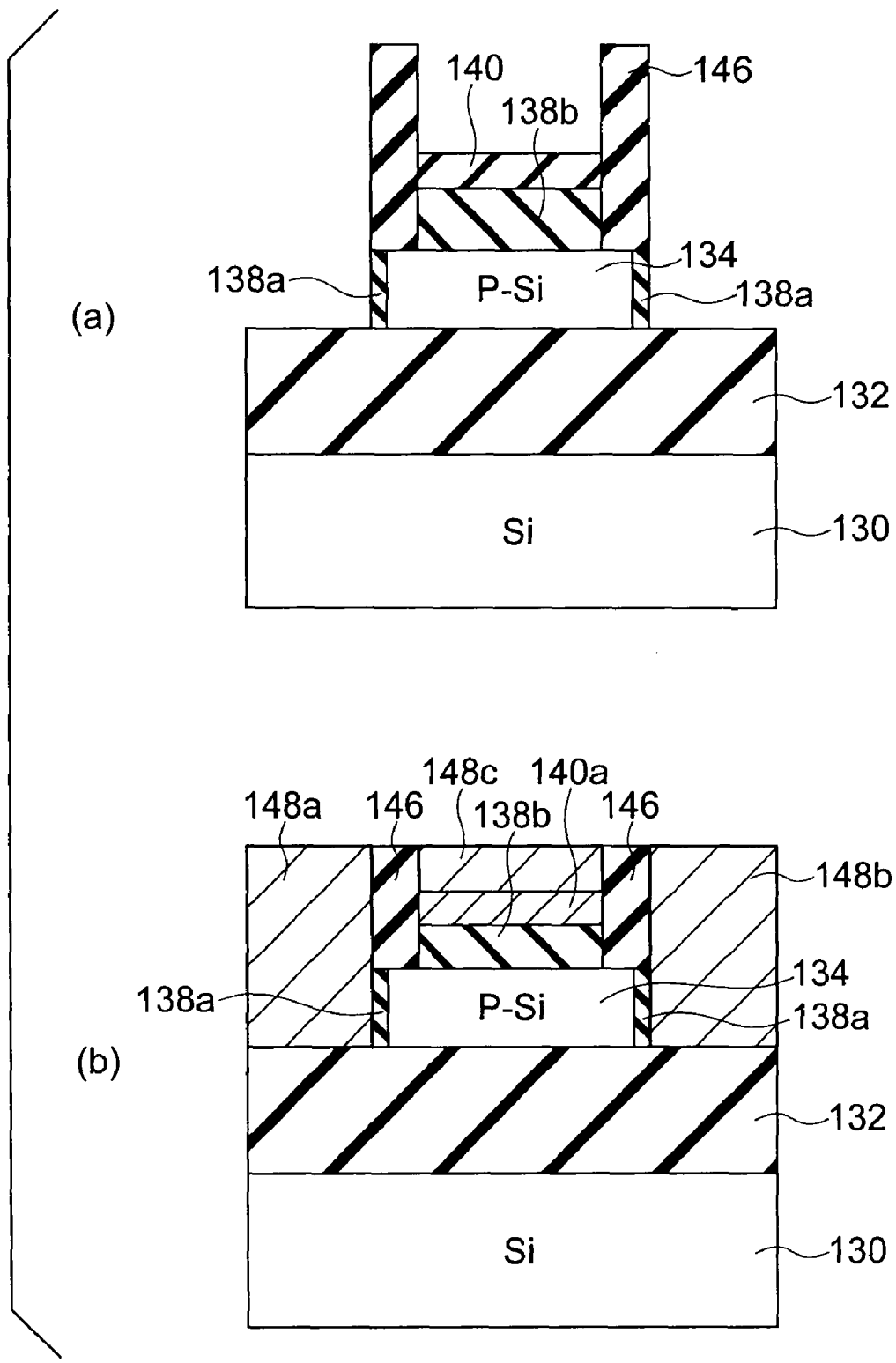

Referring now to FIGS. 34(a) and 34(b), a semiconductor device in accordance with Example 5 of the present invention is described. The semiconductor device of this example is an n-MISFET, and has W-added $HfO_2$ films (interfacial control oxide films) 120a and 120b formed between a channel region 5 formed in the surface of a p-type Si substrate 2 and source and drain regions (source and drain electrodes) 124a and 124b made of W, as shown in FIG. 34(b). A $HfO_2$ film 120 not having W added thereto is formed on the channel region 5 between the $HfO_2$ films 120a and 120b having W added thereto. A gate insulating film 122 made of HfSiON is formed on the $HfO_2$ film 120. A HfSiON film (an interfacial control oxide film) 123 having W added thereto is further formed on the gate insulating film 122. A gate electrode 124c made of W is formed on the interfacial control oxide film 123. The stacked structure formed with the gate insulating film 122, the interfacial control oxide film 123, and the gate electrode 124c is insulated from the source and drain electrodes 124a and 124b by sidewalls 126 made of an insulating material. In this example, the $HfO_2$ film 120 exists at the bottom portions of the side walls 126. However, the portions of the HfO$_2$ film 120 located at the bottom portions may be removed, so that the bottom portions of the sidewalls 126 are in direct contact with the Si substrate 2, as shown in FIG. 9(a). Alternatively, part of the source and drain electrodes made of a metal may be buried in the Si substrate 2, and interfacial control oxide films may be formed between the part of the source and drain electrodes and the channel region 5, as shown in FIG. 10(a).

Next, a method for manufacturing the n-MISFET of this example is described.

As shown in FIG. 34(a), the HfO$_2$ film 120 is formed on the channel 5 of p-type silicon by sputtering. The gate insulating film 122 made of HfSiON is then formed. After that, a dummy gate electrode (not shown) and dummy source and drain electrodes (not shown) are formed. Here, isolation grooves are formed between the dummy electrode and the dummy source and drain electrodes. The isolation grooves are filled with an insulating material, so as to form the sidewalls 126. W films are then formed by sputtering, so as to simultaneously form the source and drain electrodes 124a and 124b made of W and the gate electrode 124c made of W. Flattening is then performed by CMP.

An anneal is then performed at 1050° C. in vacuum, and a FGA (forming gas anneal) is performed at 450° C. in a H$_2$ atmosphere. Through this heating process, W diffuses into the portions of the HfO$_2$ film 120 located between the p-type Si channel 5 and the source and drain electrodes 124a and 124b, and a level in the HfO$_2$ gap is formed in the neighborhood of 3.9 eV in terms of work function. After W diffuses sufficiently, the HfO$_2$ film 120 turns into the HfO$_2$ films (the interfacial control oxide films) 120a and 120b having W added thereto (see FIG. 34(b)). By adjusting the anneal time and temperature, the interfacial control oxide films can be hopping-conductive films (the W area density being equal to or more than $6\times10^{12}$ atoms/cm$^2$ to less than $1\times10^{14}$ atoms/cm$^2$) or band-conductive films (the W area density being in the range of $1\times10^{14}$ atoms/cm$^2$ to $8\times10^{14}$ atoms/cm$^2$). Between the two kinds, band-conductive films can have lower resistance as the interfacial control oxide films. Here, approximately $2\times10^{14}$ atoms/cm$^2$ of W in area density is introduced so as to form band-conductive films. At the same time, W also diffuses into the gate insulating film 122 and the gap between the gate insulating film 122 made of HfSiON and the gate electrode 124c made of W, so as to form the HfSiON film (the interfacial control oxide film) 123 having W added thereto. The interfacial control oxide film 123 has a level in the gap of Hf silicate formed in the neighborhood of 4.1 eV in terms of work function. This interfacial control oxide film 123 has both tungsten W and nitrogen N introduced into Hf silicate. Through the addition of tungsten W to the HfSiON film, the level in the gap is formed, and electrons are transferred to nitrogen through the level. Accordingly, the level in the gap becomes deeper. As a result, the level in the gap is formed in the neighborhood of 4.1 eV. By properly forming the interfacial control oxide films 120a and 120b and the interfacial control oxide film 123 in this manner, the work function can be optimized.

At this point, the n-MISFET having the metal source and drain is completed. Since a large barrier against holes exists in a channel-off state, as shown in FIGS. 9(b) and 10(b), a MISFET having very little junction leakage can be obtained. Since there is not a barrier against electrons in a channel-on state, there is no contact resistance, and ohmic contact is established. Furthermore, band conduction through the level in the bandgap is realized (the W area density being in the range of $1\times10^{14}$ atoms/cm$^2$ to $8\times10^{14}$ atoms/cm$^2$), and new tunnel resistance is not generated. If the amount of the added material is small, hopping conduction (the W area density being equal to or more than $6\times10^{12}$ atoms/cm$^2$ to less than $1\times10^{14}$ atoms/cm$^2$) is established. In this case, the tunnel resistance is much lower than tunnel resistance beyond comparison. Contact resistance control using tunnel resistance has been suggested, but does not fulfill the purpose, as tunnel resistance is generated. In this example, tunnel resistance is not generated, and contact resistance can be freely controlled. Here, the tunnel resistance is the resistance of a tunneling effect generated by the overlap of the wave functions on both sides of the insulating film, without intervention of the level in the gap. On the other hand, band conduction and hopping conduction are conduction through the level in the gap, and are completely free of tunnel resistance.

(Modification 1)

Referring now to FIGS. 35(a) to 36(b), an n-MISFET in accordance with Modification 1 of Example 5 is described. FIGS. 35(a) to 36(b) are cross-sectional views showing the procedures for manufacturing the n-MISFET of this modification. The n-MISFET of this modification is formed on a SOI substrate that includes a supporting substrate 130, a buried insulating film 132, and a SOI layer 134 made of p-type silicon.

First, patterning is performed on the SOI layer, so as to form a channel region 134. A resist pattern 136 is then formed on the buried insulating film 132, so that a space is formed between the resist pattern 136 and each side face of the channel region 134. With the resist pattern serving as a mask, a HfO$_2$ film 138 that covers the side faces and upper face of the channel region 134 is formed. Further, a HfON film 140 that covers the HfO$_2$ film 138 is formed (see FIG. 35(a)).

A resist pattern 142 is formed on the HfON film 140. With the resist pattern 142 serving as a mask, patterning is performed on the HfON film 140 and the HfO$_2$ film 138 (see FIG. 35(b)). The patterned HfO$_2$ film 138b is the gate insulating film. At this point, grooves 144 are formed between the resist pattern 136 and the stacked film formed with the patterned HfO$_2$ film 138b and the HfON film 140 (see FIG. 35(b)). A HfO$_2$ film 138a is left between the resist pattern 136 and each side face of the channel region 134.

The grooves 144 are then filled with an insulating material made of SiN, so as to form sidewalls 146. After that, the resist patterns 136 and 142 are removed (see FIG. 36(a)). Sputtering is then performed to deposit W on the entire surface, and flattening is performed by CMP. In this manner, source and drain electrodes 148a and 148b made of W are formed on the buried insulating film 132, and a gate electrode 148c made of W is formed on the HfON film 140.

An anneal is then performed at 1050° C. in vacuum, and a FGA (forming gas anneal) is performed at 450° C. in a H$_2$ atmosphere. Through this heating process, W diffuses into the portions of the HfO$_2$ film 138a located between the p-type Si channel 134 and the source and drain electrodes 148a and 148b, and a level in the HfO$_2$ gap is formed in the neighborhood of 3.9 eV in terms of work function. After W diffuses sufficiently, the HfO$_2$ film 138a turns into the HfO$_2$ films (the interfacial control oxide films) 138a having W added thereto (see FIG. 36(b)). By adjusting the anneal time and temperature, the interfacial control oxide films can be hopping-conductive films (the W area density being equal to or more than $6\times10^{12}$ atoms/cm$^2$ to less than $1\times10^{14}$ atoms/cm$^2$) or band-conductive films (the W area density being in the range of $1\times10^{14}$ atoms/cm$^2$ to $8\times10^{14}$ atoms/cm$^2$). Between the two kinds, band-conductive films can have lower resistance as the interfacial control oxide films. In this modification, approximately $2\times10^{14}$ atoms/cm$^2$ of W in area density is introduced so as to form band-conductive films. At the same time, W also diffuses into the HfON film 140 from the gate electrode 148c made of W, so as to form the HfON film (the interfacial control oxide film) 140a having W added thereto. The interfacial control oxide film 140a has a level in the gap of Hf oxide formed in the neighborhood of 4.2 eV in terms of work function. This interfacial control oxide film 140a has both W and N introduced into the Hf oxide. Through the addition of tungsten W, the level in the gap is formed in the HfON film, and electrons are transferred to nitrogen through the level. Accordingly, the level in the gap becomes deeper. As a result, the level in the gap is formed in the neighborhood of 4.1 eV.

(Modification 2)

Figure 37:
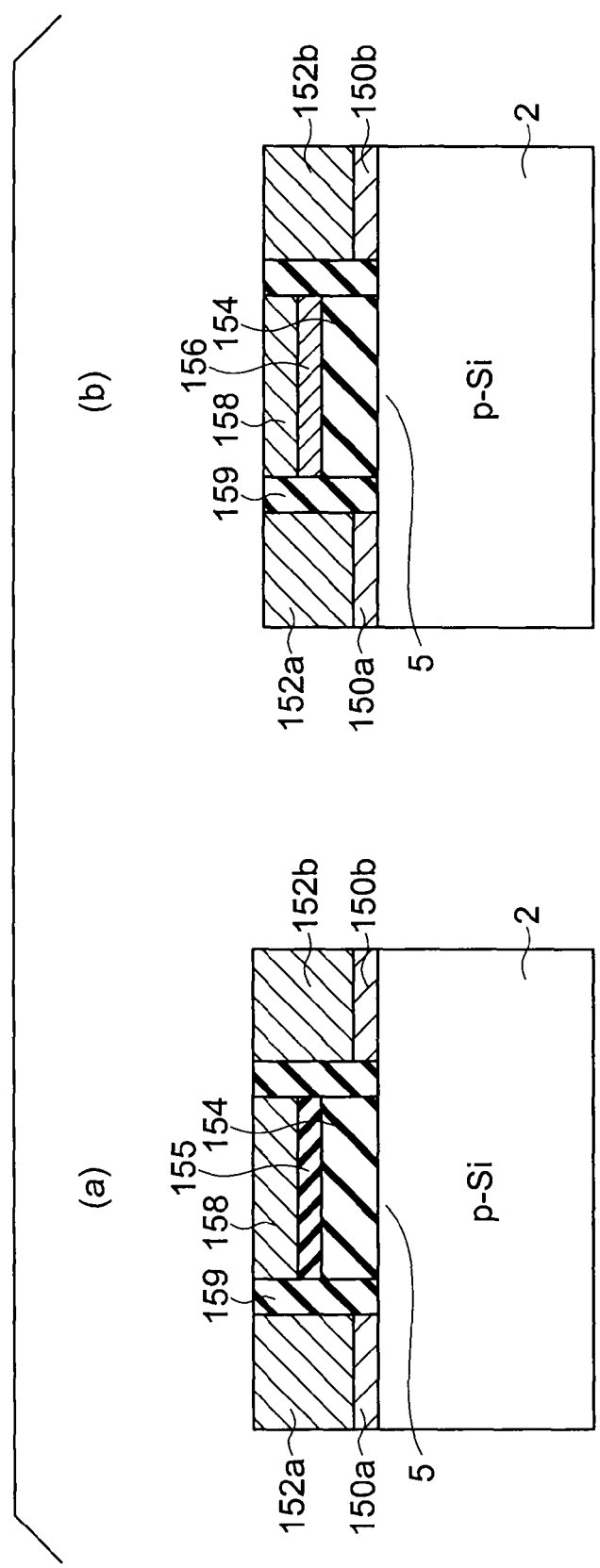
FIGS. 37(a) and 37(b) are cross-sectional diagrams showing the procedures for manufacturing a semiconductor device according to Modification 2 of Example 5.

Referring now to FIGS. 37(a) and 37(b), an n-MISFET in accordance with Modification 2 of Example 5 is described. As shown in FIG. 37(b), the n-MISFET of this modification has W-added $HfO_2$ films (interfacial control oxide films) 150a and 150b formed between a channel region 5 provided in the surface of a p-type Si substrate 2 and source and drain regions (source and drain electrodes) 152a and 152b made of TiN. A gate insulating film 154 made of HfSiON is formed on the channel region 5 between the W-added $HfO_2$ films 150a and 150b. A HfON film (an interfacial control oxide film) 156 having W added thereto is formed on the gate insulating film 154, and a gate electrode 158 made of TiN is formed on the interfacial control oxide film 156. The stacked structure formed with the gate insulating film 154, the interfacial control oxide film 156, and the gate electrode 158 is insulated from the source and drain electrodes 152a and 152b by sidewalls 159 made of an insulating material.

Next, a method for manufacturing the n-MISFET of this modification is described.

The gate insulating film 154 made of HfSiON is first formed on the channel region 5 of p-type silicon. After that, a $HfO_2$ film having W added thereto is formed on the entire surface. The W-added $HfO_2$ film is formed by performing sputtering simultaneously on two targets of a $HfO_2$ target and a W target. After that, a photoresist is applied onto the entire surface, and exposing and developing are performed, so as to form a dummy gate electrode (not shown) and dummy source and drain electrodes (not shown). At this point, patterning is also performed on the W-added $HfO_2$ film, so that the portions of the $HfO_2$ film existing below the dummy source and drain electrodes turns into the W-added $HfO_2$ films 150a and 150b, and the portion of the $HfO_2$ film existing between the gate insulating film 154 and the dummy gate electrode turns into the W-added $HfO_2$ film 155 (see FIG. 37(a)). At this point, isolation grooves are formed between the dummy gate electrode and the dummy source and drain electrodes. The sidewalls 159 are then formed by filling the isolation grooves with an insulating material, and the dummy gate electrode and the dummy source and drain electrodes are removed. After that, TiN is deposited on the entire surface, and CMP is performed, so as to form the source and drain electrodes 152a and 152b made of TiN on the W-added $HfO_2$ films 150a and 150b, and the gate electrode 158 made of TiN on the W-added $HfO_2$ film 155 (see FIG. 37(a)).

An anneal is then performed at 1050° C. in vacuum, and a FGA (forming gas anneal) is performed at 450° C. in a $H_2$ atmosphere. Through this heating process, the W-added $HfO_2$ films 150a and 150b have a level in the $HfO_2$ gap formed in the neighborhood of 3.9 eV in terms of work function. Also, the gate insulating film 154 made of HfSiON causes a reaction with the W-added $HfO_2$ film 155 at the interface, and the W-added $HfO_2$ film 155 turns into the W-added HfON film 156 (see FIG. 37(b)). Having nitrogen added thereto, the HfON film 156 has a work function increased to 4.1 eV. The work function of 3.9 eV can be used as the work function of the W-added $HfO_2$ films 150a and 150b that connect the source and drain regions 152a and 152b to the channel region 5. However, at the interfacial control oxide film 156 located between the gate insulating film 154 and the gate electrode 158, the work function needs to be optimized by a technique in accordance with an embodiment of the present invention. This interfacial control oxide film 156 may be formed by introducing N, C, B, Mg, Ca, Sr, Ba, Al, Sc, Y, La, Ce, Pr, Nd, Pm, Sm, Eu, Gd, Tb, Dy, Ho, Er, Tm, Yb, or Lu through ion implantation, or introduce nitrogen through plasma nitridation, before the gate electrode 158 is formed. It is of course possible to introduce nitrogen or the like into the $HfO_2$ films 150a and 150b between the source and drain electrodes 152a and 152b and the channel region 5, and shift the level closer to the conduction band edge of silicon. This is because it is considered that both can be optimized in this manner, without any notable adjustment being made on the interfaces between the gate insulating film and the gate electrodes.

Meanwhile, to reduce the leakage in a channel-off state, a small work function is effective in the n-MISFET. With the use of Nb-added $HfO_2$, the work function becomes 3.3 eV, and a very high barrier against holes can be formed.

The following are examples of combinations of materials of the interfacial control oxide film in this modification. The base material is an oxide film including at least one of Hf and Zr, i.g., $HfO_2$, $ZrO_2$, $(Hf,Zr)O_2$, Hf silicate, Zr silicate, or Hf and Zr silicate, and at least one material selected from W and Nb is added to the base material, so as to form a level in the gap. The level can be effectively used. Further, an oxide film that has a work function optimized by introducing at least one material selected from the group including N, C, B, Mg, Ca, Sr, Ba, Al, Sc, Y, La, Ce, Pr, Nd, Pm, Sm, Eu, Gd, Tb, Dy, Ho, Er, Tm, Yb, and Lu can be used as interfacial control oxide films.

Alternatively, the base material is an oxide film including at least one of Hf and Zr, i.g., $HfO_2$, $ZrO_2$, $(Hf,Zr)O_2$, Hf silicate, Zr silicate, or Hf and Zr silicate, and at least one material selected from the group including Mo, V, Cr, Mn, Tc, and Re is added to the base material, so as to form a level in the gap. An oxide film that has a work function optimized by introducing at least one material selected from the group including Ta, F, and H can be used as interfacial control oxide films. The introduction of each element may be performed not only by a co-sputtering technique. Some of the elements may be introduced from a film forming atmosphere, introduced through ion implantation, or introduced after film formation like plasma nitridation. In a case where Cr and Ta are introduced, for example, either Cr or Ta may be introduced first. A HfTaO film may be formed first, and a Cr film may be formed on the HfTaO film, so as to cause thermal diffusion. It is possible to use a co-sputtering technique that involves three targets of a Cr target, a Ta target, and a $HfO_2$ target in an $Ar/O_2$ atmosphere.

(Modification 3) Memory Cells

Referring now to FIGS. 38 to 41, four examples of memory cells in accordance with Modification 3 of Example 5 are described.

A memory cell that can store charges can be formed with a charge storing structure that includes a tunnel insulating film, a charge storing film, a block insulating film, and a control electrode in this order from the substrate side, instead of the gate insulating film of a MISFET. Such a memory cell can function as a memory by controlling the threshold value through charge storage, and determining whether or not the channel is on. Here, the work function between the semiconductor channel and the source and drain metal electrodes, so as to form ohmic connections. In this manner, the power consumption is reduced, and the memory operation is facilitated. In the structure of the gate insulating film, the charge storing film may be a floating gate (FG) electrode such as n-type polysilicon, or a trap insulating film such as a silicon nitride film, a Ru-added $SrTiO_3$ film, which can store charges. The charge storing film is interposed between a tunnel insulating film (the film for allowing charge tunneling) formed with $SiO_2$ or the like and a block insulating film with a large dielectric constant such as a $LaAlO_3$ film, a $HfO_2$ film, or a $Al_2O_3$ film (also called an interelectrode insulating film in a case where the charge storing film is of a FG type). The block insulating film is simply designed not to allow the charges stored in the charge storing film to move to the electrode side. A stacked film structure should be formed so that the respective films can play the respective roles. Particularly, it is essential to form a structure that does not easily cause diffusion between the films, with interdiffusion being taken into consideration. Basically, charges are introduced and released by virtue of the tunneling effect of the tunnel insulating film from the channel side. Particularly, wrong charge injection from the control electrode (made of W, for example) should be prevented. Therefore, in this modification, the interface of the block insulating film on the side of the control electrode is nitrided, and a $HfO_2$ film is inserted into the interface with the control electrode. A heating process is then carried out, so that the $HfO_2$ film formed in the interface turns into the HfON film having W added thereto. Thus, a film that has a large work function (approximately 5.7 eV in this modification) can be formed, and wrong charge injection from the control electrode can be prevented. W diffuses into the $HfO_2$ film between the p-type channel Si and the source and drain metal electrodes, and contacts of 3.9 eV in terms of work function are established.

Where the channel is in an off state, a large barrier of 1.27 eV (=5.17−3.9) is felt by holes. In the off state, it may be considered that a hole current does not flow at all. Where the channel is in an on state, no barriers are felt by electrons, and electrons flow freely. In other words, ohmic connections are established.

Such cells are suitable as NOR cells that perform control through contact with source and drain. In a NAND string having memory cells connected in series, only partial contacts are made with the source and drain. In this structure, however, there is not a p/n junction in each cell, and there are only the junctions among a metal, an oxide, and the channel. Accordingly, it is possible to form a high-performance NAND string in which a current flows freely without contact resistance in a channel-on state, and a current does not flow at all in a channel-off state. Since there is no unnecessary contact resistance, the number of memory cells connected in series in the NAND string can be made larger than that in conventional cases. As the number of memory cells connected in series in the NAND string is increased, large-scale collective erasing can be performed. Alternatively, NAND strings are stacked vertically, and the lower sides of the NAND strings are connected to one another, so as to stack the strings in a U-like shape. In this manner, a MOSFET for performing control can be formed only on one side. Such a structure can be realized only when the number of memory cells connected in series is large. In other words, a control region such as a MOSFET and a region for storage can be formed separately from each other, and wider application can be achieved. According to the conventional method, there is a large voltage drop, and it is considered that the largest possible number of cells to be connected in series is 64. By the technique of this modification, however, there are no such limits. For example, there is not a problem even if 1024 cells are connected in series. High-speed collective erasing can be performed, and the power consumption can be dramatically reduced.

Figure 38:
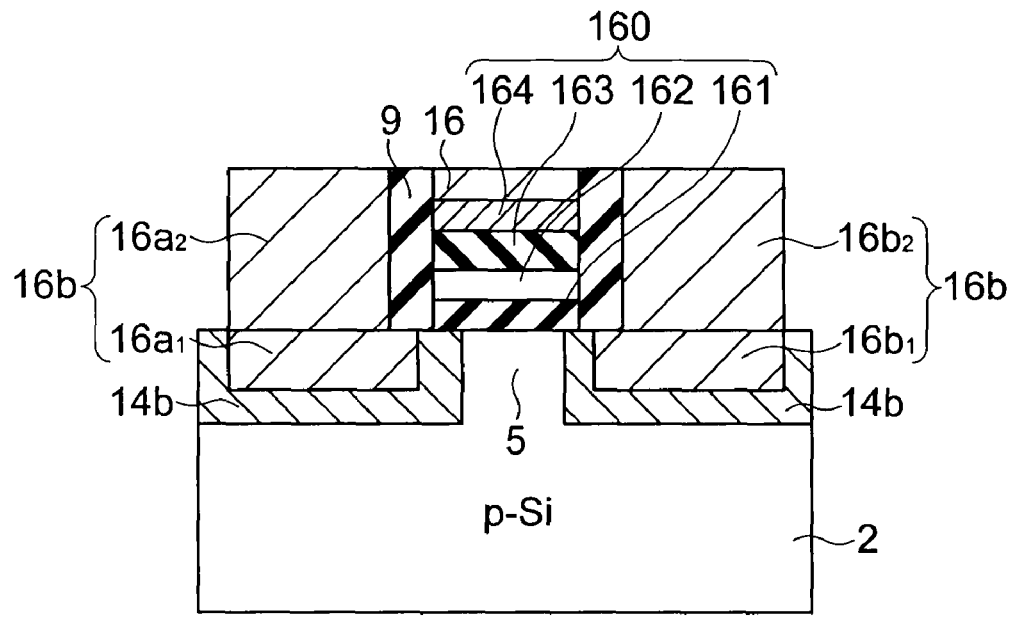
FIG. 38 is a cross-sectional diagram showing a first example of a memory cell according to Modification 3 of Example 5.

Referring first to FIG. 38, a memory cell of a first example of this modification is described. This memory cell of the first example is a memory cell of a NOR flash memory, and is the same as the n-MISFET shown in FIG. 10, except that the gate insulating film 13 is replaced with a stacked film 160 formed with a tunnel insulating film 161, a charge storing film 162, a block insulating film 163, and an interfacial control oxide film 164 stacked in this order. The interfacial control oxide film 164 provided between the control electrode 16 made of W and the block insulating film 163 is a HfON film having W added thereto. In the example shown in FIG. 38, W-added $HfO_2$ films 14a and 14b are provided between p-type Si channel 5 and source and drain $16a_1$ and $16b_1$ made of W. Accordingly, a high barrier against holes appears between the p-type Si channel 5 and the source and drain $16a_1$ and $16b_1$ in a channel-off state. Thus, holes do not flow in the direction in which the memory cells are connected in series. In a channel-on state, ohmic connections are established, and electrons flow freely.

Figure 39:
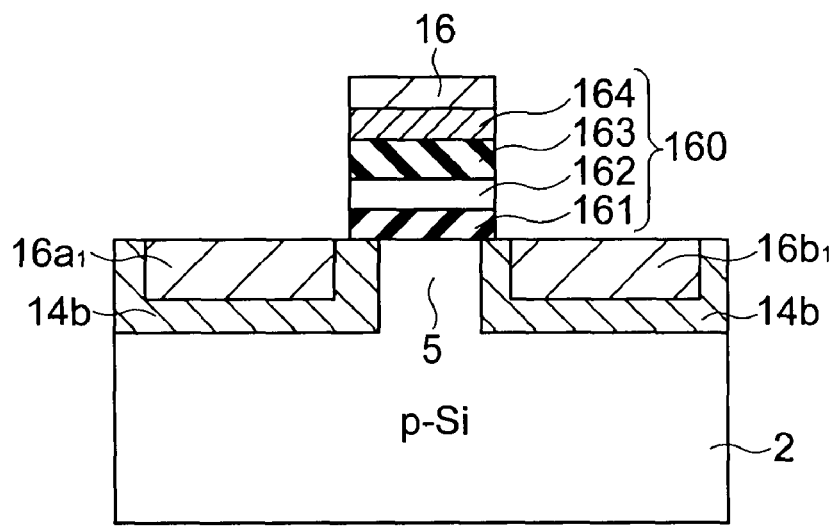
FIG. 39 is a cross-sectional diagram showing a second example of a memory cell according to Modification 3 of Example 5.

Referring now to FIG. 39, a memory cell of a second example of this modification is described. This memory cell of the second example is the same as the memory cell of the first example shown in FIG. 38, except that the source and drain $16a_1$ and $16b_1$ made of W and the sidewalls 9 are removed. The memory cell is used as a memory cell in a NAND string.

Figure 40:
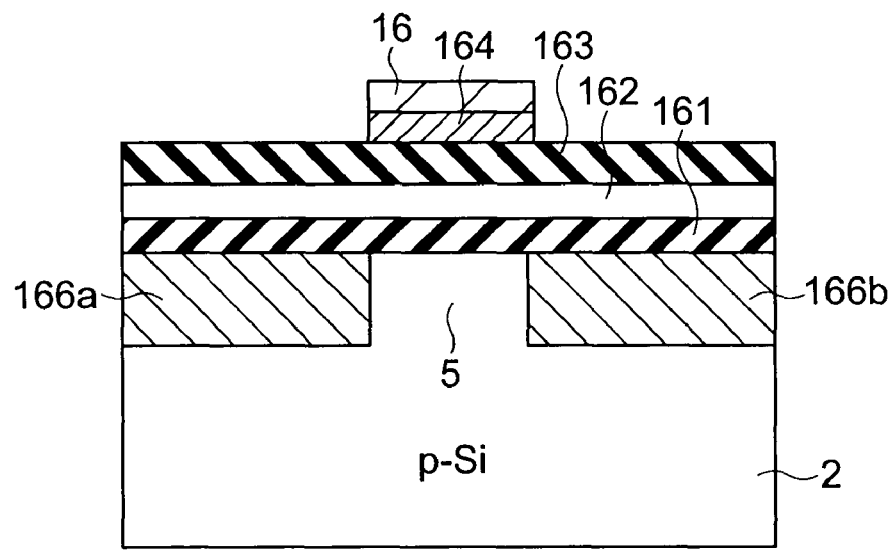
FIG. 40 is a cross-sectional diagram showing a third example of a memory cell according to Modification 3 of Example 5.
Figure 41:
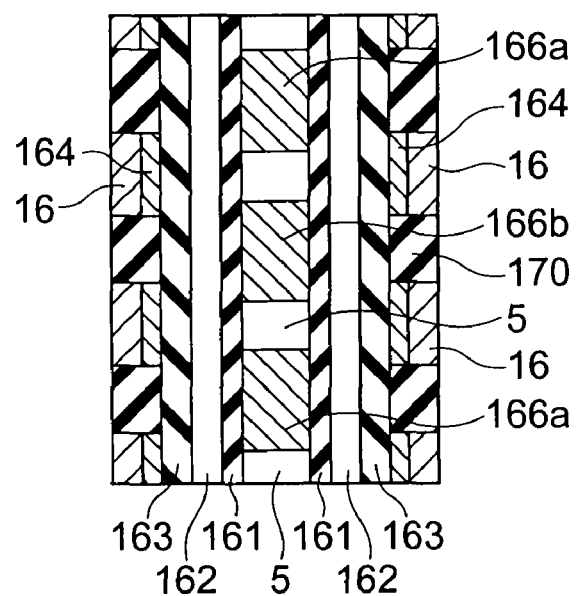
FIG. 41 is a cross-sectional diagram showing a fourth example of a memory cell according to Modification 3 of Example 5.

Referring now to FIG. 40, a memory cell of a third example of this modification is described. In this memory cell of the third example, the tunnel insulating film 161, the charge storing film 162, and the block insulating film 163 may be formed to extend on metal source and drain regions 166a and 166b, as shown in FIG. 40. In this third example, the interfacial control oxide film 164 provided between the control electrode 16 made of W and the block insulating film 163 is a Mo-added HfON film. In this case, the effective work function of the control electrode 16 can be pinned as the work function in the neighborhood of 5.6 eV. In FIG. 40, the metal source and drain regions 166a and 166b are formed with W-added $HfO_2$. The memory cells connected in series in a NAND series are arranged to share the adjacent source regions or drain regions. Accordingly, contacts are always established with the end portions of the NAND string, and a large current flows at the end portions. Therefore, it is essential that the contact resistance is low (being ohmic) so as to reduce power consumption. At the end portions, however, it is possible to use regular MISFET, and in such a case, the MISFET of Example 5 should be used. Regardless of whether the structure is of the NOR type or of the NAND type, memories of different structures can be formed, without attention being paid to the power consumption, as long as the contact with the source and drain regions is ohmic. In view of this, controlling contact resistance is very effective.

Although NAND strings are formed on a substrate, it is possible to stack NAND strings vertically. Such a structure is shown as a fourth example of this modification in FIG. 41. This memory cell of the fourth example has a structure in which the memory cells each shown in FIG. 40 are stacked vertically.

A p-type Si channel 5 and W-added $HfO_2$ films 166a and 166b to be source and drain are alternately stacked to form a stacked film. Patterning is performed on the stacked film, so as to form a pillar-like stacked film. The tunnel insulating films 161, the charge storing films 162, and the block insulating films 163 are formed in this order around the pillar-like stacked film. After that, the Mo-added HfON films (the interfacial control oxide films) 164 and the control electrodes 16 made of W are formed on the block insulating film 163. Each two adjacent control electrodes 16 are insulated from each other by an insulating film 170 made of $SiO_2$, for example. In the vertically-stacked structure, the NAND strings are connected vertically. When the channels are opened, the barrier against electrons (the barrier between the metal and the channels) becomes zero, and the power consumption becomes very small accordingly. Thus, the number of layers in the vertically-stacked structure can be dramatically increased. In reality, only eight to sixteen layers are stacked. However, such a restriction is lifted. With the use of the vertically-stacked structure without a limit on the number of stacked layers in this modification, a memory can be three-dimensionally constructed. Thus, the memory capacity can be dramatically increased.

(Modification 4) p-MISFET

Figure 42:
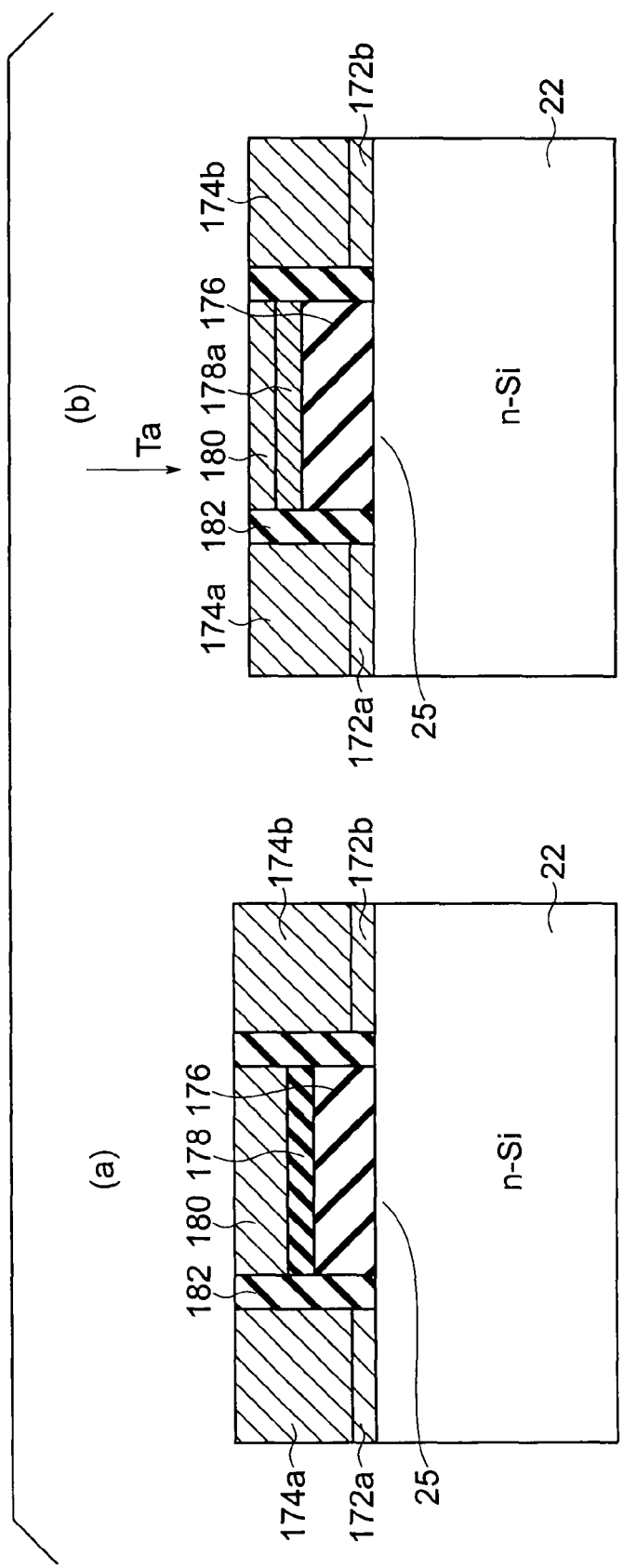
FIGS. 42(a) and 42(b) are cross-sectional diagrams showing the procedures for manufacturing a semiconductor device according to Modification 4 of Example 5.

Referring now to FIGS. 42(a) and 42(b), a semiconductor device in accordance with Modification 4 of Example 5 is described. The semiconductor device of this modification is a p-MISFET. FIGS. 42(a) and 42(b) show the procedures for manufacturing the p-MISFET.

First, as shown in FIG. 42(a), a gate insulating film 176 is formed on an n-type Si channel 25. After that, a $HfO_2$ film having V added thereto is formed on the entire surface. The V-added $HfO_2$ film is formed by performing sputtering simultaneously on two targets of a $HfO_2$ target and a V target. After that, a photoresist is applied onto the entire surface, and exposing and developing are performed, so as to form a dummy gate electrode (not shown) and dummy source and drain electrodes (not shown). At this point, patterning is also performed on the V-added $HfO_2$ film, so that the portions of the $HfO_2$ film existing below the dummy source and drain electrodes turns into V-added $HfO_2$ films 172a and 172b, and the portion of the $HfO_2$ film existing between the gate insulating film 176 and the dummy gate electrode turns into the V-added $HfO_2$ film 178 (see FIG. 42(a)). At this point, isolation grooves are formed between the dummy gate electrode and the dummy source and drain electrodes. Sidewalls 182 are then formed by filling the isolation grooves with an insulating material, and the dummy gate electrode and the dummy source and drain electrodes are removed. After that, TiN is deposited on the entire surface, and CMP is performed, so as to form source and drain electrodes 174a and 174b made of TiN on the V-added $HfO_2$ films 172a and 172b, and a gate electrode 180 made of TiN on the V-added $HfO_2$ film 178 (see FIG. 42(a)).

An anneal is then performed at 1050° C. in vacuum, and a FGA (forming gas anneal) is performed at 450° C. in a $H_2$ atmosphere. A window (not shown) is formed at the portion of the gate electrode 180, and Ta ion implantation is performed (see FIG. 42(b)). Since the TiN film 180 of this gate electrode is thin, the Ta reaches the interface with the V-added $HfO_2$ film 178, and the V-added $HfO_2$ film 178 turns into a $HfO_2$ film 178a having V and Ta added thereto. The V-added $HfO_2$ films 172a and 172b have a level in the $HfO_2$ gap formed in the neighborhood of 6.2 eV in terms of work function. The V— and Ta-added $HfO_2$ film (the interfacial control oxide film) 178 at the interface between the gate insulating film 176 made of HfSiON and the gate electrode 180 made of TiN has a work function reduced to 5.2 eV. The work function of 6.2 eV can be used as the work function at the connecting portions with the source and drain electrodes. However, at the connecting portion between the gate insulating film 176 and the gate electrode 180, the work function needs to be optimized by a technique in accordance with an embodiment of the present invention.

In this modification, Ta ion implantation is performed to form the interfacial control oxide film 178a. However, the interfacial control oxide film 178a may be formed by performing F or H ion implantation or introducing H through plasma hydrogenation or the like. It is of course possible to introduce Ta or the like into the interfacial control oxide films 172a and 172b at the connecting portions between the source and drain electrodes and the channel, and shift the level closer to the conduction band edge of silicon. This is because it is considered that both can be optimized in this manner, without any notable adjustment being made on the interfaces between the gate insulating film and the gate electrodes.

Meanwhile, to reduce the leakage in a channel-off state, a large work function is effective in the p-MISFET. With the use of V-added $HfO_2$, the work function becomes 6.2 eV, and a very high barrier against electrons can be formed. Thus, little off leakage is caused.

The following are examples of combinations of materials in Modification 4. The base material is an oxide film including at least one of Hf and Zr, i.g., $HfO_2$, $ZrO_2$, $(Hf,Zr)O_2$, Hf silicate, Zr silicate, or Hf and Zr silicate, and Nb, W, or Mo addition (Type-A, Type-B) is performed so as to form a level in the gap. An oxide film that has a work function optimized by introducing at least one material selected from the group including N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is also effective.

Alternatively, the base material is an oxide film including at least one of Hf and Zr, i.g., $HfO_2$, $ZrO_2$, $(Hf,Zr)O_2$, Hf silicate, Zr silicate, or Hf and Zr silicate, and at least one material selected from the group including V, Cr, Mn, Tc, and Re is added to the base material, so as to form a level in the gap. The resultant oxide film can also be used as interfacial control oxide films. This is also effective in a case where there is not a second added material such as F. Further, an oxide film that has a work function optimized by introducing at least one material selected from the group including Ta, F, and H can be used as interfacial control oxide films. This is also effective in a case where there is a second added material such as F. When there is a second added material, the work function tends to be smaller. Therefore, the more effective one should be selected, based on the relationship with the interfacial control oxide film between the gate insulating film and the gate metal. The introduction of each element may be performed not only by a co-sputtering technique. Some of the elements may be introduced from a film forming atmosphere, introduced through ion implantation, or introduced after film formation like excited hydrogen. In a case where V and Ta are introduced, for example, either V or Ta may be introduced first. A HfTaO film may be formed first, and a V film may be formed on the HfTaO film, so as to cause thermal diffusion. It is possible to use a co-sputtering technique that involves three targets of a V target, a Ta target, and a $HfO_2$ target in an $Ar/O_2$ atmosphere.

In accordance with Examples 1 to 5 and the modifications described above, an oxide film having a work function adjusted is inserted into the interface between a semiconductor and a metal, so that a structure with low contact resistance and a structure with high contact resistance can be arbitrarily formed. In a structure in which a current should flow, the oxide film at the interface is adjusted, so as to minimize the resistance or to form ohmic contact. In this manner, unnecessary power consumption can be prevented. In principle, unnecessary power consumption can be zero. In a structure in which a current should not flow, on the other hand, the oxide film at the interface is adjusted, so as to form contact with highest possible resistance. In this manner, a current cannot flow, and unnecessary leakage current during stand-by operations can be restricted. Thus, portable devices can be used for a longer period of time, and other advantages can be achieved.

As described so far, in accordance with an embodiment of the present invention, the following effects can be achieved.

(1) At the interface between a semiconductor and a metal, the effective work function of the joined metal can be controlled freely.

(2) At the junction between a semiconductor (including an insulating material and a dielectric material) and a metal, the barrier can be made lower. As a result, ohmic connections can be realized, and the power consumption can be dramatically reduced.

(3) On the other hand, at the junction between a semiconductor (including an insulating material and a dielectric material) and a metal, the barrier can be made higher. As a result, a semiconductor element having little junction leakage can be realized. For example, at the junction between a channel and metal source and drain, the leakage when the MISFET is off depends on the size of the barrier. By increasing the size of the barrier, off leakage can be restricted. Alternatively, in a MIM capacitor, the barrier at the junction between a semiconductor and a metal is made higher, so as to dramatically reduce the leakage current.

Although a MIS structure has been described in the above embodiment of the present invention, the present invention is not limited to a MIS structure. It is possible to form a CMIS structure by combining an n-MIS structure and a p-MIS structure.

Also, a MIS structure formed on a silicon substrate has been described in the embodiment of the present invention. However, the present invention is not limited to such a structure. A silicon layer may be formed on a substrate other than a silicon substrate, such as a glass substrate, and a MIS structure of the embodiment may be formed.

Memory cells are now briefly summarized.

As a NOR memory, each of the cells described in this specification can be used. The gate insulating film is a simple stacked film formed with a tunnel insulating film, a charge storing film, and a block insulating film (or an interelectrode insulating film). The charge storing film is formed with a metallic film such as a phosphorus-doped polysilicon film, so as to form a floating-gate memory cell. Also, an insulating film that locally stores charges, such as a silicon nitride film, can be used as the charge storing film, so as to form a MONOS memory cell. In such a memory, it is possible to use semiconductor source and drain, metal source and drain, or buried metal source and drain, as in the embodiment.

In a case of a NAND memory, the technique used in the MISFET having metal source and drain in the embodiment of the present invention is effective. The metal source and drain may not be buried in the substrate, or may be buried in the substrate. In a case where the metal source and drain are not buried in the substrate, each two adjacent cells share the metal source or drain. In such a structure, an oxide film of the embodiment is formed on a semiconductor substrate that is not concaved, and the metal source and drain are formed on the oxide film. The resultant is a very simple structure. With buried metal source and drain, each two adjacent cells also share the metal source or drain. In such a structure, an oxide film of the embodiment is inserted between the channel and the buried metal source and drain. The gate insulating film in this case is the same as in the above described NOR structure.

As an embodiment of the present invention, an example case where the gate insulating film of a MIS structure is formed with a tunnel insulating film, a charge storing film, and a block insulating film (or an interelectrode insulating film) is also described. If the charge storing film is made of polysilicon, the structure is of a FG type. If the charge storing film is a trap insulating film, the structure is of a MONOS type. Those structures have been described as memory cells, but are not limited to memory cells. While some MIS structures have memory functions, different threshold values are set for the respective MIS structures, so as to form a circuit that depends on the threshold values. In such a circuit for selecting a path, when a first threshold value is selected, a first path is open, and a second path is closed. When a second threshold value is selected, the first and second paths are open. Such a circuit can be rewritten later by a MIS structure having a memory function.

The technique in accordance with an embodiment of the present invention may be applied to any semiconductor substrates formed with compound semiconductors, such as a Ge substrate and a GaAs substrate. In such cases, only the optimum work function varies, and there are no variations in the structures. For example, in a case of a Ge substrate, 4.0 eV or smaller is appropriate for a connection between a metal and n-type Ge source and drain, and 4.6 eV or larger is appropriate for a connection between a metal and p-type Ge source and drain. An interfacial state should be formed at an optimum position on each substrate by the technique in accordance with the embodiment of the present invention. At the connection between a metal and p-type Ge source and drain, 4.6 eV is achieved if the metal is joined, without any adjustment being made. Therefore, it is an option to use the structure as it is. In other words, the technique in accordance with the embodiment is applied only to the connection between a metal and n-type Ge source and drain. Furthermore, it is possible to grow Ge, SiGe, or the like on a part of a Si substrate, and form a MISFET at the part. In such a case, the technique in accordance with the embodiment can be used, based on the work function of each of the materials.

To adjust the work function between semiconductor source and drain, and source and drain metal electrodes, a first oxide film in accordance with an embodiment of the present invention is inserted, and a second oxide film equivalent to the first oxide film is inserted between the gate insulating film and the gate electrode made of a metal. In this manner, it is possible to simultaneously optimize the work function between the gate insulating film and the gate electrode made of a metal, and the work function between the semiconductor source and drain, and the source and drain metal electrodes. With the first oxide film, the optimum value exists outside the gap of the semiconductor (the Si substrate or the like). With the second oxide film, the optimum value exists inside the gap of the semiconductor (the same Si substrate or the like). It is preferable to make further adjustments, so as to obtain optimum values. For example, further introduction of an additional material only into the second oxide film side is effective. If the dopant of the channel can be adjusted, this technique can be applied to the outside of the gap of the semiconductor. In a case where a depleted SOI substrate or the like is used, the optimum value exists at the location of a work function very close to the inside of the semiconductor gap. Therefore, a different adjustment from that used in the case of the first oxide film is required.

As described so far, an embodiment of the present invention can provide a semiconductor device, a capacitor, and a field effect transistor. In the semiconductor device, the effective work function of a metal to be connected is optimized at the interface between the metal and a semiconductor or a dielectric material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
a semiconductor film;
an oxide film formed on the semiconductor film, the oxide film including at least one of Hf and Zr, and at least one element selected from the group consisting of V, Cr, Mn, Nb, Mo, Tc, W, and Re being added to the oxide film; and
a metal film formed on the oxide film.

2. The device according to claim 1, wherein at least one element selected from the group consisting of F, H, Ta, N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is added to the oxide film.

3. A field effect transistor comprising:
a semiconductor substrate;
source and drain regions made of a semiconductor, formed at a distance from each other in the semiconductor substrate, and having a different conductivity type from the semiconductor substrate;
a gate insulating film formed on a portion of the semiconductor substrate, the portion being located between the source region and the drain region, the portion being a channel region;
a gate electrode formed on the gate insulating film;
oxide films formed on the source and drain regions, the oxide films including at least one of Hf and Zr, and at least one first element selected from the group consisting of V, Cr, Mn, Nb, Mo, Tc, W, and Re being added to the oxide films; and
source and drain electrodes made of a metal, and formed on the oxide films.

4. The transistor according to claim 3, wherein the first element to be added to the oxide films has area density in the range of $6 \times 10^{12}$ atoms/cm$^2$ to $8 \times 10^{14}$ atoms/cm$^2$.

5. The transistor according to claim 3, wherein at least one second element selected from the group consisting of F, H, Ta, N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is added to the oxide films.

6. The transistor according to claim 3, wherein:
the first element to be added to the oxide films is Nb or W; and
the channel region is made of a p-type semiconductor.

7. The transistor according to claim 6, wherein at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is further added to the oxide films.

8. The transistor according to claim 3, wherein:
the first element to be added to the oxide films is an element selected from the group consisting of V, Cr, Mn, Tc, Re, and Mo;
at least one element selected from the group consisting of F, H, and Ta is further added to the oxide films; and
the channel region is made of a p-type semiconductor.

9. The transistor according to claim 3, wherein:
the first element to be added to the oxide films is an element selected from the group consisting of Nb, W, and Mo;
at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is further added to the oxide films; and
the channel region is made of an n-type semiconductor.

10. The transistor according to claim 3, wherein:
the first element to be added to the oxide films is an element selected from the group consisting of V, Cr, Mn, Tc, and Re; and
the channel region is made of an n-type semiconductor.

11. The transistor according to claim 10, wherein at least one element selected from the group consisting of F, H, and Ta is further added to the oxide films.

12. A semiconductor device comprising:
a semiconductor substrate;
source and drain regions made of a semiconductor, formed at a distance from each other in the semiconductor substrate, and having a different conductivity type from the semiconductor substrate;
a first insulating film formed on a portion of the semiconductor substrate, the portion being located between the source region and the drain region, the portion being a channel region;
a charge storage film formed on the first insulating film;
a second insulating film formed on the charge storage film;
a control electrode formed on the second insulating film;
oxide films formed on the source and drain regions, the oxide films including at least one of Hf and Zr, and at least one first element selected from the group consisting of V, Cr, Mn, Nb, Mo, Tc, W, and Re being added to the oxide films; and
source and drain electrodes made of a metal, and formed on the oxide films.

* * * * *